US012572047B2

(12) United States Patent
Rozbicki et al.

(10) Patent No.: US 12,572,047 B2
(45) **Date of Patent: \*Mar. 10, 2026**

(54) FABRICATION OF ELECTROCHROMIC DEVICES

(71) Applicant: View, Inc., Milpitas, CA (US)

(72) Inventors: Robert Tad Rozbicki, Saratoga, CA (US); Sridhar Karthik Kailasam, Fremont, CA (US); Robin Sean Friedman, Redwood City, CA (US); Dane Thomas Gillaspie, Fremont, CA (US); Anshu Ajit Pradhan, Collierville, TN (US); Disha Mehtani, Los Altos, CA (US)

(73) Assignee: View Operating Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,815

(22) Filed: Apr. 20, 2023

(65) Prior Publication Data

US 2023/0314892 A1 Oct. 5, 2023

Related U.S. Application Data

(60) Continuation of application No. 16/947,757, filed on Aug. 14, 2020, now Pat. No. 11,668,990, which is a
(Continued)

(51) Int. Cl.
*G02F 1/15* (2019.01)
*C23C 14/02* (2006.01)
(Continued)

(52) U.S. Cl.
CPC .............. *G02F 1/15* (2013.01); *C23C 14/028* (2013.01); *C23C 14/06* (2013.01);
(Continued)

(58) Field of Classification Search
CPC ... C23C 14/028; C23C 14/06; C23C 14/0635; C23C 14/0641; C23C 14/0652;
(Continued)

(56) References Cited

U.S. PATENT DOCUMENTS 3,897,996 A * 8/1975 Tsunoda .............. G04G 9/0035
359/254
4,293,194 A 10/1981 Takahashi
(Continued)

FOREIGN PATENT DOCUMENTS

CN 1350326 A 5/2002
CN 1482509 A 3/2004
(Continued)

OTHER PUBLICATIONS

Abdullah, et al., The properties of ITO/arc-ZnO passivating layer for TCO conducting substrate deposited by RF magnetron sputtering, Advanced Materials Research, vol. 832, 2014, pp. 579-584.
(Continued)

*Primary Examiner* — Mahidere S Sahle
(74) *Attorney, Agent, or Firm* — Cha & Reiter, LLC

(57) ABSTRACT

Electrochromic devices and methods may employ the addition of a defect-mitigating insulating layer which prevents electronically conducting layers and/or electrochromically active layers from contacting layers of the opposite polarity and creating a short circuit in regions where defects form. In some embodiments, an encapsulating layer is provided to encapsulate particles and prevent them from ejecting from the device stack and risking a short circuit when subsequent layers are deposited. The insulating layer may have an electronic resistivity of between about 1 and $10^8$ Ohm-cm. In some embodiments, the insulating layer contains one or more of the following metal oxides: aluminum oxide, zinc oxide, tin oxide, silicon aluminum oxide, cerium oxide,
(Continued)

tungsten oxide, nickel tungsten oxide, and oxidized indium tin oxide. Carbides, nitrides, oxynitrides, and oxycarbides may also be used.

10 Claims, 24 Drawing Sheets

Related U.S. Application Data division of application No. 16/509,189, filed on Jul. 11, 2019, now Pat. No. 10,788,723, which is a continuation of application No. 15/799,694, filed on Oct. 31, 2017, now abandoned, which is a continuation of application No. 14/885,734, filed on Oct. 16, 2015, now Pat. No. 10,162,240, which is a continuation of application No. 14/601,141, filed on Jan. 20, 2015, now Pat. No. 9,229,291, which is a continuation of application No. 13/763,505, filed on Feb. 8, 2013, now Pat. No. 9,007,674.

(51) Int. Cl.

| | |
|---|---|
| C23C 14/06 | (2006.01) |
| C23C 14/08 | (2006.01) |
| C23C 14/34 | (2006.01) |
| G02F 1/13 | (2006.01) |
| G02F 1/1333 | (2006.01) |
| G02F 1/1523 | (2019.01) |
| G02F 1/1524 | (2019.01) |
| G02F 1/153 | (2006.01) |
| G02F 1/155 | (2006.01) |
| H01B 5/14 | (2006.01) |
| H01B 13/00 | (2006.01) |
| H01J 37/34 | (2006.01) |

(52) U.S. Cl.
CPC ...... *C23C 14/0635* (2013.01); *C23C 14/0641* (2013.01); *C23C 14/0652* (2013.01); *C23C 14/0676* (2013.01); *C23C 14/08* (2013.01); *C23C 14/081* (2013.01); *C23C 14/083* (2013.01); *C23C 14/086* (2013.01); *C23C 14/34* (2013.01); *G02F 1/1309* (2013.01); *G02F 1/133345* (2013.01); *G02F 1/1523* (2013.01); *G02F 1/1524* (2019.01); *G02F 1/1533* (2013.01); *G02F 1/155* (2013.01); *H01B 5/14* (2013.01); *H01B 13/00* (2013.01); *H01J 37/3429* (2013.01); *H01J 37/3476* (2013.01); *G02F 2001/1536* (2013.01); *G02F 2001/1555* (2013.01); *G02F 2201/508* (2013.01)

(58) Field of Classification Search
CPC ... C23C 14/0676; C23C 14/08; C23C 14/081; C23C 14/083; C23C 14/086; C23C 14/34; G02F 1/15; G02F 1/1309; G02F 1/133345; G02F 1/1523; G02F 1/1524; G02F 1/1533; G02F 1/155; G02F 2001/1536; G02F 2001/1555; G02F 2201/508; H01B 5/14; H01B 13/00; H01J 37/3429; H01J 37/3476
USPC ................................................ 359/265–275
See application file for complete search history.

(56) References Cited

U.S. PATENT DOCUMENTS

| | | | |
|---|---|---|---|
| 4,308,316 A | 12/1981 | Gordon | |
| 4,419,386 A | 12/1983 | Gordon | |
| 4,752,119 A | 6/1988 | Ueno et al. | |
| 4,854,675 A | 8/1989 | Yamazaki et al. | |
| 4,950,888 A | 8/1990 | Hamada | |
| 5,124,833 A | 6/1992 | Barton et al. | |
| 5,133,594 A | 7/1992 | Haas et al. | |
| 5,147,694 A | 9/1992 | Clarke | |
| 5,352,504 A | 10/1994 | Boulanger et al. | |
| 5,699,192 A | 12/1997 | Van Dine et al. | |
| 5,724,175 A | 3/1998 | Hichwa et al. | |
| 5,724,177 A | 3/1998 | Ellis, Jr. et al. | |
| 5,724,187 A | 3/1998 | Varaprasad et al. | |
| 5,830,336 A | 11/1998 | Schulz | |
| 5,877,936 A | 3/1999 | Nishitani et al. | |
| 5,959,762 A | 9/1999 | Bandettini et al. | |
| 5,995,271 A | 11/1999 | Zieba et al. | |
| 6,055,089 A | 4/2000 | Schulz et al. | |
| 6,094,292 A | 7/2000 | Goldner et al. | |
| 6,176,715 B1 | 1/2001 | Buescher | |
| 6,284,412 B1 | 9/2001 | Minakata et al. | |
| 6,407,847 B1 | 6/2002 | Poll et al. | |
| 6,515,787 B1 | 2/2003 | Westfall et al. | |
| 6,743,524 B2 * | 6/2004 | Schaepkens | H01L 23/564 |
| | | | 428/473.5 |
| 6,770,176 B2 | 8/2004 | Benson et al. | |
| 6,822,778 B2 | 11/2004 | Westfall et al. | |
| 6,870,656 B2 | 3/2005 | Tonar et al. | |
| 7,265,890 B1 | 9/2007 | Demiryont | |
| 7,593,154 B2 | 9/2009 | Burdis et al. | |
| 7,710,671 B1 | 5/2010 | Kwak et al. | |
| 7,869,114 B2 | 1/2011 | Valentin et al. | |
| 8,004,744 B2 * | 8/2011 | Burdis | G02F 1/1525 |
| | | | 359/296 |
| 8,035,882 B2 | 10/2011 | Fanton et al. | |
| 8,071,420 B2 | 12/2011 | Su et al. | |
| 8,085,460 B2 | 12/2011 | Finley et al. | |
| 8,164,818 B2 | 4/2012 | Collins et al. | |
| 8,164,848 B2 | 4/2012 | Chan et al. | |
| 8,259,380 B2 | 9/2012 | Valentin et al. | |
| 8,780,432 B1 | 7/2014 | Nguyen | |
| 9,007,674 B2 | 4/2015 | Kailasam et al. | |
| 9,019,588 B2 | 4/2015 | Brown et al. | |
| 9,102,124 B2 | 8/2015 | Collins et al. | |
| 9,229,291 B2 | 1/2016 | Kailasam et al. | |
| 9,356,316 B2 | 5/2016 | Sun et al. | |
| 9,408,303 B2 | 8/2016 | Hassan et al. | |
| 9,454,053 B2 | 9/2016 | Strong et al. | |
| 9,482,921 B2 | 11/2016 | Lamine et al. | |
| 9,581,875 B2 | 2/2017 | Burdis et al. | |
| 9,703,167 B2 | 7/2017 | Parker et al. | |
| 9,921,421 B2 | 3/2018 | Branda et al. | |
| 9,939,704 B2 | 4/2018 | Patterson et al. | |
| 9,952,481 B2 | 4/2018 | Rozbicki et al. | |
| 9,958,750 B2 | 5/2018 | Parker et al. | |
| 9,995,985 B2 | 6/2018 | Parker et al. | |
| 10,114,265 B2 | 10/2018 | Strong et al. | |
| 10,288,969 B2 | 5/2019 | Kailasam et al. | |
| 10,295,880 B2 | 5/2019 | Dixit et al. | |
| 10,303,032 B2 | 5/2019 | Brossard et al. | |
| 10,409,130 B2 | 9/2019 | Parker et al. | |
| 10,551,711 B2 | 2/2020 | Kozlowski et al. | |
| 10,781,583 B2 | 9/2020 | Silva | |
| 10,782,583 B2 | 9/2020 | Bhatnagar et al. | |
| 10,788,723 B2 | 9/2020 | Rozbicki et al. | |
| 10,795,232 B2 | 10/2020 | Strong et al. | |
| 10,802,371 B2 | 10/2020 | Dixit et al. | |
| 10,969,645 B2 | 4/2021 | Rozbicki et al. | |
| 11,054,711 B2 | 7/2021 | Shrivastava et al. | |
| 11,065,845 B2 | 7/2021 | Parker et al. | |
| 11,086,182 B2 | 8/2021 | Dixit et al. | |
| 11,426,979 B2 | 8/2022 | Strong et al. | |
| 11,559,852 B2 | 1/2023 | Dixit et al. | |
| 11,559,970 B2 | 1/2023 | Strong et al. | |
| 11,561,446 B2 | 1/2023 | Kailasam et al. | |
| 11,599,003 B2 | 3/2023 | Kailasam | |
| 11,668,990 B2 | 6/2023 | Rozbicki et al. | |
| 11,865,632 B2 | 1/2024 | Dixit et al. | |
| 2002/0004261 A1 | 1/2002 | Asami et al. | |
| 2002/0075552 A1 | 6/2002 | Poll et al. | |
| 2002/0149829 A1 | 10/2002 | Mochizuka et al. | |

(56) References Cited

U.S. PATENT DOCUMENTS

| | | |
|---|---|---|
| 2003/0117066 A1 | 6/2003 | Silvernail |
| 2003/0137712 A1 | 7/2003 | Westfall et al. |
| 2003/0179432 A1 | 9/2003 | Vincent et al. |
| 2003/0227663 A1 | 12/2003 | Agrawal et al. |
| 2004/0042059 A1 | 3/2004 | Minami et al. |
| 2004/0121571 A1 | 6/2004 | Uchikoshi et al. |
| 2004/0123804 A1 | 7/2004 | Yamazaki et al. |
| 2004/0202001 A1 | 10/2004 | Roberts et al. |
| 2004/0233537 A1 | 11/2004 | Agrawal et al. |
| 2004/0234678 A1 | 11/2004 | Hirai et al. |
| 2005/0003737 A1 | 1/2005 | Montierth et al. |
| 2005/0082639 A1 | 4/2005 | Kikuta et al. |
| 2005/0195488 A1 | 9/2005 | McCabe et al. |
| 2006/0018000 A1 | 1/2006 | Greer |
| 2006/0033978 A1 | 2/2006 | Morin et al. |
| 2006/0098289 A1 | 5/2006 | McCabe et al. |
| 2006/0132885 A1 | 6/2006 | Pichot et al. |
| 2006/0209383 A1 | 9/2006 | Burdis et al. |
| 2006/0278333 A1 | 12/2006 | Lee et al. |
| 2007/0002422 A1 | 1/2007 | O'Shaughnessy |
| 2007/0097481 A1 | 5/2007 | Burdis et al. |
| 2007/0109219 A1 | 5/2007 | Whitesides et al. |
| 2007/0138949 A1 | 6/2007 | Yoshida et al. |
| 2007/0292606 A1 | 12/2007 | Demiryont |
| 2008/0018979 A1 | 1/2008 | Mahe et al. |
| 2008/0026166 A1 | 1/2008 | Pilloy |
| 2008/0030836 A1 | 2/2008 | Tonar et al. |
| 2008/0037128 A1 | 2/2008 | Knapp |
| 2008/0099065 A1 | 5/2008 | Ito et al. |
| 2008/0143906 A1 | 6/2008 | Allemand et al. |
| 2008/0190759 A1 | 8/2008 | Valentin et al. |
| 2008/0212189 A1 | 9/2008 | Baur et al. |
| 2008/0266642 A1 | 10/2008 | Burrell et al. |
| 2008/0304131 A1 | 12/2008 | Nguyen |
| 2009/0067031 A1 | 3/2009 | Piroux et al. |
| 2009/0148764 A1 | 6/2009 | Kwak et al. |
| 2009/0202743 A1 | 8/2009 | Schaepkens et al. |
| 2009/0272483 A1 | 11/2009 | Howes |
| 2009/0284821 A1 | 11/2009 | Valentin et al. |
| 2009/0296190 A1 | 12/2009 | Anderson et al. |
| 2009/0303565 A1 | 12/2009 | Karmhag et al. |
| 2009/0304912 A1 | 12/2009 | Kwak et al. |
| 2009/0304970 A1 | 12/2009 | Imaizumi et al. |
| 2009/0316248 A1 | 12/2009 | Karmhag et al. |
| 2009/0323161 A1 | 12/2009 | Fuss et al. |
| 2009/0323162 A1 | 12/2009 | Fanton et al. |
| 2010/0053722 A1 | 3/2010 | Finley et al. |
| 2010/0060971 A1 | 3/2010 | Schwendeman et al. |
| 2010/0067090 A1 | 3/2010 | Egerton et al. |
| 2010/0079844 A1 | 4/2010 | Kurman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2010/0245991 A1 | 9/2010 | Ishihara et al. |
| 2010/0321758 A1 | 12/2010 | Bugno et al. |
| 2011/0080629 A1 | 4/2011 | Neuman et al. |
| 2011/0080630 A1 | 4/2011 | Valentin et al. |
| 2011/0096388 A1 | 4/2011 | Agrawal et al. |
| 2011/0128137 A1 | 6/2011 | Varaprasad et al. |
| 2011/0148218 A1 | 6/2011 | Rozbicki |
| 2011/0151383 A1 | 6/2011 | Yamashiro et al. |
| 2011/0181939 A1 | 7/2011 | Bressand et al. |
| 2011/0199666 A1 | 8/2011 | Chun et al. |
| 2011/0211247 A1 | 9/2011 | Kozlowski et al. |
| 2011/0249314 A1 | 10/2011 | Wang et al. |
| 2011/0261429 A1 | 10/2011 | Sbar et al. |
| 2011/0266137 A1 | 11/2011 | Wang et al. |
| 2011/0266138 A1 | 11/2011 | Wang et al. |
| 2011/0267673 A1 | 11/2011 | Agrawal et al. |
| 2011/0267674 A1 | 11/2011 | Wang et al. |
| 2011/0267675 A1 | 11/2011 | Wang et al. |
| 2012/0019889 A1 | 1/2012 | Lamine et al. |
| 2012/0026573 A1 | 2/2012 | Collins et al. |
| 2012/0033287 A1 | 2/2012 | Friedman et al. |
| 2012/0038967 A1 | 2/2012 | Copeland et al. |
| 2012/0147449 A1 | 6/2012 | Bhatnagar et al. |
| 2012/0217346 A1 | 8/2012 | Eberle et al. |
| 2012/0218620 A1 | 8/2012 | Kwak et al. |
| 2012/0218621 A1 | 8/2012 | Kwak et al. |
| 2012/0266945 A1 | 10/2012 | Letocart et al. |
| 2012/0275008 A1 | 11/2012 | Pradhan et al. |
| 2012/0281268 A1 | 11/2012 | McCabe et al. |
| 2012/0327499 A1 | 12/2012 | Parker et al. |
| 2013/0003157 A1 | 1/2013 | Wang et al. |
| 2013/0033736 A1 | 2/2013 | McCabe et al. |
| 2013/0092679 A1 | 4/2013 | Rozbicki et al. |
| 2013/0107563 A1 | 5/2013 | McCabe et al. |
| 2013/0128342 A1 | 5/2013 | Mitarai et al. |
| 2013/0222877 A1 | 8/2013 | Greer et al. |
| 2013/0278988 A1 | 10/2013 | Jack et al. |
| 2013/0335800 A1 | 12/2013 | Konkin et al. |
| 2013/0337603 A1 | 12/2013 | Steinhauser et al. |
| 2014/0022621 A1 | 1/2014 | Kailasam et al. |
| 2014/0253996 A1 | 9/2014 | Burdis et al. |
| 2014/0340731 A1 | 11/2014 | Strong et al. |
| 2015/0062688 A1 | 3/2015 | Friedman et al. |
| 2015/0092260 A1 | 4/2015 | Parker et al. |
| 2015/0131140 A1 | 5/2015 | Kailasam et al. |
| 2015/0153622 A1 | 6/2015 | Kalweit et al. |
| 2015/0253642 A1 | 9/2015 | Kalweit et al. |
| 2015/0362816 A1 | 12/2015 | Strong et al. |
| 2016/0077257 A1 | 3/2016 | Tatemura et al. |
| 2016/0097960 A1 | 4/2016 | Dixit et al. |
| 2016/0103379 A1 | 4/2016 | Kozlowski et al. |
| 2016/0114523 A1 | 4/2016 | Luten et al. |
| 2016/0138328 A1 | 5/2016 | Behmke et al. |
| 2016/0141258 A1 | 5/2016 | Jain et al. |
| 2016/0199936 A1 | 7/2016 | Luten et al. |
| 2016/0209723 A1 | 7/2016 | Rozbicki |
| 2016/0334688 A1 | 11/2016 | Tran et al. |
| 2017/0066679 A1 | 3/2017 | Yeh |
| 2017/0102601 A1 | 4/2017 | Luten et al. |
| 2017/0115544 A1 | 4/2017 | Parker et al. |
| 2017/0176831 A1 | 6/2017 | Dixit et al. |
| 2017/0184938 A1 | 6/2017 | Bergh et al. |
| 2017/0219903 A1 | 8/2017 | Strong et al. |
| 2017/0219906 A1 | 8/2017 | Garcia et al. |
| 2017/0279155 A1 | 9/2017 | Sun et al. |
| 2018/0095337 A1 | 4/2018 | Rozbicki et al. |
| 2018/0173071 A1 | 6/2018 | Mathew et al. |
| 2018/0210307 A1 | 7/2018 | Parker et al. |
| 2018/0259822 A1 | 9/2018 | Dixit et al. |
| 2019/0079365 A1 | 3/2019 | Sarrach et al. |
| 2019/0086756 A1 | 3/2019 | Dixit et al. |
| 2019/0107764 A1 | 4/2019 | Kailasam et al. |
| 2019/0155120 A1 | 5/2019 | Li et al. |
| 2019/0219881 A1 | 7/2019 | Shrivastava et al. |
| 2019/0324341 A1 | 10/2019 | Tonar et al. |
| 2019/0331977 A1 | 10/2019 | Rozbicki et al. |
| 2019/0346732 A1 | 11/2019 | Parker et al. |
| 2020/0201132 A1 | 6/2020 | Kailasam et al. |
| 2020/0233278 A1 | 7/2020 | Kailasam |
| 2020/0379310 A1 | 12/2020 | Rozbicki et al. |
| 2020/0384738 A1 | 12/2020 | Strong et al. |
| 2021/0001426 A1 | 1/2021 | Dixit et al. |
| 2021/0018810 A1 | 1/2021 | Rozbicki et al. |
| 2021/0191214 A1 | 6/2021 | Rozbicki et al. |
| 2021/0247654 A1 | 8/2021 | Mogensen et al. |
| 2021/0394489 A1 | 12/2021 | Strong et al. |
| 2022/0001651 A1 | 1/2022 | Cabrera |
| 2022/0032584 A1 | 2/2022 | Parker et al. |
| 2022/0050348 A1 | 2/2022 | Dixit et al. |
| 2022/0080706 A1 | 3/2022 | Strong et al. |
| 2022/0241893 A1 | 8/2022 | Dixit et al. |
| 2022/0252952 A1 | 8/2022 | Rozbicki et al. |
| 2023/0029868 A1 | 2/2023 | Ponce et al. |
| 2023/0324754 A1 | 10/2023 | Rozbicki et al. |
| 2024/0082949 A1 | 3/2024 | Dixit et al. |

FOREIGN PATENT DOCUMENTS

| | | |
|---|---|---|
| CN | 1492274 A | 4/2004 |
| CN | 1537257 A | 10/2004 |
| CN | 1620678 A | 5/2005 |

(56) References Cited

FOREIGN PATENT DOCUMENTS

| CN | 1688923 A | 10/2005 |
| CN | 1739057 A | 2/2006 |
| CN | 1808271 A | 7/2006 |
| CN | 1990820 A | 7/2007 |
| CN | 1993648 A | 7/2007 |
| CN | 101276079 A | 10/2008 |
| CN | 101322069 A | 12/2008 |
| CN | 101421666 A | 4/2009 |
| CN | 101438205 A | 5/2009 |
| CN | 101535885 A | 9/2009 |
| CN | 102057323 A | 5/2011 |
| CN | 101438205 B | 9/2011 |
| CN | 102253559 A | 11/2011 |
| CN | 102388340 A | 3/2012 |
| CN | 102460766 A | 5/2012 |
| CN | 103261960 A | 8/2013 |
| CN | 104011588 A | 8/2014 |
| CN | 104321696 A | 1/2015 |
| CN | 104364706 A | 2/2015 |
| CN | 104834145 A | 8/2015 |
| CN | 105324708 A | 2/2016 |
| CN | 107533267 A | 1/2018 |
| EP | 0413580 A1 | 2/1991 |
| EP | 0725944 A4 | 3/1995 |
| EP | 1382994 A2 | 1/2004 |
| EP | 2078980 A1 | 7/2009 |
| EP | 2791733 A1 | 10/2014 |
| EP | 3118912 A1 | 1/2017 |
| EP | 3238253 A2 | 11/2017 |
| EP | 3617788 A1 | 3/2020 |
| FR | 2669122 A1 * | 5/1992 ........... G02F 1/1533 |
| FR | 2969771 A1 | 6/2012 |
| JP | S58126577 A | 7/1983 |
| JP | S58163921 A | 9/1983 |
| JP | S5961820 A | 4/1984 |
| JP | S5994744 A | 5/1984 |
| JP | H02151838 A | 6/1990 |
| JP | H0728099 A | 1/1995 |
| JP | 2001051307 A | 2/2001 |
| JP | 2001051308 A | 2/2001 |
| JP | 2001133816 A | 5/2001 |
| JP | 2002076390 A | 3/2002 |
| JP | 2002507781 A | 3/2002 |
| JP | 2006252886 A | 9/2006 |
| JP | 2006286412 A | 10/2006 |
| JP | 2007108750 A | 4/2007 |
| JP | 2008542578 A | 11/2008 |
| JP | 2009169229 A | 7/2009 |
| JP | 2011128504 A | 6/2011 |
| JP | 2011526378 A | 10/2011 |
| JP | 2012058515 A | 3/2012 |
| JP | 2012523018 A | 9/2012 |
| JP | 2012194412 A | 10/2012 |
| JP | 2013062133 A | 4/2013 |
| JP | 2013149433 A | 8/2013 |
| KR | 100302828 B1 | 7/2002 |
| KR | 20040031685 A | 4/2004 |
| KR | 20060122491 A | 11/2006 |
| KR | 20070055494 A | 5/2007 |
| KR | 20100024174 A | 3/2010 |
| KR | 20120007471 A | 1/2012 |
| TW | 282613 B | 8/1996 |
| TW | 201013286 A | 4/2010 |
| TW | 201029838 A | 8/2010 |
| TW | 201211664 A | 3/2012 |
| TW | 201215981 A | 4/2012 |
| TW | 201222119 A | 6/2012 |
| TW | 201342509 A | 10/2013 |
| TW | 201344874 A | 11/2013 |
| TW | 201435464 A | 9/2014 |
| WO | WO-9415247 A1 | 7/1994 |
| WO | WO-9530495 A1 | 11/1995 |
| WO | WO-03037056 A1 | 5/2003 |
| WO | WO-2004026633 A2 | 4/2004 |
| WO | WO-2006014591 A2 | 2/2006 |
| WO | WO-2006021707 A1 | 3/2006 |
| WO | WO-2007103342 A2 | 9/2007 |
| WO | WO-2008150851 A1 | 12/2008 |
| WO | WO-2010014648 A1 | 2/2010 |
| WO | WO-2010093703 A1 | 8/2010 |
| WO | WO-2010119228 A1 | 10/2010 |
| WO | WO-2011028254 A2 | 3/2011 |
| WO | WO-2011050291 A2 | 4/2011 |
| WO | WO-2011112882 A1 | 9/2011 |
| WO | WO-2011137080 A1 | 11/2011 |
| WO | WO-2012018688 A1 | 2/2012 |
| WO | WO-2012078634 A2 | 6/2012 |
| WO | WO-2012138281 A1 | 10/2012 |
| WO | WO-2012174260 A2 | 12/2012 |
| WO | WO-2013163107 A1 | 10/2013 |
| WO | WO-2014025913 A1 | 2/2014 |
| WO | WO-2014099974 A1 | 6/2014 |
| WO | WO-2014124303 A2 | 8/2014 |
| WO | WO-2014152493 A1 | 9/2014 |
| WO | WO-2014191770 A1 | 12/2014 |
| WO | WO-2014201287 A1 | 12/2014 |
| WO | WO-2014205014 A1 | 12/2014 |
| WO | WO-2015103433 A1 | 7/2015 |
| WO | WO-2016004373 A1 | 1/2016 |
| WO | WO-2016029044 A1 | 2/2016 |
| WO | WO-2016105549 A2 | 6/2016 |
| WO | WO-2016126460 A2 | 8/2016 |
| WO | WO-2016154064 A1 | 9/2016 |
| WO | WO-2017192881 A1 | 11/2017 |
| WO | WO-2018039080 A1 | 3/2018 |
| WO | WO-2019178540 A1 | 9/2019 |
| WO | WO-2021118941 A1 | 6/2021 |

OTHER PUBLICATIONS

Al Shakhs, M. et al., "Boosting the transparency of thin layers by coatings of opposing susceptibility: how metals help see through dielectrics," Scientific Reports (www.nature.com); 6:20659; DOI: 10.1038/srep20659, Feb. 10, 2016, 9 pp.
Australian Examination Report dated Feb. 16, 2017 in AU Application No. 2014214738.
Australian Examination Report dated Jul. 10, 2018 in AU Application No. 2017204525.
Australian Office Action dated Jun. 30, 2017 issued in AU Application No. 2014214738.
CA Office Action dated Jul. 18, 2022 in Application No. CA3103961.
CA Office Action dated Dec. 1, 2022, in Application No. CA2980477.
CA Office Action dated Mar. 7, 2022, in Application No. 2,980,477.
Canadian Office Action dated Apr. 26, 2021 issued in CA Application No. 2,899,607.
Canadian Office Action dated Feb. 24, 2020 issued in CA Application No. 2,899,607.
Canadian Office Action dated Nov. 12, 2020 issued in CA Application No. 2,899,607.
Chinese Office Aciton dated Dec. 23, 2020 issued in CN Application No. 201811008514.6.
Chinese Office Aciton dated Feb. 2, 2018 issued in CN Application No. 201480010617.X.
Chinese Office Aciton dated May 19, 2017 issued in Application No. Cn 201480010617.X.
Chinese Office Action dated Apr. 9, 2020 in CN Application No. 201680023096.0.
Chinese Office Action dated Jun. 16, 2021 in CN Application No. 201680023096.0.
CN office action dated Dec. 6, 2021, in application No. 201680023096.0 with English translation.
CN Office Action dated Apr. 27, 2022, in Application No. CN201780057293.9 with English translation.
CN Office Action dated Jul. 5, 2022, in Application No. CN201680023096.0 with English translation.
CN Office Action dated Jul. 19, 2021, issued in CN Application No. 201811008514.6.
CN Office Action dated Jul. 28, 2021, in CN Application No. 201780057293.9.

(56)                  References Cited

OTHER PUBLICATIONS

CN Office Action dated Oct. 10, 2022, in Application No. CN201780057293.9, with EnglishTranslation.
Crupi, I., et al., "Optimization of ZnO:Al/Ag/ZnO:Al structures for ultra-thin high-performance transparent conductive electrodes," vol. 520, No. 13, Apr. 30, 2012, pp. 4432-4435.
EP Extended Search Report dated Feb. 25, 2020 in EP Application No. 17844188.7.
EP Office Action dated Jun. 9, 2022, in Application No. EP19714068.4.
EP office action dated Jun. 21, 2023, in application No. EP20200757159.
EP Office Action dated Jun. 26, 2023, in Application No. EP19714068.4.
EP Office Action dated May 14, 2021 in EP Application No. 17844188.7.
EP Search Report dated Nov. 29, 2021, in Application No. EP21184089.7.
European Office Action dated Aug. 20, 2020 in EP Application No. 19183372.2.
European Office Action dated Feb. 28, 2020 in EP Application No. 19183372.2.
European Office Action dated Jan. 22, 2019 in EP Application No. 14749144.3.
European Office Action dated Jun. 14, 2021 in EP Application No. 16769458.7.
European Office Action dated May 24, 2022, in EP Application No. 16769458.7.
European Office Action dated Sep. 5, 2019 in EP Application No. 19183372.2.
European Search Report dated Aug. 21, 2019 in EP Application No. 19183372.2.
Extended European Search Report dated Aug. 12, 2016, issued in EP Application No. 14749144.3.
Extended European Search Report dated Oct. 19, 2018 in EP Application No. 16769458.7.
Filatova, E. O. et al., "Transparent-conductive-oxide (TCO) buffer layer effect on the resistive switching process in metal/TiO2/TCO/metal assemblies," New Journal of Physics 16 (2014) 113014.
Guillen, C. et al., "TCO/metal/TCO structures for energy and flexible electronics," Thin Solid Films 520, 2011, pp. 1-17.
IN First Examination Report dated Jun. 29, 2021, in the IN Application No. 202038032392.
Indian Office Action dated Oct. 30, 2019 in IN Application No. 2583/KOLNP/2015.
International Preliminary Report on Patentability dated Aug. 20, 2015, issued in PCT/US2014/015374.
International Preliminary Report on Patentability dated Feb. 10, 2022 issued in Application No. PCT/US2020/044337.
International Preliminary Report on Patentability dated Mar. 7, 2019 in PCT/US2017/047664.
International Preliminary Report on Patentability dated Oct. 1, 2020 in PCT/US19/22580.
International Preliminary Report on Patentability dated Oct. 5, 2017 issued in PCT/US16/23293.
International Search Report and Written Opinion dated Jul. 29, 2016 issued in PCT/US16/23293.
International Search Report and Written Opinion dated May 24, 2019 in PCT/US19/22580.
International Search Report and Written Opinion dated Nov. 27, 2014, issued in PCT/US2014/015374.
International Search Report and Written Opinion (ISA/KR) dated Dec. 13, 2017 in PCT/US2017/047664.
Jager, T. et al., "Thin films of SnO2:F by reactive magnetron sputtering with rapid thermal post-annealing," vol. 553, Feb. 28, 2014, pp. 21-25.
Korean Notice of Refusal dated Dec. 1, 2020 in KR Application No. 10-2015-7022800.
Korean Office Action dated Mar. 24, 2021 in KR Application No. 10-2020-7038114.

Korean Office Action dated Mar. 5, 2020 in KR Application No. 10-2015-7022800.
KR Office action dated Apr. 4, 2022 in Application No. KR1020207038114 with English translation.
KR Office Action dated Jan. 19, 2022, in Application No. KR1020207038114 with English translation.
Macleod, H.A., "Thin-film optical filters, 3rd Edition, (Chapter 15: Characteristics of thin-film dielectric materials)," 1986, Bristol, UK, pp. 622-627.
Rubin, M., "Optical properties of soda lime silica glasses," Solar Energy Materials, vol. 12, No. 4, 1985, pp. 275-288.
Russian Decision to Grant, including Search Report, dated Jan. 9, 2018 issued in RU Application No. 2015138108.
Taiwan Office Action dated Jan. 25, 2021 issued in TW Application No. 106128249.
Taiwan Office Action dated Jul. 6, 2017 issued in TW Application No. 103104169.
Tvarusko, Aladar, "The Electric Resistivity of AgO," J. Electrochem. Soc. 1968 115(11), pp. 1105-1110.
TW Office Action dated Apr. 26, 2022 in Application No. TW110144841 with English translation.
U.S. Final office Action dated Jul. 11, 2022 in U.S. Appl. No. 16/981,600.
U.S. Final office Action dated Jun. 28, 2022 in U.S. Appl. No. 16/836,420.
U.S. Non-Final office Action dated Sep. 15, 2022 in U.S. Appl. No. 17/192,883.
U.S. Advisory Action dated Mar. 31, 2022, in U.S. Appl. No. 16/209,514.
U.S. Corrected Notice of Allowability for U.S. Appl. No. 16/327,789 dated Mar. 1, 2021.
U.S. Corrected Notice of Allowance dated Feb. 1, 2023 in U.S. Appl. No. 16/947,757.
U.S. Corrected Notice of Allowance dated Jan. 9, 2023 in U.S. Appl. No. 16/836,420.
U.S. Final office Action dated Jul. 13, 2022 in U.S. Appl. No. 16/806,972.
U.S. Final Office Action dated Jun. 7, 2023 in U.S. Appl. No. 16/981,600.
U.S. Final office Action dated Oct. 25, 2022 in U.S. Appl. No. 16/947,757.
U.S. Final Office Action dated Sep. 30, 2021, in U.S. Appl. No. 16/209,514.
U.S. Final Office Action for U.S. Appl. No. 15/086,438 dated Feb. 9, 2018.
U.S. Final Office Action for U.S. Appl. No. 16/209,514 dated Nov. 25, 2020.
U.S. Non Final Office Action dated Feb. 16, 2022 in U.S. Appl. No. 16/981,600.
U.S. Non-Final office Action dated Jun. 23, 2022 in U.S. Appl. No. 16/209,514.
U.S. Non-Final office Action dated Apr. 28, 2022 in U.S. Appl. No. 16/947,757.
U.S. Non-Final Office Action dated May 9, 2023 in U.S. Appl. No. 17/192,883.
U.S. Non-Final Office Action dated Oct. 14, 2021 in U.S. Appl. No. 16/806,972.
U.S. Non-Final office Action dated Oct. 28, 2022 in U.S. Appl. No. 16/981,600.
U.S Non-Final Office Action dated Sep. 29, 2021 in U.S. Appl. No. 16/836,420.
U.S. Notice of Allowance dated Aug. 24, 2022 in U.S. Appl. No. 16/947,841.
U.S. Notice of Allowance dated Dec. 8, 2022 in U.S. Appl. No. 16/947,841.
U.S. Notice of Allowance dated Dec. 21, 2022 in U.S. Appl. No. 16/836,420.
U.S. Notice of Allowance dated Jan. 20, 2023 in U.S. Appl. No. 16/947,757.
U.S. Notice of Allowance dated Sep. 28, 2022 in U.S. Appl. No. 16/806,972.
U.S. Notice of Allowance for U.S. Appl. No. 13/763,505 dated Oct. 23, 2014.

(56)        References Cited

OTHER PUBLICATIONS

U.S. Notice of Allowance for U.S. Appl. No. 14/601,141 dated Sep. 25, 2015.
U.S. Notice of Allowance for U.S. Appl. No. 15/086,438 dated Dec. 28, 2018.
U.S. Notice of Allowance for U.S. Appl. No. 15/560,146 dated Aug. 28, 2020.
U.S. Notice of Allowance for U.S. Appl. No. 15/560,146 dated Jan. 15, 2021.
U.S. Notice of Allowance for U.S. Appl. No. 16/327,789 dated Feb. 4, 2021.
U.S. Notice of Allowance for U.S. Appl. No. 16/509,189 dated Jul. 8, 2020.
U.S. Office Action for U.S. Appl. No. 13/763,505 dated May 23, 2014.
U.S. Office Action for U.S. Appl. No. 15/086,438 dated Jul. 27, 2017.
U.S. Office Action for U.S. Appl. No. 15/560,146 dated Aug. 7, 2019.
U.S. Office Action for U.S. Appl. No. 16/209,514 dated Mar. 18, 2020.
U.S. Office Action for U.S. Appl. No. 16/209,514 dated May 11, 2021.
U.S. Office Action for U.S. Appl. No. 16/327,789 dated Sep. 28, 2020.
U.S. Office Action for U.S. Appl. No. 16/509,189 dated Mar. 13, 2020.
U.S. Appl. No. 18/330,591, inventors Robert Tad Rozbicki et al., filed on Jun. 7, 2023.
U.S.Final Office Action for U.S. Appl. No. 15/560,146 dated Apr. 14, 2020.
Von Rottkay, K. et al., "Optical indices of pyrolytic tin-oxide glass," Mater. Res. Soc. Symp. Proc., vol. 426, 1996, 449, (LBNL Publication 38586), 7 pp.
Wikipedia webpage., "Visible Spectrum", 2018, 4 pages.
U.S. Non-Final Office Action dated Mar. 14, 2024 in U.S. Appl. No. 17/597,701.
AU Examination report No. 1 for Standard patent application, dated Jul. 13, 2020, for Australian Patent Application No. 2015371272.
AU Notice of Acceptance for patent application, dated Oct. 6, 2020, for Australian Patent Application No. 2015371272.
AU Office Action dated Dec. 15, 2021, in Application No. AU20200250303.
AU Office Action dated Mar. 8, 2022, in Application No. AU2021200729.
CA Notice of Allowance dated Jun. 22, 2021 in CA Application No. 2,859,023.
CA Office Action dated Apr. 7, 2022 in CA Application No. CA2859023.
CA Office Action dated Aug. 30, 2023, in Application No. CA3103961.
CA Office Action dated Dec. 15, 2021, in Application No. CA2972240.
CA Office Action dated Dec. 4, 2020 in CA Application No. 2,859,023.
CA Office Action dated Jan. 13, 2020 in CA Application No. 2,859,023.
CA Office Action dated Jul. 10, 2023, in Application No. CA2972240.
CA Office Action dated Oct. 12, 2022, in Application No. CA2972240.
CA Office Action dated Sep. 1, 2023, in Application No. CA3034630.
CN Notice of Allowance with Search Report dated May 27, 2021 in CN Application No. 201580039994.0, with English Translation.
CN Office Action dated Aug. 2, 2023, in Application No. CN201580074719.2 with EnglishTranslation.
CN Office Action dated Aug. 23, 2023, in application No. CN201980026767.2 with English translation.
CN Office Action dated Dec. 24, 2020 in CN Application No. 201580039994.0, with English Translation.
CN Office Action dated Dec. 29, 2023 in CN Application No. CN202110650732.5 with English Translation.
CN Office Action dated Feb. 2, 2019 in CN Application No. 201280061260.9.
CN Office Action dated Feb. 3, 2020 in CN Application No. 201580039994.0.
CN Office Action dated Feb. 3, 2021 in CN Application No. 201580074719.2.
CN Office Action dated Feb. 4, 2017 in CN Application No. 201280061260.9.
CN Office Action dated Jun. 1, 2023, in Application No. CN201811008514.6 with English translation.
CN Office Action dated Mar. 16, 2020 in CN Application No. 201580074719.2.
CN Office Action dated Mar. 21, 2016 in CN Application No. 201280061260.9.
CN Office Action dated May 6, 2020 in CN Application No. 201280061260.9, with English Translation.
CN Office Action dated Oct. 10, 2023, in Application No. CN202110918754.5 with English translation.
CN Office Action dated Oct. 14, 2019 in CN Application No. 201480073448.4.
CN Office Action dated Oct. 16, 2017 in CN Application No. 201280061260.9.
CN Office Action dated Sep. 22, 2023 in CN Application No. 202080085370.3 with English translation.
CN Office Action dated Sep. 26, 2023, in CN Application No. 202080060919.3 with English Translation.
CN Office Action (Decision of Rejection) dated May 15, 2018 in CN Application No. 201280061260.9.
CN Reexamination Decision dated Mar. 25, 2021 in CN Application No. 201280061260.9, with English Translation.
CN Rejection Decision dated Dec. 1, 2020 in CN Application No. 201280061260.9, with English Translation.
CN Rejection Decision dated Jun. 28, 2021 in CN Application No. 201580074719.2.
Decision to Grant dated Apr. 22, 2021 for EP Application No. 17197774.7.
Decision to Grant dated Jun. 11, 2021 for EP Application No. 19150851.4.
EP Extended European Search Report dated Oct. 6, 2023, in Application No. EP23165372.6.
EP Office Action dated Apr. 11, 2022, in Application No. EP15814398.2.
EP Office Action dated Dec. 11, 2023 in EP Application No. 21184089.7.
EP office action dated Nov. 25, 2021, in application No. EP19150841.4.
EP Search Report dated Apr. 7, 2022, in Application No. EP21204163.6.
EP search report mailed on Sep. 14, 2021, in application No. EP21173523.8.
European Office Action dated Apr. 5, 2023 for EP Application No. EP21173523.8.
European Office Action, dated Feb. 18, 2020, for EP Application No. 15814398.2.
European Office Action dated Jul. 28, 2016 for EP Application No. 12857376.3.
European Office Action dated Jun. 29, 2020 for EP Application No. 19150851.4.
European Office Action dated Sep. 15, 2023 in Application No. EP21204163.6.
European Search Report dated Apr. 24, 2018 for EP Application No. 17197774.7.
European Search Report dated Jan. 17, 2019 for EP Application No. 15873818.7.
European Search Report dated Jan. 30, 2018 for EP Application No. 15814398.2.
European Search Report dated Jul. 10, 2015 for EP Application No. 12857376.3.
European Search Report dated Mar. 28, 2019 for EP Application No. 17197774.7.
European Search Report dated Mar. 29, 2019 for EP Application No. 19150851.4.
IN Office Action dated Feb. 22, 2022, in Application No. IN201938042428.

(56) References Cited

OTHER PUBLICATIONS

International Preliminary Report on Patentability and written opinion dated Jun. 23, 2022 in Application No. PCT/US2020/063672.
International Preliminary Report on Patentability dated Jan. 12, 2017, in PCT/US2015/039089.
International Preliminary Report on Patentability dated Jun. 27, 2017, in PCT/US2015/00411.
International Search Report and Written Opinion dated Jun. 29, 2016, in PCT/US2015/00411.
International Search Report and Written Opinion dated Nov. 30, 2022 in PCT Application No. PCT/US2022/075024.
International Search Report and Written Opinion dated Oct. 30, 2015, in PCT/US2015/039089.
Korean Office Action dated Mar. 21, 2023 in KR Application No. 10-2022-7028353 with English translation.
KR Notice of Decision to Grant, dated Jan. 30, 2020, in KR Application No. 2014-7018018.
KR Office Action dated Apr. 4, 2023, in Application No. KR10-2022-7027548 with English translation.
KR Office Action dated Dec. 20, 2018 in KR Application No. 2014-7018018.
KR Office Action dated Jan. 4, 2023 in Application No. KR10-2022-7015306 with English Translation.
KR Office Action dated Jan. 26, 2022, in Application No. KR1020207008593 with English translation.
KR Office Action dated Mar. 28, 2023, in application No. KR10-2020-7008593 with English translation.
KR Office Action dated May 19, 2022 in Application No. KR10-20207008593 with English translation.
KR Office Action dated Oct. 30, 2019 in KR Application No. 2014-7018018.
KR Office Action, Notification of Provisional Rejection, dated Apr. 8, 2021 in KR Application No. 10-2020-7008593.
KR Office Action, Notification of Provisional Rejection, dated Jun. 22, 2020 in KR Application No. 10-2020-7008593.
Minutes of the Oral Proceedings dated Dec. 3, 2020 for EP Application No. 17197774.7.
Notice of Allowance dated Dec. 9, 2020 for EP Application No. 17197774.7.
Notice of Allowance dated May 17, 2021 for EP Application No. 15873818.7.
Preliminary Amendment filed Apr. 6, 2015 in U.S. Appl. No. 14/512,297.
Preliminary Amendment filed Aug. 31, 2015 in U.S. Appl. No. 14/822,732.
Preliminary Amendment filed Feb. 23, 2015 in U.S. Appl. No. 14/423,085.
Preliminary Amendment filed Jul. 28, 2014 in U.S. Appl. No. 14/325,290.
Preliminary Amendment filed Jul. 7, 2014 in U.S. Appl. No. 14/363,769.
Preliminary Amendment filed Oct. 21, 2014 in U.S. Appl. No. 14/363,769.
Response to Summons dated Oct. 23, 2020 for EP Application No. 17197774.7.
Results of the telephone consultation dated Dec. 1, 2020 for EP Application No. 17197774.7.
RU Notice of Allowance dated Jul. 19, 2017 in RU Application No. 2014128536.
RU Office Action dated Apr. 14, 2017 in RU Application No. 2014128536.
Singapore Exam Report and Grant Notice dated Mar. 5, 2018 for SG Application No. 10201608917Q.
Singapore Search Report and Written Opinion dated Apr. 19, 2017 for SG Application No. 10201608917Q.
Summons to attend oral proceedings dated May 12, 2020 for EP Application No. 17197774.7.
Taiwanese Notice of Allowance dated May 28, 2021 for TW Application No. 109106926 with English Translation.
Taiwanese Office Action dated Jan. 31, 2019 for TW Application No. 104121575.
Taiwanese Office Action dated Nov. 12, 2020 for TW Application No. 109106926 with English Translation.
TW Office Action dated Apr. 25, 2023 in Application No. TW20220115251 with English translation.
TW Office Action dated Aug. 31, 2018 in TW Application No. 106146406.
TW Office Action dated Aug. 31, 2022, in Application No. TW111111140 with EnglishTranslation.
TW Office Action dated Feb. 15, 2017 in TW Application No. 101146775 with English Translation.
TW Office Action dated Feb. 24, 2023, in Application No. TW111111140 with EnglishTranslation.
TW Office Action dated Jun. 20, 2018 in TW Application No. 106119450.
TW Office Action dated May 10, 2021 in TW Application No. 108117698.
TW Office Action dated Nov. 30, 2022, in Application No. TW110132429 with EnglishTranslation.
TW Office Action dated Oct. 18, 2023 in TW Application No. 111115251 with English Translation.
TW Office Action dated Oct. 20, 2016 in TW Application No. 101146775.
TW Office Action dated Sep. 20, 2023 in TW Application No. 110132429 with English Translation.
US Corrected Notice of Allowability dated Apr. 24, 2020 in U.S. Appl. No. 15/539,650.
U.S. Corrected Notice of Allowance dated Aug. 3, 2023, in U.S. Appl. No. 17/658,825.
U.S. Corrected Notice of Allowance dated Jun. 2, 2022 in U.S. Appl. No. 17/456,165.
U.S. Corrected Notice of Allowance dated Mar. 30, 2022, in U.S. Appl. No. 17/456,165.
U.S. Corrected Notice of Allowance dated Nov. 3, 2022 in U.S. Appl. No. 16/947,834.
U.S. Corrected Notice of Allowance dated Sep. 27, 2023, in U.S. Appl. No. 17/658,825.
U.S. Final office Action dated Apr. 26, 2023 in U.S. Appl. No. 17/304,741.
US Final Office Action dated Aug. 22, 2019 in U.S. Appl. No. 15/491,869.
U.S. Final Office Action dated Dec. 19, 2023 in U.S. Appl. No. 17/192,883.
U.S. Final Office Action dated Mar. 2, 2023 in U.S. Appl. No. 17/304,012.
US Final Office Action dated Oct. 16, 2017 in U.S. Appl. No. 15/364,162.
U.S. Non-Final office Action dated Aug. 5, 2022 in U.S. Appl. No. 16/947,834.
U.S. Non-Final Office Action dated Dec. 27, 2023 in U.S. Appl. No. 17/304,012.
U.S. Non-Final Office Action dated Feb. 29, 2024 in U.S. Appl. No. 18/330,591.
U.S. Non-Final Office Action dated Jan. 5, 2024 in U.S. Appl. No. 17/446,566.
U.S. Non-Final office Action dated Mar. 31, 2023 in U.S. Appl. No. 17/658,825.
U.S. Non-Final Office Action dated Oct. 13, 2022, in U.S. Appl. No. 17/304,741.
U.S. Non-Final Office Action dated Oct. 20, 2023, in U.S. Appl. No. 16/981,600.
U.S. Non-Final office Action dated Sep. 28, 2022 in U.S. Appl. No. 17/304,012.
US Notice of Allowance (corrected) dated May 19, 2016 in U.S. Appl. No. 14/362,863.
US Notice of Allowance dated Apr. 26, 2019 for U.S. Appl. No. 15/934,854.
U.S. Notice of Allowance dated Aug. 1, 2022 in U.S. Appl. No. 17/456,165.
U.S. Notice of Allowance dated Dec. 6, 2023 in U.S. Appl. No. 17/658,825.

(56)                  References Cited

OTHER PUBLICATIONS

U.S. Notice of Allowance dated Dec. 11, 2023 in U.S. Appl. No. 17/304,741.
U.S. Notice of Allowance dated Dec. 20, 2023 in U.S. Appl. No. 17/304,741.
U.S. Notice of Allowance dated Feb. 24, 2022, in U.S. Appl. No. 17/456,165.
US Notice of Allowance dated Feb. 6, 2018 in U.S. Appl. No. 15/364,162.
US Notice of Allowance dated Jan. 2, 2019 in U.S. Appl. No. 15/390,421.
US Notice of Allowance dated Jan. 23, 2020 in U.S. Appl. No. 15/539,650.
US Notice of Allowance dated Jan. 4, 2019 for U.S. Appl. No. 15/934,854.
U.S. Notice of Allowance dated Jul. 21, 2023 in U.S. Appl. No. 17/658,825.
US Notice of Allowance dated Jun. 26, 2018 in U.S. Appl. No. 14/822,732.
US Notice of Allowance dated Mar. 12, 2021 for U.S. Appl. No. 16/523,852.
US Notice of Allowance dated May 12, 2017 for U.S. Appl. No. 14/512,297.
US Notice of Allowance dated May 14, 2020 in U.S. Appl. No. 15/491,869.
US Notice of Allowance dated May 15, 2020 in U.S. Appl. No. 15/539,650.
US Notice of Allowance dated May 23, 2018 in U.S. Appl. No. 15/390,421.
US Notice of Allowance dated May 6, 2016 in U.S. Appl. No. 14/362,863.
US Notice of Allowance dated Nov. 23, 2020 in U.S. Appl. No. 16/195,693.
US Notice of Allowance dated Oct. 4, 2016 for U.S. Appl. No. 14/512,297.
US Notice of Allowance dated Sep. 19, 2018 in U.S. Appl. No. 15/390,421.
US Notice of Allowance dated Sep. 23, 2019 for U.S. Appl. No. 14/884,683.
U.S. Notice of Allowance dated Sep. 29, 2022 in U.S. Appl. No. 16/947,834.
US Office Action dated Apr. 2, 2020 for U.S. Appl. No. 16/523,852.
US Office Action dated Aug. 1, 2018 for U.S. Appl. No. 15/934,854.
US Office Action dated Feb. 15, 2019 in U.S. Appl. No. 15/491,869.
US Office Action dated Jan. 10, 2020 in U.S. Appl. No. 15/491,869.
US Office Action dated Jan. 29, 2016 in U.S. Appl. No. 14/362,863.
US Office Action dated Jun. 29, 2018 in U.S. Appl. No. 15/491,869.
US Office Action dated Mar. 28, 2017 for U.S. Appl. No. 15/364,162.
US Office Action dated May 10, 2016 for U.S. Appl. No. 14/512,297.
US Office Action dated May 15, 2019 for U.S. Appl. No. 14/884,683.
US Office Action dated Oct. 15, 2015 for U.S. Appl. No. 14/512,297.
US Office Action dated Oct. 25, 2019 for U.S. Appl. No. 16/523,852.
US Office Action dated Oct. 31, 2018 for U.S. Appl. No. 14/884,683.
US Office Action dated Sep. 12, 2017 in U.S. Appl. No. 14/822,732.
US Office Action dated Sep. 16, 2020 for U.S. Appl. No. 16/523,852.
U.S. Appl. No. 15/364,162, inventors Parker et al., filed Nov. 29, 2016.
U.S. Appl. No. 15/390,421, inventors Dixit et al., filed Dec. 23, 2016.
U.S. Appl. No. 15/491,869 , inventors Strong et al., filed Apr. 19, 2017.
U.S. Appl. No. 15/539,650, inventors Dixit et al., filed Jun. 23, 2017.
U.S. Appl. No. 15/934,854, inventors Parker et al., filed Mar. 23, 2018.
U.S. Appl. No. 16/195,693, inventors Dixit et al., filed Nov. 19, 2018.

U.S. Appl. No. 16/523,852, inventors Parker et al., filed on Jul. 26, 2019.
U.S. Appl. No. 13/312,057, filed Dec. 6, 2011, entitled "Spacers for Insulated Glass Units".
U.S. Appl. No. 13/326,168, filed Dec. 14, 2011, entitled "Connectors For Smart Windows".
U.S. Appl. No. 13/452,032, filed Apr. 20, 2012, entitled "Angled Bus Bar".
U.S. Appl. No. 13/456,056, filed Apr. 25, 12, entitled "Electrochromic Window Fabrication Methods".
U.S. Appl. No. 13/968,258, filed Aug. 15, 2013, entitled "Multi-purpose Controller for Multistate Windows".
U.S. Appl. No. 14/103,660, filed Dec. 11, 2013, entitled "Connectors for Smart".
U.S. Appl. No. 14/152,873, filed Jan. 10, 2014, entitled "Spacers for Insulated Glass Units".
U.S. Appl. No. 14/196,895, filed Mar. 4, 2014, entitled "Improved Spacers and Connectors for Insulated Glass Units".
U.S. Appl. No. 14/325,290, filed Jan. 7, 2015.
U.S. Appl. No. 14/325,290, filed Jul. 7, 2014, entitled "Connectors for Smart Windows".
U.S. Appl. No. 14/363,769, filed Jun. 6, 2014, entitled "Connectors for Smart Windows"—371 national phase application.
U.S. Appl. No. 14/512,297, filed Oct. 10, 2014, entitled "Electrochromic Window Fabrication Methods", and prelim amendment filed Oct. 10, 2014.
U.S. Appl. No. 14/822,732, filed Aug. 10, 2015, entitled "Thin-Film Devices and Fabrication".
U.S. Appl. No. 14/884,683, filed Oct. 15, 2015, entitled "Fabrication of Low Defectivity Electrochromic Devices".
U.S. Appl. No. 18/491,638, inventors Dixit A A, et al., filed on Oct. 20, 2023.
US Preliminary Amendment dated Sep. 17, 2019 for U.S. Appl. No. 16/523,852.
US Preliminary Amendment filed Aug. 26, 2020 in U.S. Appl. No. 16/947,834.
US Preliminary Amendment filed Aug. 31, 2020 in U.S. Appl. No. 16/947,841.
US Preliminary Amendment filed Nov. 20, 2018 in U.S. Appl. No. 16/195,693.
US Preliminary Amendment filed Jan. 12, 2017 for U.S. Appl. No. 15/364,162.
US Preliminary Amendment filed Apr. 17, 18 in U.S. Appl. No. 15/934,854.
US Preliminary Amendment filed Apr. 20, 2017 for U.S. Appl. No. 15/491,869.
US Preliminary Amendment filed Aug. 17, 2015 in U.S. Appl. No. 14/362,863.
U.S. Preliminary Amendment filed on Apr. 12, 2022 for U.S. Appl. No. 17/658,825.
U.S. Restriction Requirement dated Apr. 15, 2022 in U.S. Appl. No. 17/304,741.
U.S. Corrected Notice of Allowance dated Dec. 6, 2024 in U.S. Appl. No. 17/192,883.
U.S. Corrected Notice of Allowance dated Jan. 27, 2025 in U.S. Appl. No. 17/597,701.
U.S. Final Office Action dated Sep. 27, 2024 in U.S. Appl. No. 18/330,591.
U.S. Non-Final Office Action dated Dec. 19, 2024 in U.S. Appl. No. 18/491,638.
U.S. Notice of Allowance dated Nov. 14, 2024 in U.S. Appl. No. 17/192,883.
U.S. Notice of Allowance dated Sep. 30, 2024 in U.S. Appl. No. 17/597,701.
U.S. Appl. No. 19/026,575, inventors Rozbicki R.T et al., filed Jan. 17, 2025.

* cited by examiner

489 —

487 —

485 —

483 —

481 —

489

487

485

483

Defect-Mitigating
Insulating Layer

481

489

487

485

Defect-Mitigating
Insulating Layer

483

481

489

487

Defect-Mitigating
Insulating Layer

485

483

481

489

487

485

483

481

Defect-Mitigating
Insulating Layer

489

487                                                                Defect-Mitigating
                                                                   Insulating Layer

485

483
                                                                   Defect-Mitigating
                                                                   Insulating Layer

481

489

487

485

483

481

Defect-Mitigating
Insulating Layer

Defect-Mitigating
Insulating Layer

489

487

485

483

481

Defect-Mitigating
Insulating Layer

Defect-Mitigating
Insulating Layer

501

Receive Substrate with TC Layer — 503

Wash and Prepare for Device Fabrication — 505

Deposit First Electrocromic Layer — 507

Lithiate (Optional) — 509

Deposit Second Electrochromic Layer — 511

Lithiate — 513

Deposit Second TC Layer — 515

Post Treatment (Thermal Conditioning) — 517

Done

523

Receive Substrate with TC Layer — 503

Wash and Prepare for Device Fabrication — 505

Deposit First Electrocromic Layer — 507

Lithiate (Optional) — 509

Deposit Insulating Layer and optionally more of the First Electrochromic Layer — 523

Deposit Second Electrochromic Layer — 511

Lithiate — 513

Deposit Second TC Layer — 515

Post Treatment (Thermal Conditioning) — 517

Done

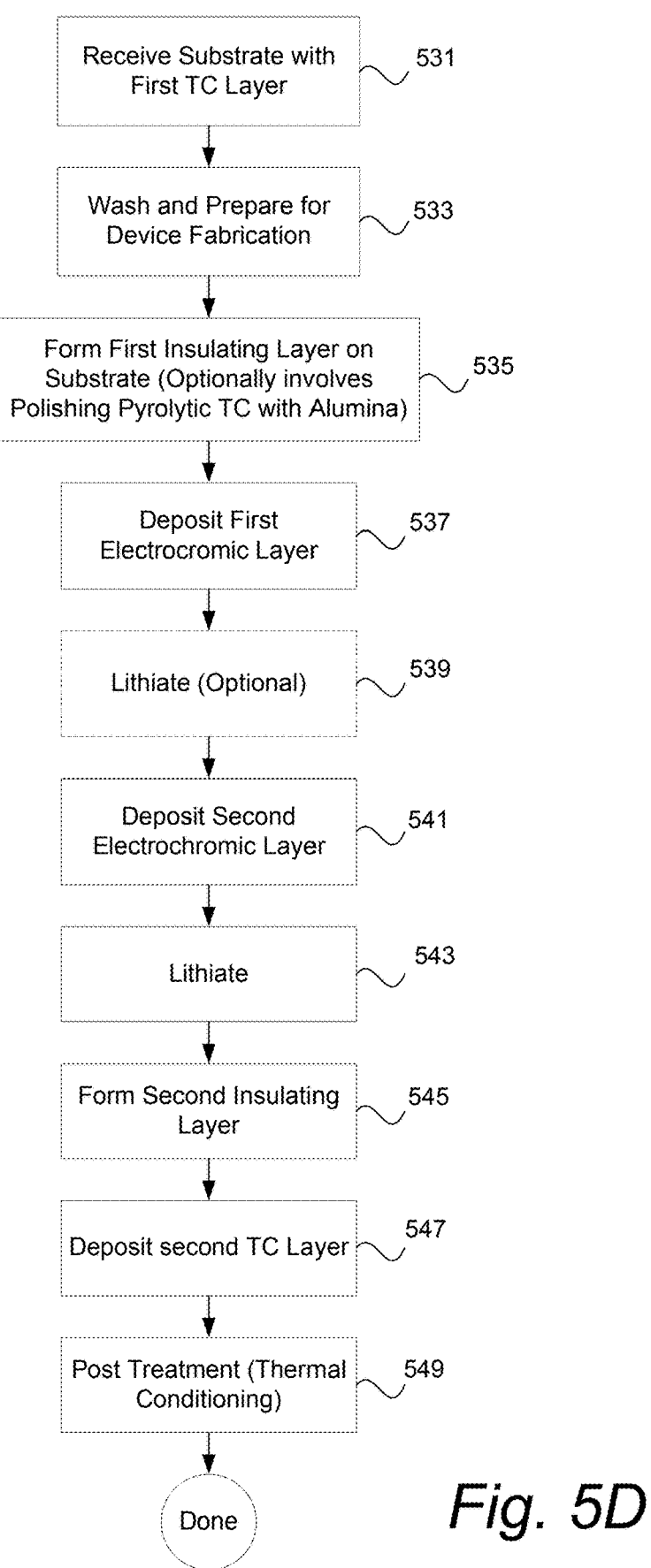

Receive Substrate with First TC Layer — 531

Wash and Prepare for Device Fabrication — 533

Form First Insulating Layer on Substrate (Optionally involves Polishing Pyrolytic TC with Alumina) — 535

Deposit First Electrocromic Layer — 537

Lithiate (Optional) — 539

Deposit Second Electrochromic Layer — 541

Lithiate — 543

Form Second Insulating Layer — 545

Deposit second TC Layer — 547

Post Treatment (Thermal Conditioning) — 549

Done

*Fig. 5D*

FABRICATION OF ELECTROCHROMIC DEVICES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. Electrochromic materials may be incorporated into, for example, windows and mirrors. The color, transmittance, absorbance, and/or reflectance of such windows and mirrors may be changed by inducing a change in the electrochromic material. However, advances in electrochromic technology, apparatus, and related methods of making and/or using them, are needed because conventional electrochromic windows suffer from, for example, high defectivity and low versatility.

SUMMARY

Disclosed herein is an electrochromic device design and process for producing electrochromic devices. In some embodiments, the devices and methods employ the addition of a defect-mitigating insulating layer which prevents electronically conducting layers and/or electrochromically active layers from contacting layers of the opposite polarity and creating a short circuit in regions where defects form. In some embodiments, an encapsulating layer is provided to encapsulate particles and prevent them from ejecting from the device stack and risking a short circuit when subsequent layers are deposited. In certain embodiments, the insulating layer has an electronic resistivity of between about 1 and $5 \times 10^{10}$ Ohm-cm. In certain embodiments, the insulating layer contains one or more of the following metal oxides: cerium oxide, titanium oxide, aluminum oxide, zinc oxide, tin oxide, silicon aluminum oxide, tungsten oxide, nickel tungsten oxide, tantalum oxide, and oxidized indium tin oxide. In certain embodiments, the insulating layer contains a nitride, carbide, oxynitride, or oxycarbide such as nitride, carbide, oxynitride, or oxycarbide analogs of the listed oxides. As an example, the insulating layer includes one or more of the following metal nitrides: titanium nitride, aluminum nitride, silicon nitride, and tungsten nitride. The insulating layer may also contain a mixture or other combination of oxide and nitride materials (e.g., a silicon oxynitride).

One aspect of this disclosure concerns electrochromic devices characterized by the following features: (a) a substrate; (b) a first electrode layer disposed on the substrate, the first electrode layer comprising a first transparent electronically conductive material; (c) an electrochromic stack comprising an electrochromic layer of electrochromic material and a counter electrode layer of counter electrode material; (d) a second electrode layer disposed on the electrochromic stack, the second electrode layer comprising a second transparent electronically conductive material; and (e) a defect-mitigating insulating layer comprising a substantially transparent and electronically insulating material. The insulating material is disposed at (i) a location between an intermediate position within the electrochromic layer and the position of the electrode layer to which the electrochromic layer is in most direct electrical communication or (ii) a location between an intermediate position within the counter electrode layer and the position of the electrode layer to which the counter electrode layer is in the most direct electrical communication. In some implementations, the electrochromic stack has a graded composition.

In certain embodiments, the electrochromic material is a cathodically coloring electrochromic material and the counter electrode material is an anodically coloring electrochromic material. The electrochromic layer is adjacent to the first electrode layer and the counter electrode layer is adjacent to the second electrode layer. The electrochromic material may be a tungsten oxide. The counter electrode material may be a nickel tungsten oxide. The electrochromic stack may also include an ion conducting layer interposed between the electrochromic layer and the counter electrode layer.

In such embodiments, the defect-mitigating insulating layer may be located at various positions in the device. For example, the insulating layer may be disposed at a location between an intermediate position within the counter electrode layer and the position of the second electrode layer. In some cases, the insulating layer is disposed at an intermediate position within the counter electrode layer. In some cases, the defect-mitigating insulating layer is disposed between the counter electrode layer and the second electrode layer, in contact with the second electrode layer.

In certain embodiments, the electrochromic material is a cathodically coloring electrochromic material and the counter electrode material is an anodically coloring electrochromic material, and the electrochromic layer is adjacent to the second electrode layer, and the counter electrode layer is adjacent to the first electrode layer. In some such embodiments, the defect-mitigating insulating layer is disposed at a location between an intermediate position within the electrochromic layer and the position of the second electrode layer. In other embodiments, the defect-mitigating insulating layer is disposed at an intermediate position within the electrochromic layer. In still other embodiments, the defect-mitigating insulating layer is disposed between the electrochromic layer and the second electrode layer, in contact with the second electrode layer.

In some implementations, the electrochromic stack does not contain a separately deposited ion conductor layer. In some implementations, the number of visible short-related pinhole defects in the electrochromic device is no greater than about 0.005 per square centimeter. In some cases, the electrochromic stack is entirely solid state and inorganic.

The electrochromic device may additionally include a second defect-mitigating insulating layer proximate the first electrode layer. In such devices, both defect-mitigating insulating layers may be disposed between the first and second electrode layers.

In some implementations, the substrate contains only glass or other structural member. In such cases, the first electrode directly contacts the substrate. In other implementations, the device includes one or more layers between the substrate and the first electrode layer. For example, one of the layers between the substrate and the first electrode layer may be a diffusion barrier layer.

In some embodiments, the electrochromic layer contains two sub-layers each containing tungsten oxide, and one sub-layer has a greater concentration of oxygen than the other sub-layer. As an example, the counter electrode layer in such embodiments is a nickel tungsten oxide.

The defect-mitigating insulating layer may be made from various materials and have various properties. In some embodiments, the defect-mitigating insulating layer is a metal oxide, a metal nitride, a metal carbide, a metal oxynitride, or a metal oxycarbide. For example, the defect-mitigating insulating layer may be a metal oxide selected from the group consisting of aluminum oxide, titanium oxide, tantalum oxide, cerium oxide, zinc oxide, tin oxide, silicon aluminum oxide, tungsten oxide, nickel tungsten oxide, and oxidized indium tin oxide. Alternatively, the defect-mitigating insulating layer may be a metal nitride selected from the group consisting of titanium nitride, aluminum nitride, silicon nitride, tantalum nitride, and tungsten nitride. Still further, the defect-mitigating insulating layer may be a metal carbide selected from the group consisting of titanium carbide, aluminum carbide, silicon carbide, tantalum carbide, and tungsten carbide. In some devices, the defect-mitigating insulating layer contains two distinct electronically insulating materials. For example, the defect-mitigating insulating layer may include particles of a polishing compound.

The defect-mitigating insulating layer may be between about 5 nm and 500 nm in thickness. In certain embodiments, the insulating layer has an electronic resistivity of between about 1 ohm-cm and $10^{15}$ ohm-cm. In certain embodiments, the defect-mitigating insulation layer is ionically conductive.

Another aspect of the disclosure concerns methods of fabricating an electrochromic device characterized by the following operations: (a) forming an electrochromic stack on a first electrode layer disposed on a substrate, wherein the electrochromic stack includes an electrochromic layer of electrochromic material and a counter electrode layer of counter electrode material, and wherein the first electrode layer contains a first transparent electronically conductive material; (b) forming a defect-mitigating insulating layer within, beneath, or on the electrochromic stack, wherein the defect-mitigating insulating layer includes a substantially transparent and electronically insulating material; and (c) forming a second electrode layer over the electrochromic stack, the second electrode layer comprising a second transparent electronically conductive material. The defect-mitigating insulating layer is disposed at (i) a location between an intermediate position within the electrochromic layer and the position of the electrode layer to which the electrochromic layer is in most direct electrical communication or (ii) a location between an intermediate position within the counter electrode layer and the position of the electrode layer to which the counter electrode layer is in the most direct electrical communication.

In some implementations, the electrochromic layer contains a cathodically coloring electrochromic material and is formed before the counter electrode layer in the electrochromic stack. In some such implementations, the defect-mitigating insulating layer is formed between the electrochromic layer and the first electrode layer, in contact with the first electrode layer. In other implementations, the defect-mitigating insulating layer is formed between the counter electrode layer and the second electrode layer, in contact with the second electrode layer. In other cases, the defect-mitigating insulating layer is formed within the counter electrode layer. In still other implementations, the defect-mitigating insulating layer is formed within the electrochromic layer. In some such implementations, the process additionally includes forming or polishing a second defect-mitigating insulating layer between the first electrode layer and the electrochromic layer.

In some embodiments, the electrochromic layer contains a cathodically coloring electrochromic material and is formed after the counter electrode layer in the electrochromic stack. In some such embodiments, the process additionally includes forming or polishing a second defect-mitigating insulating layer between the first electrode layer and the counter electrode layer. In some such embodiments, the defect-mitigating insulating layer is formed between the electrochromic layer and the second electrode layer, in contact with the second electrode layer. In other embodiments, the defect-mitigating insulating layer is formed within the electrochromic layer. In still other embodiments, the defect-mitigating insulating layer is formed within the counter electrode layer. In still other embodiments, the defect-mitigating insulating layer is formed between the counter electrode layer and the first electrode layer, in contact with the first electrode layer.

In certain embodiments, the operation of forming the electrochromic stack is performed without depositing an ion conducting layer. In certain embodiments, the electrochromic stack is entirely solid state and inorganic. For example, the electrochromic material may be a tungsten oxide. In some processes, the counter electrode material is a nickel tungsten oxide. In some methods, forming the electrochromic stack includes forming an electrochromic layer having two sub-layers each comprising tungsten oxide, but with different levels of oxygen.

The methods may deposit defect-mitigating insulating layers of various types. In some embodiments, the defect-mitigating insulating layer is a metal oxide, a metal nitride, a metal carbide, a metal oxynitride, or a metal oxycarbide. For example, the defect-mitigating insulating layer may be a metal oxide selected from the group consisting of aluminum oxide, titanium oxide, tantalum oxide, cerium oxide, zinc oxide, tin oxide, silicon aluminum oxide, tungsten oxide, nickel tungsten oxide, and oxidized indium tin oxide. Alternatively, the defect-mitigating insulating layer may be a metal nitride selected from the group consisting of titanium nitride, aluminum nitride, silicon nitride, tantalum nitride, and tungsten nitride. Still further, the defect-mitigating insulating layer may be a metal carbide selected from the group consisting of titanium carbide, aluminum carbide, silicon carbide, tantalum carbide, and tungsten carbide. In some devices, the defect-mitigating insulating layer contains two distinct electronically insulating materials. For example, the defect-mitigating insulating layer may include particles of a polishing compound. In some cases, the insulating layer has an electronic resistivity of between about 1 ohm-cm and $10^{15}$ ohm-cm.

Forming the defect-mitigating insulating layer may include forming two distinct electronically insulating materials. For example, forming the defect-mitigating insulating layer may include polishing an insulating layer on the substrate as provided to the process, where one of the electronically insulating materials contains particles of a polishing compound. In some such examples, the insulating layer on the substrate contains titanium dioxide. In some embodiments, forming the defect-mitigating insulating layer involves polishing the first electrode layer on the substrate, and the electronically insulating material of the defect-mitigating insulating layer contains particles of a polishing compound.

In some methods, one or more layers are disposed between the substrate and the first electrode layer. For example, one of the layers between the substrate and the first electrode layer may be a diffusion barrier layer.

In certain embodiments, the methods additionally include forming a second defect-mitigating insulating layer. Both defect-mitigating insulating layers may be disposed between the first and second electrode layers.

In various implementations, the methods additionally include depositing lithium on at least a portion of the electrochromic stack. In some cases, depositing lithium is performed prior to forming the defect-mitigating insulating layer.

Another aspect of the disclosure concerns electrochromic devices characterized by the following elements: (a) a substrate; (b) a first electrode layer disposed on the substrate, the first electrode layer comprising a first transparent electronically conductive material; (c) an electrochromic stack comprising an electrochromic layer of electrochromic material and a counter electrode layer of counter electrode material, wherein the first electrode layer is between the substrate and the electrochromic stack; (d) a second electrode layer disposed on the electrochromic stack such that the electrochromic stack is disposed between the first electrode layer and the second electrode layer, the second electrode layer comprising a second transparent electronically conductive material; and (c) a defect-mitigating insulating layer that is substantially transparent and electronically insulating, wherein the defect-mitigating insulating layer is disposed between the first electrode layer and the electrochromic stack. In various implementations, the electrochromic devices contain a second defect-mitigating insulating layer, which second defect-mitigating insulating layer is disposed on or in the electrochromic stack.

In devices of this aspect of the disclosure, the defect-mitigating insulating layer may be made from various materials and have various properties. In some embodiments, the defect-mitigating insulating layer is a metal oxide, a metal nitride, a metal carbide, a metal oxynitride, or a metal oxycarbide. For example, the defect-mitigating insulating layer may be a metal oxide selected from the group consisting of aluminum oxide, titanium oxide, tantalum oxide, cerium oxide, zinc oxide, tin oxide, silicon aluminum oxide, tungsten oxide, nickel tungsten oxide, and oxidized indium tin oxide. Alternatively, the defect-mitigating insulating layer may be a metal nitride selected from the group consisting of titanium nitride, aluminum nitride, silicon nitride, tantalum nitride, and tungsten nitride. Still further, the defect-mitigating insulating layer may be a metal carbide selected from the group consisting of titanium carbide, aluminum carbide, silicon carbide, tantalum carbide, and tungsten carbide. In some devices, the defect-mitigating insulating layer contains two distinct electronically insulating materials. For example, the defect-mitigating insulating layer may include particles of a polishing compound. In various embodiments of this aspect, the defect-mitigating insulating layer is between about 5 nm and 100 nm thick.

In some cases, the defect-mitigating insulating layer contains titanium oxide or tin oxide. In some cases, the defect-mitigating insulating layer contains particles of a polishing compound. In some cases, the defect-mitigating insulating layer contains two distinct electronically insulating materials.

A further aspect of the disclosure concerns electrochromic devices characterized by the following elements: (a) a substrate; (b) a first electrode layer disposed on the substrate, the first electrode layer comprising a first transparent electronically conductive material; (c) an electrochromic stack comprising an electrochromic layer of electrochromic material and a counter electrode layer of counter electrode material, wherein the first electrode layer is between the substrate and the electrochromic stack; (d) a second electrode layer disposed on the electrochromic stack such that the electrochromic stack is disposed between the first electrode layer and the second electrode layer, the second electrode layer comprising a second transparent electronically conductive material; and (e) a defect-mitigating insulating layer that is substantially transparent and electronically insulating, wherein the defect-mitigating insulating layer is disposed between the second electrode layer and the electrochromic stack. In certain embodiments, the second electrode layer contains indium tin oxide.

In devices of this aspect of the disclosure, the defect-mitigating insulating layer may be made from various materials and have various properties. In some embodiments, the defect-mitigating insulating layer is a metal oxide, a metal nitride, a metal carbide, a metal oxynitride, or a metal oxycarbide. For example, the defect-mitigating insulating layer may be a metal oxide selected from the group consisting of aluminum oxide, titanium oxide, tantalum oxide, cerium oxide, zinc oxide, tin oxide, silicon aluminum oxide, tungsten oxide, nickel tungsten oxide, and oxidized indium tin oxide. Alternatively, the defect-mitigating insulating layer may be a metal nitride selected from the group consisting of titanium nitride, aluminum nitride, silicon nitride, tantalum nitride, and tungsten nitride. Still further, the defect-mitigating insulating layer may be a metal carbide selected from the group consisting of titanium carbide, aluminum carbide, silicon carbide, tantalum carbide, and tungsten carbide. In some devices, the defect-mitigating insulating layer contains two distinct electronically insulating materials. For example, the defect-mitigating insulating layer may include particles of a polishing compound. In various embodiments of this aspect, the defect-mitigating insulating layer is between about 5 nm and 100 nm thick.

In various embodiments, the defect-mitigating insulating layer is between about 5 nm and 500 nm thick. In various embodiments, the defect-mitigating insulation layer is ionically conductive. In some implementations, the device includes a second defect-mitigating insulating layer, which second defect-mitigating insulating layer is disposed beneath or in the electrochromic stack.

Another aspect of the disclosure pertains to methods of fabricating an electrochromic device, which methods are characterized by the following operations: (a) receiving a substrate in sputter deposition apparatus, (b) forming an electrochromic stack on the substrate, and (c) forming a second electrode layer over the electrochromic stack, the second electrode layer comprising a second transparent electronically conductive material. The electrochromic stack includes an electrochromic layer of electrochromic material and a counter electrode layer of counter electrode material. The substrate received in the deposition apparatus includes a first electrode layer and a defect-mitigating insulating layer formed thereon, and the first electrode layer is disposed between the substrate and the defect-mitigating insulating layer, and the first electrode layer includes a first transparent electronically conductive material. The insulating layer is electronically insulating and substantially transparent. In some embodiments, the methods additionally include forming a second defect-mitigating insulating layer in or on the electrochromic stack.

The methods may additionally include polishing the defect-mitigating insulating layer prior to forming the electrochromic stack on a substrate. Polishing may optionally be performed prior to deposition of the defect-mitigating insulating layer as well as after. In one embodiment, polishing is performed only after deposition of the defect-mitigating insulating layer. As a result polishing, before and/or after deposition of the layer, the defect-mitigating insulating layer may include particles of a polishing compound. A further discussion of polishing is found in PCT International Application No. PCT/US2012/057606 filed Sep. 28, 2012, which is incorporated herein by reference in its entirety.

The defect-mitigating insulating layer produced during the methods of this aspect may contain a metal oxide, metal nitride, a metal carbide, a metal oxynitride, or a metal oxycarbide. Examples of such defect-mitigating insulating materials include metal oxides selected from the group consisting of aluminum oxide, cerium oxide, zinc oxide, tin oxide, silicon aluminum oxide, tungsten oxide, nickel tungsten oxide, and oxidized indium tin oxide. In some cases, the defect-mitigating insulating layer contains particles of a polishing compound. In some cases, the defect-mitigating insulating layer is between about 5 and 100 nm thick.

Another aspect of the disclosure concerns apparatus for fabricating an electrochromic device, which apparatus is characterized by an integrated deposition system comprising: (i) a first deposition station containing a first target comprising a first material for depositing a layer of an electrochromic material on a substrate when the substrate is positioned in the first deposition station, (ii) a second deposition station containing a second target comprising a second material for depositing a layer of a counter electrode material on the substrate when the substrate is positioned in the second deposition station, and (iii) a third deposition station configured to deposit a defect-mitigating insulating layer that is electronically insulating and substantially transparent. The apparatus is also characterized by a controller containing program instructions for passing the substrate through the first and second deposition stations in a manner that sequentially deposits a stack on the substrate, the stack comprising the layer of electrochromic material, the layer of counter electrode material, and the defect-mitigating insulating layer.

Such apparatus may additionally include a fourth deposition station configured to deposit an electrode layer on the stack, wherein the electrode layer contains a transparent electronically conductive material. In some implementations, the apparatus additionally include a lithium deposition station containing a lithium target for depositing lithium on or within the layer of electrochromic material or on or within the layer of counter electrode material when the substrate is positioned in the lithium deposition station.

In certain embodiments, the program instructions include instructions for depositing the defect-mitigating insulating layer at (i) a location between an intermediate position within the electrochromic layer and the position of the electrode layer to which the electrochromic layer is in most direct electrical communication or (ii) a location between an intermediate position within the counter electrode layer and the position of the electrode layer to which the counter electrode layer is in the most direct electrical communication.

Yet another aspect of the disclosure pertains to apparatus for fabricating an electrochromic device, which apparatus is characterized by an integrated deposition system comprising: (i) a first deposition station containing a first target comprising a first material for depositing a layer of an electrochromic material on a substrate when the substrate is positioned in the first deposition station, (ii) a second deposition station containing a second target comprising a second material for depositing a layer of a counter electrode material on the substrate when the substrate is positioned in the second deposition station, and (iii) a polisher configured to polish a defect-mitigating insulating layer on the substrate. The apparatus is also characterized by a controller containing program instructions for passing the substrate through the first and second deposition stations in a manner that sequentially deposits a stack on the substrate, the stack comprising the layer of electrochromic material and the layer of counter electrode material. In some designs, the polisher is configured to incorporate electronically resistive particles in the defect-mitigating insulating layer.

Such apparatus may additionally include a third deposition station configured to deposit an electrode layer on the stack, wherein the electrode layer includes a transparent electronically conductive material. Further, such apparatus may additionally include a lithium deposition station containing a lithium target for depositing lithium on or within the layer of electrochromic material or on or within the layer of counter electrode material when the substrate is positioned in the lithium deposition station.

These and other features and advantages of the disclosed embodiments will be described in more detail below with reference to the associate drawings.

BRIEF DESCRIPTION OF THE FIGURES

FIG. 5D is a flow chart of a process in accordance with certain embodiments in which first and second defect-mitigating insulating layers are formed adjacent to the transparent conductive layers.

DETAILED DESCRIPTION

The present disclosure concerns methods and apparatus for reducing difficulties created by defects in electrochromic devices. Certain types of defects introduce short circuits that produce particularly unattractive blemishes in electrochromic products. Various disclosed embodiments concern the insertion of an additional layer in the electrochromic device stack. This additional layer serves the primary role of providing an insulating layer between two conductive layers that might otherwise short circuit if a particle has been ejected from the device stack during fabrication. The problem of shorting associated with particle ejection is described below in the context of FIGS. 3A-3D.

In one implementation, a resistive layer, sometimes referred to as a defect-mitigating insulating layer, is deposited in a process operation that is the next operation after the execution of an operation that has a propensity to cause particle ejections. An example of a particle ejection step is the introduction of lithium metal into the device stack (sometimes referred to herein as lithiation). In some cases, an insulating layer is deposited to encapsulate particles deposited during fabrication. Encapsulated particles are less likely than unencapsulated particles to eject from a partially fabricated device stack and lead to a short circuit.

Electrochromic Devices—Examples

Figure 1A:
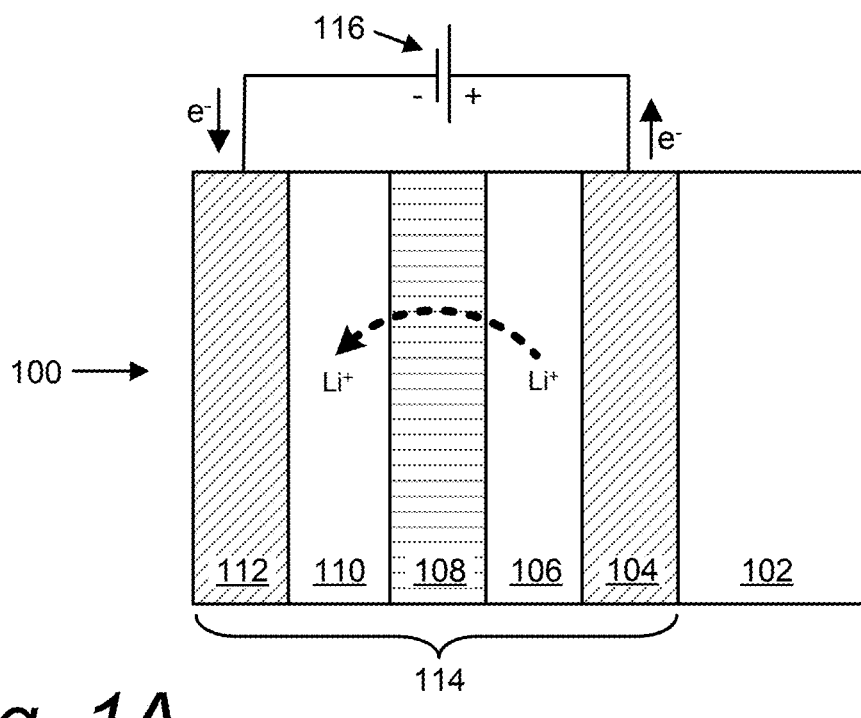
FIGS. 1A and 1B depict the structure and function of electrochromic devices.
Figure 1B:
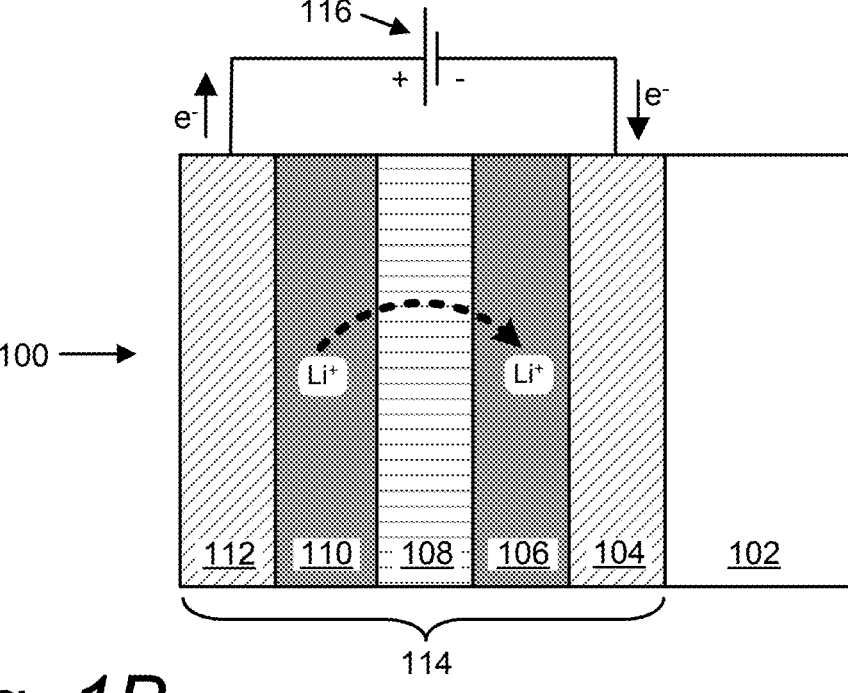

Before turning to a more detailed description of the insulating layer and processes incorporating insulating layer deposition, examples of electrochromic device structure and fabrication will be presented. FIGS. 1A and 1B are schematic cross-sections of an electrochromic device, 100, showing a common structural motif for such devices. Electrochromic device 100 includes a substrate 102, a conductive layer (CL) 104, an electrochromic layer (EC) 106, an optional ion conducting (electronically resistive) layer (IC) 108, a counter electrode layer (CE) 110, and another conductive layer (CL) 112. Elements 104, 106, 108, 110, and 112 are collectively referred to as an electrochromic stack, 114. A voltage source, 116, operable to apply an electric potential across electrochromic stack 112 effects the transition of the electrochromic device from, e.g., a bleached state (refer to FIG. 1A) to a colored state (refer to FIG. 1B).

The order of layers may be reversed with respect to the substrate. That is, the layers may be in the following order: substrate, conductive layer, counter electrode layer, ion conducting layer, electrochromic material layer, and conductive layer. The counter electrode layer may include a material that is electrochromic or not. If both the electrochromic layer and the counter electrode layer employ electrochromic materials, one of them should be a cathodically coloring material and the other should be an anodically coloring material. For example, the electrochromic layer may employ a cathodically coloring material and the counter electrode layer may employ an anodically coloring material.

This is the case when the electrochromic layer is a tungsten oxide and the counter electrode layer is a nickel tungsten oxide.

The conductive layers commonly comprise transparent conductive materials, such as metal oxides, alloy oxides, and doped versions thereof, and are commonly referred to as "TCO" layers because they are made from transparent conducting oxides. In general, however, the transparent layers can be made of any transparent, electronically conductive material that is compatible with the device stack. Some glass substrates are provided with a thin transparent conductive oxide layer such as fluorinated tin oxide, sometimes referred to as "TEC."

Device 100 is meant for illustrative purposes, in order to understand the context of embodiments described herein. Methods and apparatus described herein are used to identify and reduce defects in electrochromic devices, regardless of the structural arrangement of the electrochromic device.

During normal operation, an electrochromic device such as device 100 reversibly cycles between a bleached state and a colored state. As depicted in FIG. 1A, in the bleached state, a potential is applied across the electrodes (transparent conductor layers 104 and 112) of electrochromic stack 114 to cause available ions (e.g. lithium ions) in the stack to reside primarily in the counter electrode 110. If electrochromic layer 106 contains a cathodically coloring material, the device is in a bleached state. In certain electrochromic devices, when loaded with the available ions, counter electrode layer 110 can be thought of as an ion storage layer.

Referring to FIG. 1B, when the potential on the electrochromic stack is reversed, the ions are transported across ion conducting layer 108 to electrochromic layer 106 and cause the material to enter the colored state. Again, this assumes that the optically reversible material in the electrochromic device is a cathodically coloring electrochromic material. In certain embodiments, the depletion of ions from the counter electrode material causes it to color also as depicted. In other words, the counter electrode material is anodically coloring electrochromic material. Thus, layers 106 and 110 combine to synergistically reduce the amount of light transmitted through the stack. When a reverse voltage is applied to device 100, ions travel from electrochromic layer 106, through the ion conducting layer 108, and back into counter electrode layer 110. As a result, the device bleaches.

Some pertinent examples of electrochromic devices are presented in the following US patent applications, each incorporated by reference in its entirety: U.S. patent application Ser. No. 12/645,111, filed Dec. 22, 2009; U.S. patent application Ser. No. 12/772,055, filed Apr. 30, 2010; U.S. patent application Ser. No. 12/645,159, filed Dec. 22, 2009; U.S. patent application Ser. No. 12/814,279, filed Jun. 11, 2010; and U.S. patent application Ser. No. 13/462,725, filed May 2, 2012.

Electrochromic devices such as those described in relation to FIGS. 1A and 1B are used in, for example, electrochromic windows. For example, substrate 102 may be architectural glass upon which electrochromic devices are fabricated. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches.

As larger and larger substrates are used for electrochromic windows it is desirable to minimize defects in the electrochromic device, because otherwise the performance and visual quality of the electrochromic windows will suffer. The embodiments described herein may mitigate defectivity in electrochromic windows.

In some embodiments, electrochromic glass is integrated into an insulating glass unit (IGU). An insulating glass unit includes multiple glass panes assembled into a unit, generally with the intention of maximizing the thermal insulating properties of a gas contained in the space formed by the unit while at the same time providing clear vision through the unit. Insulating glass units incorporating electrochromic glass are similar to insulating glass units currently known in the art, except for electrical terminals for connecting the electrochromic glass to voltage source.

Defectivity in Electrochromic Devices

As used herein, the term "defect" refers to a defective point or region of an electrochromic device. Typically, defects are electrical shorts or pinholes. Further, defects may be characterized as visible or non-visible. In general, a defect in an electrochromic device, and sometimes an area around the defect, does not change optical state (e.g., color) in response to an applied potential that is sufficient to cause non-defective regions of the electrochromic device to color or otherwise change optical state. Often a defect will be manifest as visually discernible anomalies in the electrochromic window or other device. Such defects are referred to herein as "visible" defects. Other defects are so small that they are not visually noticeable to the observer in normal use (e.g., such defects do not produce a noticeable light point or "pinhole" when the device is in the colored state during daytime).

A short is a localized electronically conductive pathway spanning the ion conducting layer (e.g., an electronically conductive pathway between the two transparent conducting layers). Typically, a defect causing a visible short will have a physical dimension on the order of tens micrometers, sometimes less, which is a relatively small defect from a visual perspective. However, these relatively small defects result in a visual anomaly, the "halo", in the colored electrochromic window that are, for example, about 1 centimeter in diameter, sometimes larger. Halos can be reduced significantly by isolating the defect, for example by circumscribing the defect via a laser scribe or by ablating the material directly without circumscribing it. For example, a circular, oval, triangular, rectangular, or other shaped perimeter is ablated around the shorting defect thus electrically isolating it from the rest of the functioning device. The circumscription may be only tens, a hundred, or up to a few hundred micrometers in diameter. By circumscribing, and thus electrically isolating the defect, the visible short will resemble only a small point of light to the naked eye when the window is colored and there is sufficient light on the other side of the window. When ablated directly, without circumscription, there remains no EC device material in the area where the electrical short defect once resided. Rather, there is a hole through the device and at the base of the hole is, for example, the float glass or the diffusion barrier or the lower transparent electrode material, or a mixture thereof. Since these materials are all transparent, light may pass through the base of the hole in the device. Depending on the diameter of a circumscribed defect, and the width of the laser beam, circumscribed pinholes may also have little or no electrochromic material remaining within the circumscription (as the circumscription is typically, though not necessarily, made as small as possible). Such mitigated short defects manifest as pin points of light against the colored device, thus these points of light are commonly referred to as "pinholes." Isolation of an electrical short by circumscribing or direct ablation would be an example of an intentionally-made pinhole formed to convert a halo into a much smaller visual defect. Pinholes may also arise as a natural result of defects in the optical device. In either case, they are to be avoided if possible.

A pinhole is a region where one or more layers of the electrochromic device are missing or damaged so that electrochromism is not exhibited. Pinholes are not electrical shorts, and, as described above, they may be the result of mitigating an electrical short in the device. In certain embodiments, a pinhole has a defect dimension of between about 25 micrometers and about 300 micrometers, typically between about 50 micrometers and about 150 micrometers, thus it is much harder to discern visually than a halo. Typically, in order to reduce the visible perception of pinholes resulting from mitigation of halos, one will limit the size of a purposely-created pinhole to about 100 micrometers or less.

In some cases, an electrical short is created by a conductive particle lodging in and/or across the ion conducting layer, thereby causing an electronic path between the counter electrode layer and the electrochromic layer or the transparent conducting layer associated with either one of them. A defect may also be caused by a particle on the substrate on which the electrochromic stack is fabricated. When such a particle causes layer delamination due to stresses imparted by the particle, this is sometimes called "pop-off." In other instances, the layers do not adhere to the substrate properly and delaminate, interrupting the flow of ions and/or electrical current within the device. These types of defects are described in more detail below in relation to FIGS. 2 and 3A-3D. A delamination or pop-off defect can lead to a short if it occurs before a transparent conducting layer or associated EC or CE layer is deposited. In such cases, the subsequently deposited transparent conducting layer or EC/CE layer will directly contact an underlying transparent conducting layer or CE/EC layer providing direct electronic conductive pathway. A few examples of defect sources are presented in the table below. The table below is intended to provide examples of mechanisms that lead to the different types of visible and non-visible defects. It is not exhaustive. Additional factors exist which may influence how the EC window responds to a defect within the stack.

| Particle Location | Worst Case Failure | Effect |
|---|---|---|
| on substrate | pops off leaving pinhole | pinhole |
| on first Transparent conductive layer | pops off allowing TCL-TCL short | visible short voltage drop |
| on EC layer | Pops off allowing TCL-EC-TCL short | visible short voltage drop |
| on IC layer | pops off leaving pinhole | pinhole |
| on CE layer | pops off leaving pinhole | pinhole |

It is believed that problematic shorts are frequently those in which a particle contacts the partially fabricated device before, during, or immediately after a first electrochromic layer is deposited on a substrate, and then remains in place until immediately before, during or after deposition of the second transparent conductive layer. As explained more fully below, such shorts may be the result of particles attached to the substrate upon entry into the electrochromic deposition chamber, or particles that become attached during deposition of a cathodic electrochromic layer such as a layer of tungsten oxide or become attached immediately after deposition of the first electrochromic layer but before any substantial amount of the next electrochromic layer is deposited. As explained, the substrate may or may not have a transparent conductive layer provided thereon when the substrate enters the deposition apparatus. Problematic shorts may also be introduced by particles that contact the partially fabricated device during lithiation, such as lithiation performed after or during deposition of the second electrochromic layer.

As noted above, in the case of a visible short the defect will appear as a light central region (when the device is in the colored state) with a diffuse boundary such that the device gradually darkens with distance from the center of the short. If there are a significant number of electrical shorts (visible or non-visible) concentrated in an area of an electrochromic device, they may collectively impact a broad region of the device whereby the device cannot switch in such region. This is because the potential difference between the EC and CE layers in such regions cannot attain a threshold level required to drive ions across the ion conductive layer. It should be understood that leakage current may result from sources other than short-type defects. Such other sources include broad-based leakage across the ion conducting layer and edge defects such as roll off defects and scribe line defects. The emphasis here is on leakage caused only by points of electrical shorting across the ion conducting layer in the interior regions of the electrochromic device. These shorts cause visible defects that should be minimized for the electrochromic pane to be acceptable for use in an electrochromic window. Conventionally, the visual defects are identified and mitigated prior to assembly of the pane into an IGU or mitigated in an IGU prior to assembly of the IGU in an architectural facade. However, these are expensive and time consuming procedures.

Figure 2:
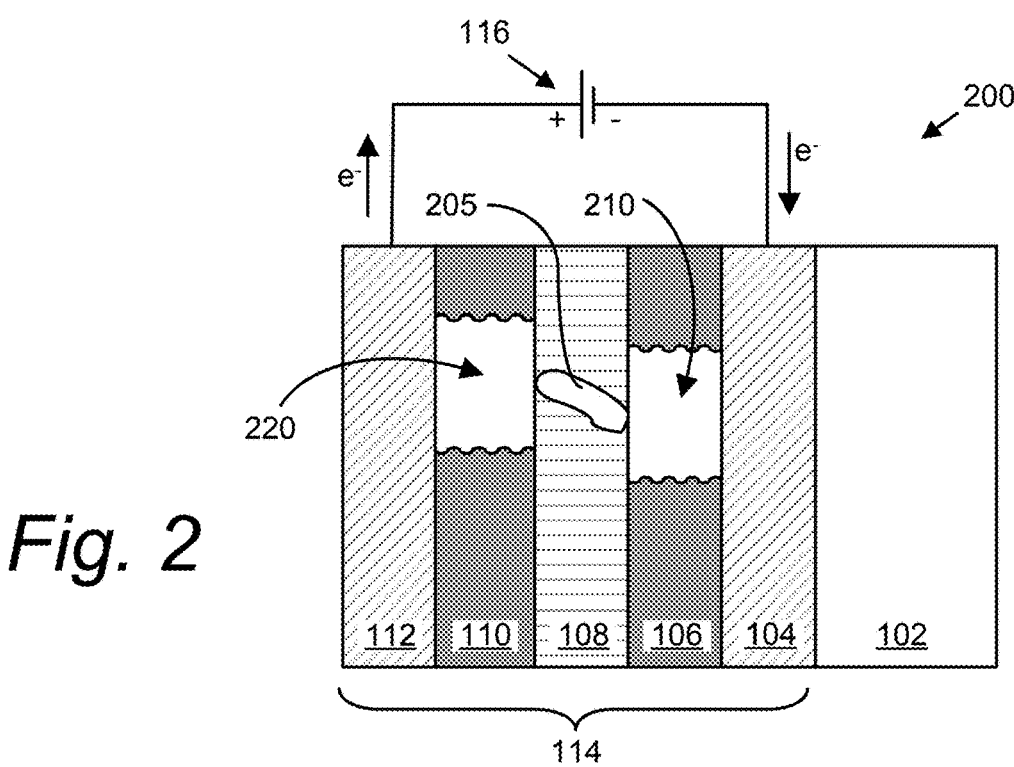
FIG. 2 depicts a particle defect in an electrochromic device.

FIG. 2 is a schematic cross-section of an electrochromic device, 200, with a particle, 205, in the ion conducting layer causing a localized defect in the device. In this example, electrochromic device 200 includes the same layers as described in relation to FIGS. 1A and 1B. Voltage source 116 is configured to apply a potential to electrochromic stack 114 as described above, through suitable connections (e.g., bus bars) to conductive layers 104 and 112.

In this example, ion conducting layer 108 includes a conductive particle, 205, or other artifact causing a defect. Conductive particle 205 results in a short between electrochromic layer 106 and counter electrode layer 110. In this example, particle 205 spans the thickness of the IC layer 108. Particle 205 physically impedes the flow of ions between electrochromic layer 106 and counter electrode layer 110, and also, due to its electrical conductivity, allows electrons to pass locally between the layers, resulting in a transparent region 210 in electrochromic layer 106 and a transparent region 220 in counter electrode layer 110. Transparent region 210 exists when the remainder of layers 110 and 106 are in the colored state. That is, if electrochromic device 200 is in the colored state, conductive particle 205 renders regions 210 and 220 of the electrochromic device unable to enter into the colored state. Sometimes such visible defect regions are referred to as "constellations" or "halos" because they appear as a series of bright spots (or stars) against a dark background (the remainder of the device being in the colored state). Humans will naturally direct their attention to the halos and often find them distracting or unattractive. Embodiments described herein reduce such visible defects. Pinhole defects may or may not be deemed worthy of repair, as they can be nearly indiscernible to the naked eye by most observers.

As mentioned above, visible short defects can also be caused by particles popping off, e.g. during or after fabrication of the electrochromic device, thereby creating damaged areas in the electrochromic stack, through one or more layers of the stack. Pop-off defects are described in more detail below.

Figure 3A:
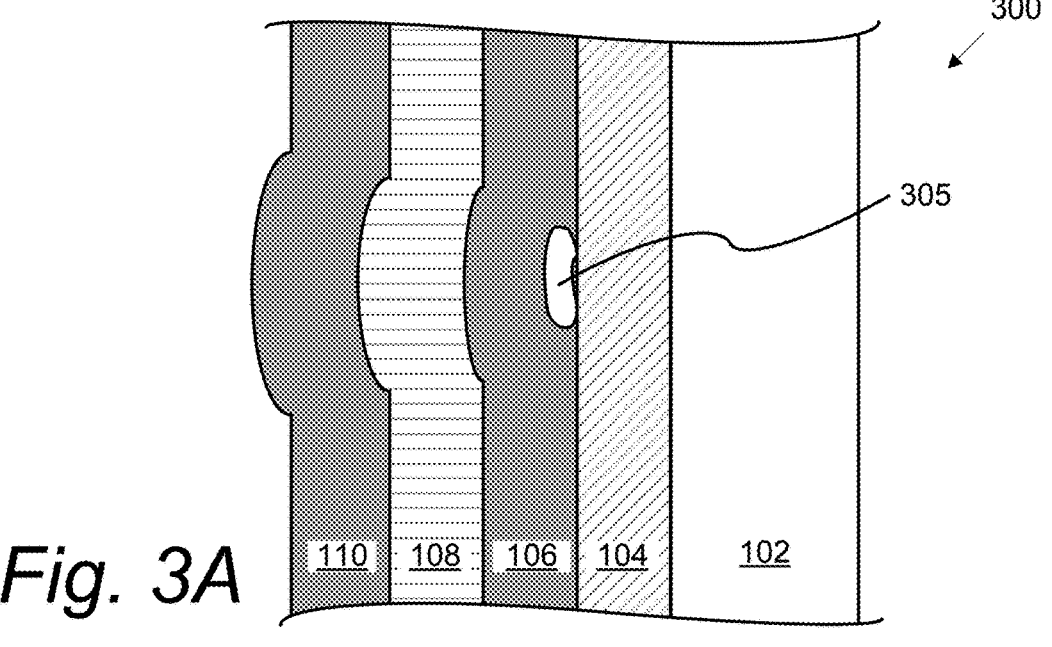
FIGS. 3A-3D depict aspects of formation and remediation of a pop-off defect.

FIG. 3A is a schematic cross-section of an electrochromic device, 300, with a particle 305 or other debris on conductive layer 104 prior to depositing the remainder of the electrochromic stack. Electrochromic device 300 includes the same components as electrochromic device 100. Particle 305 causes the layers in the electrochromic stack 114 to bulge in the region of particle 305, due to conformal layers 106-110 being deposited sequentially over particle 305 as depicted (in this example, conductive layer 112 has not yet been deposited). While not wishing to be bound by a particular theory, it is believed that layering over such particles, given the relatively thin nature of the layers, can cause stress in the area where the bulges are formed. More particularly, in each layer, around the perimeter of the bulged region, there can be defects in the layer, e.g. in the lattice arrangement or on a more macroscopic level, cracks or voids. One consequence of these defects may be, for example, an electrical short between electrochromic layer 106 and counter electrode layer 110 and/or loss of ion conductivity in layer 108. Roll off under the particle is another potential source of shorting. These defects are not depicted in FIG. 3A, however.

Figure 3B:
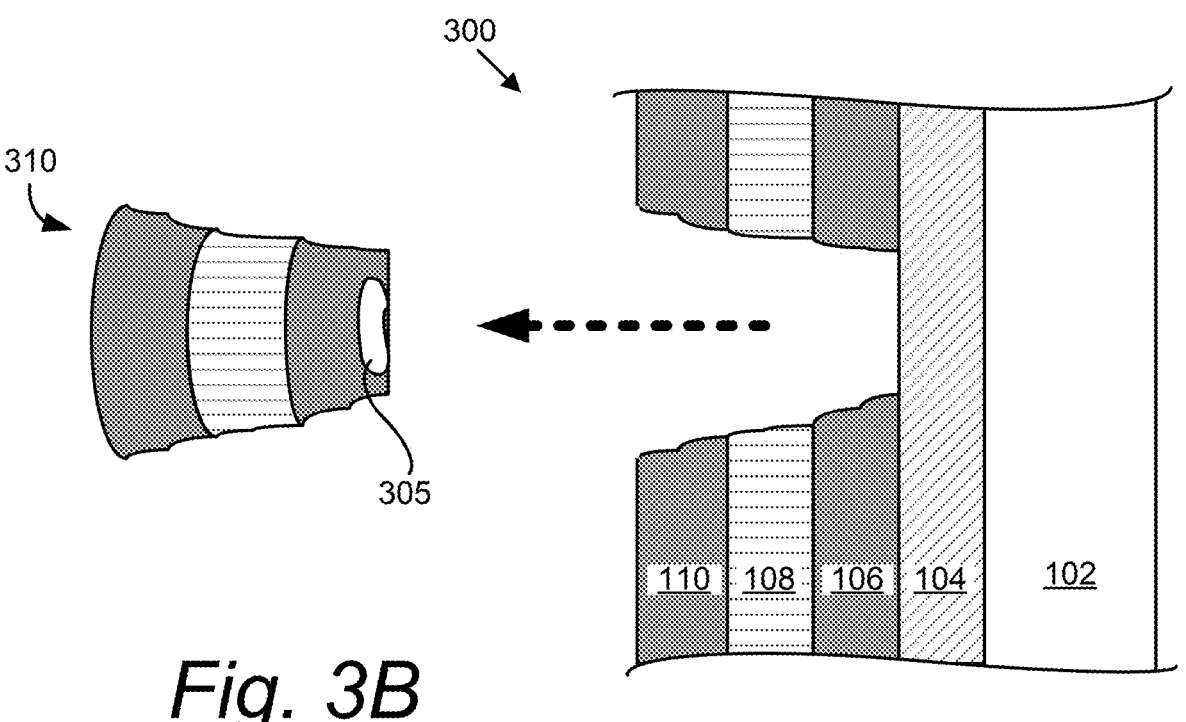
Figure 3C:
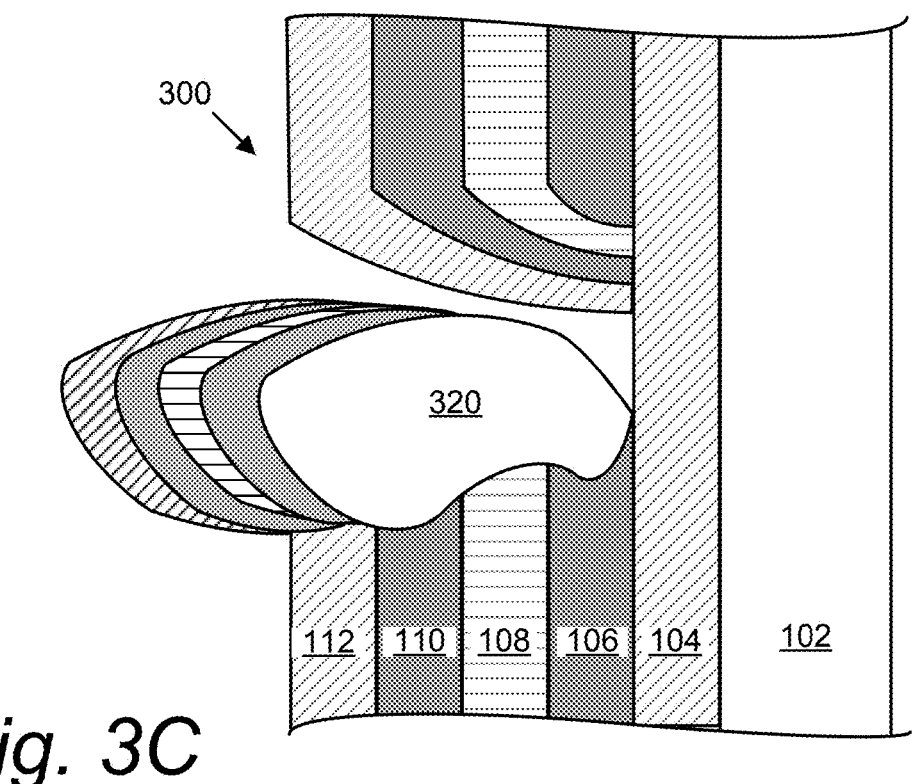

Referring to FIG. 3B, another consequence of defects caused by particle 305 is called a "pop-off." In this example, prior to deposition of conductive layer 112, a portion above the conductive layer 104 in the region of particle 305 breaks loose, carrying with it portions of electrochromic layer 106, ion conducting layer 108, and counter electrode layer 110. The "pop-off" is piece 310, which includes particle 305, a portion of electrochromic layer 106, as well as ion conducting layer 108 and counter electrode layer 110. The result is an exposed area of conductive layer 104 at the bottom of the trench left when piece 310 popped out of the layered stack of materials. It is believed that certain process operations tend to promote pop-offs. One such operation is lithium deposition. FIG. 3C depicts a "large" format particle 320 formed in stack 300. Such particle spans the thickness of multiple layers (in this example electrochromic layer 106, ion conducting layer 108, and counter electrode layer 110). While portions of layers 106, 108, and 110 form on top of particle 320, they effectively form part of the particle itself, which protrudes above the top of layer 110. In some cases, particle 320 naturally pops off without the application of a particle ejection promoting step such as lithiation. In other cases, particle 320 is removed by use of a particle removal step purposely applied to remove particles. Examples of such steps are described below and include contact adhesion techniques, electrostatic approaches, and thermal or pressure treatments, as well as lithiation, which serve two purposes.

In some cases, a short type defect is produced underneath an overhanging area of particle 320. Such defect may result from roll-off of the subsequently deposited layers, one after the other. For example, the first electrochromic layer 106 may extend only a limited distance under the particle overhang, while ion conducting layer 108 extends a little further under the overhang, counter electrode 110 extends still a little further, and finally, the second transparent conductive layer extends ever further, such that its edge contacts the underlying first transparent conductive layer.

This conductive layer to conductive layer contact produces a short-type defect. The short exists regardless of whether particle 320 ever pops off or is otherwise dislodged. Such shorts are typically mitigated via circumscription with a laser to isolate the defect and create a small, and more acceptable, pinhole.

Figure 3D:
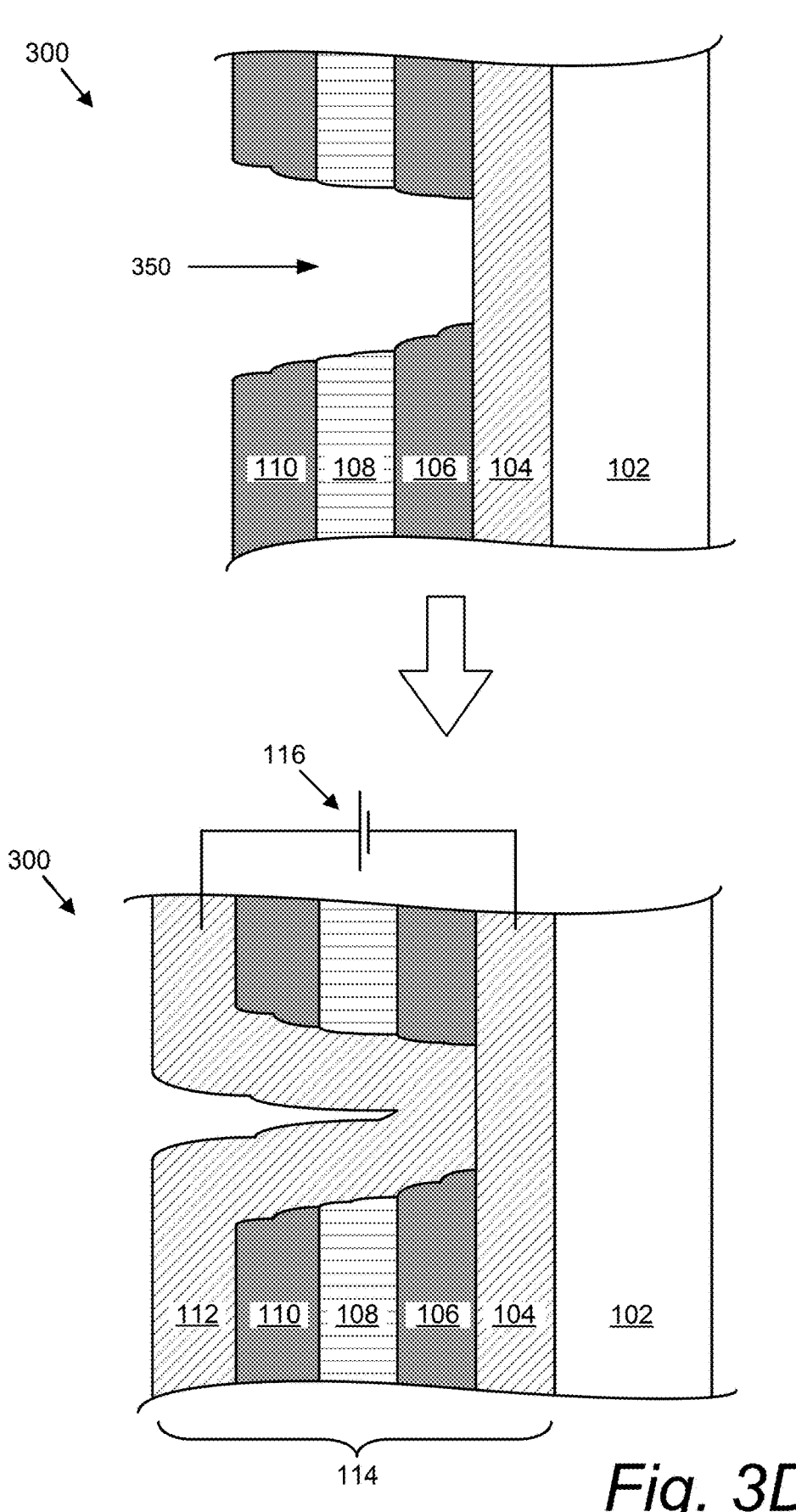

Referring to FIG. 3D, and referring back to FIG. 3B, after pop-off and once conductive layer 112 is deposited, an electrical short is formed where conductive layer 112 comes in contact with conductive layer 104. This electrical short would leave a transparent region in electrochromic device 300 when it is in the colored state, similar in appearance to the visual defect created by the short described above in relation to FIG. 2.

Pop-off defects due to particles or debris on the substrate, ion conducting layer, and on the counter electrode layer may also cause pinhole defects. Also, if a contaminate particle is large enough and does not cause a pop-off, it might be visible when the electrochromic device is in the bleached state.

The description above, as described in relation to FIGS. 1A, 1B, 2, and 3A-3D, presumes that there is a distinct ion conducting (electronically resistive) layer sandwiched between an electrochromic layer and a counter electrode layer in electrochromic devices. The description is only meant to be illustrative of how a particle can create a short related defect. That is, there are electrochromic devices where a distinct electronically resistive and ion conducting layer does not exist, but rather an interfacial region that serves as an ion conductive layer exists at the interface of the electrochromic and counter electrode layers. Electrochromic devices having this architecture are described in U.S. patent application Ser. No. 12/772,055 filed Apr. 30, 2010, Ser. No. 12/772,075 filed Apr. 30, 2010, Ser. No. 12/814,277 filed Jun. 11, 2010, Ser. No. 12/814,279 filed Jun. 11, 2010 and Ser. No. 13/166,537 filed Jun. 22, 2011, each entitled, "Electrochromic Devices," each having inventors Wang et al., and each incorporated by reference herein in their entirety. Thus particles can cause shorting defects in these devices as well, e.g., where the particle exists at and/or crosses the interface between the electrochromic and counter electrode layers and/or creates pop-off type defects as described. Such devices are also susceptible to other defect types described herein, despite not having a distinct IC layer as in conventional devices.

Thus, three types of defects are of primary concern with regard to electrochromic windows: (1) visible pinholes, (2) visible shorts, and (3) non-visible shorts. A visible pinhole will have a defect dimension of at least about 100 μm, and manifest as a very small point of light when the window is colored, sometimes barely discernible to the naked eye, but visible upon close scrutiny. Typically, though not necessarily, a visible short will have defect dimension of at least about 3 micrometers resulting in a region, e.g. of about 1 cm in diameter, which as mentioned is sometimes referred to as a "halo," where the electrochromic effect is perceptibly diminished. These halo regions can be reduced significantly by isolating the defect causing the visible short so that to the naked eye the visible short will resemble only a visible pinhole. Non-visible shorts can affect switching performance of the electrochromic device, by contributing to the overall leakage current of the device, but do not create discernible points of light or halos when the window is in a colored state.

Visible shorts produce a halo when the device is darkened. A halo is a region in the device where an electrical short across the electrochromic stack causes an area around the short to drain current into the short and therefore the area surrounding the short is not darkened. As mentioned, these regions can be up to about 1 cm in diameter, and thus present a problem by making the electrochromic window, when colored, unattractive to the observer. This frustrates the purpose of having windows that can operate in a colored mode.

Conventionally visible short defects are mitigated after fabrication of the electrochromic device, but while still in the production facility, for example, prior to installation in an insulated glass unit. For example, individual electrochromic panes are characterized by first applying temporary bus bars and then coloring the electrochromic device. Visual defects such as halos are identified and then mitigated, for example, laser circumscribed to isolate them and remove the halo effect, which leaves smaller, less discernible, pinhole defects. As described above, conventionally, at least two, large, dedicated apparatus, are used to carry out identification and mitigation of visual defects. However, defects can form in the electrochromic devices after the devices leave the production facility due to, for example, the inherent stresses in electrochromic devices (e.g. see above) and/or stresses applied to the windows during normal use such as installation, pressure differential between interior and exterior space, impacts that do not break the window pane and the like. Conventionally, for electrochromic windows already installed in a vehicle or building, mitigating such defects would not be done, rather the unit would be replaced in the field. This can be very expensive.

As mentioned, the methods and devices herein mitigate the effects of defects. In one embodiment, the number of visible pinhole defects is no greater than about 0.04 per square centimeter. In another embodiment, the number of visible pinhole defects is no greater than about 0.02 per square centimeter, and in more specific embodiments, the number of such defects is no greater than about 0.01 per square centimeter. In one embodiment, the number of short-related defects visible when the device is colored is no greater than about 0.005 per square centimeter. In another embodiment, the number of short-related defects visible when the device is colored is no greater than about 0.003 per square centimeter, and in more specific embodiments, the number of such defects is no greater than about 0.001 per square centimeter. In a further embodiment, the number of short-related defects visible when the device is colored is no greater than about 0.0005 per square centimeter. In one embodiment, the total number of visible defects, pinholes and short-related pinholes created from isolating visible short-related defects, is less than about 0.1 defects per square centimeter, in another embodiment less than about 0.08 defects per square centimeter, in another embodiment less than about 0.05 defects per square centimeter, in another embodiment less than about 0.01 defects per square centimeter, and in another embodiment less than about 0.045 defects per square centimeter (less than about 450 defects per square meter of window). In some cases, the total number of visible defects, pinholes and short-related pinholes created from isolating visible short-related defects, is less than about 0.005 defects per square centimeter.

In some embodiments, the number of non-visible electrical short defects results in leakage currents of less than about 20 μA/cm² at ±2V bias. These values apply across the entire face of the electrochromic device (i.e., there is no region of the device (anywhere on the device) having a defect density greater than the recited value).

In some embodiments, the electrochromic device has no visible defects greater than about 1.6 mm in diameter (the largest transverse dimension of the defect). In another embodiment, the device has no visible defects greater than about 0.5 mm in diameter, in another embodiment the device has no visible defects greater than about 100 μm in diameter.

Structures with Defect-Mitigating Insulating Layers

Various disclosed embodiments concern the insertion of an additional layer in the electrochromic device stack. This additional layer serves the primary role of providing an insulating layer between two conductive layers that might otherwise short circuit if a particle is ejected from the device stack during fabrication or remains on the surface all the way through the fabrication process, leading to roll off shorting. For example, if a particle is introduced during fabrication of the first transparent conductive layer or the first of the electrochromic and counter electrode layers, the particle may be ejected prior to deposition of the second transparent conductive layer, which will produce a short circuit. See rows 2 and 3 of the above table.

In one implementation, a resistive layer, sometimes referred to as a defect-mitigating insulating layer, is deposited at a point in the device fabrication process that is after formation of the first transparent conductive layer and before formation of the second transparent conductive layer. As should be apparent from the above discussion, direct contact between two transparent conductive layers of opposite polarity creates a short circuit. Similarly, direct contact between one of the transparent conductive layers and the electrochromic or counter electrode layer having a polarity opposite that of the conductive layer it contacts produces a short circuit. To avoid any of these types of short circuit, the defect-mitigating insulating layer is formed after particle ejection that exposes the lower transparent conductive layer or the electrochromic or counter electrode layer of polarity opposite that of the upper transparent conductive layer. The insulating layer is typically formed prior to formation of the second transparent conductive layer. In certain embodiments, the insulating layer is deposited in a process operation that is the next operation after the execution of an operation that has a propensity to cause particle ejections. In one example, the insulating layer is deposited immediately after deposition of the first deposited layer of the electrochromic and counter electrode layers. For example, if the electrochromic layer is deposited prior to the counter electrode layer, the insulating layer is deposited immediately after the electrochromic layer is deposited. In such cases, the insulating layer is made from a material that is not a conventional ion conducting layer. In another example, the insulating layer is deposited immediately after lithiation of the first deposited layer of the electrochromic and counter electrode layers. In another example, the insulating layer is deposited immediately after an ion conducting layer is deposited. In another example, the insulating layer is deposited immediately after the second deposited layer of the electrochromic and counter electrode layers. In another example, the insulating layer is deposited immediately after lithiation of the second deposited layer of the electrochromic and counter electrode layers.

Figure 4A:
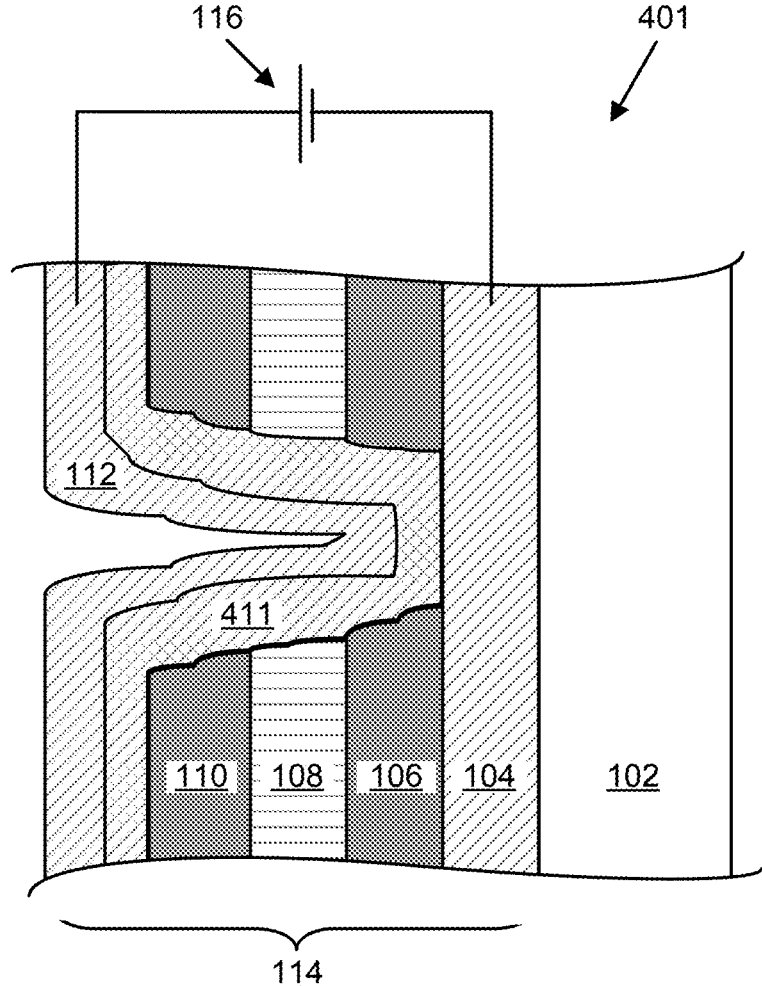
FIG. 4A depicts an electrochromic device in which a defect-mitigating insulating layer is disposed between a second (e.g., upper) transparent conductive layer and the later formed of the counter electrode layer and the electrochromic layer.

FIG. 4A illustrates one example of an electrochromic device 401 having a defect-mitigating insulating layer 411 disposed in contact with the second transparent conductive layer 112 and between conductive layer 112 and counter electrode layer 110, IC layer 108, electrochromic layer 106 as well as first transparent conductive layer 104 Insulating layer 411 thus prevents the second transparent conductive layer from shorting to the first transparent conductive layer as well as shorting with electrochromic layer 106. As shown in FIG. 4A, a stack of layers is formed on a substrate 102.

The device has first and second transparent conductive layers 104 and 112 that would short as in the example of FIG. 3C except that a defect-mitigating insulating layer 411 is provided between them. The composition and other features of layer 411 are described below.

It should be noted that various features of device 401 are effectively identical to those of device 300 in FIG. 3D. Elements of FIGS. 4A, 4B, and/or 4C having the same reference numerals as elements of FIG. 3D may be considered to be essentially the same elements as their counterparts in FIG. 3D. It should be understood that implementations including an insulating layer such as 411 need not employ the stack construction depicted in FIG. 4A. For example, various implementations do not include a distinct ion conducting layer 108 as shown. Alternatives to use of a distinct ion conducting layer are described in U.S. patent application Ser. Nos. 12/772,055, 12/814,279, and 13/462,725, previously incorporated by reference.

In some implementations, the counter electrode layer 110 is lithiated immediately before the insulating layer 411 is formed. One example of a fabrication procedure for forming the structure of FIG. 4A is presented in FIG. 5B.

Electrochromic layer 106 may contain any one or more of a number of different electrochromic materials, including metal oxides. Examples of such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. In some embodiments, the metal oxide is doped with one or more dopants such as lithium, sodium, potassium, molybdenum, vanadium, titanium, and/or other suitable metals or compounds containing metals. Mixed oxides (e.g., W—Mo oxide, W—V oxide) are also used in certain embodiments.

In some embodiments, tungsten oxide or doped tungsten oxide is used for electrochromic layer 106. In one embodiment of the invention, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is WOx, where x is between about 2.7 and about 2.9.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM).

The thickness of first electrochromic layer 106 depends on the electrochromic material selected for the electrochromic layer. In some embodiments, the electrochromic layer 106 is about 50 nm to 2,000 nm, or about 200 nm to 700 nm. In some embodiments, the electrochromic layer is about 300 nm to about 500 nm. The thickness of the electrochromic layer 106 is also substantially uniform. In one embodiment, a substantially uniform electrochromic layer varies only about ±10% in each of the aforementioned thickness ranges. In another embodiment, a substantially uniform electrochromic layer varies only about ±5% in each of the aforementioned thickness ranges. In another embodiment, a substantially uniform electrochromic layer varies only about ±3% in each of the aforementioned thickness ranges.

While not shown in FIG. 4A, the electrochromic and/or counter electrode layers may be deposited in two sub-layers. In one embodiment, the electrochromic layer is divided into two sub-layers, one having a nominal oxygen concentration and the other having an oxygen-rich concentration. For example, the sub-layer closer to transparent conductive layer 104 contains tungsten oxide having nominal oxygen concentration and the sub-layer closer to the counter electrode contains a more oxygen rich form of tungsten oxide. Such electrochromic layer designs are described in U.S. patent application Ser. No. 12/814,279, previously incorporated by reference.

Referring again to FIG. 4A, in electrochromic stack, an ion conducting layer 108 overlays first electrochromic layer 106. On top of ion conducting layer 108 is counter electrode layer 110. The counter electrode layer 110 may be implemented as a second electrochromic layer. In some embodiments, counter electrode layer 110 is inorganic and/or solid. The counter electrode layer may comprise one or more of a number of different materials that are capable of serving as reservoirs of ions when the electrochromic device is in the bleached state. Thus, the counter electrode layer serves not only as an ion storage layer, but also as a complimentary coloring layer.

In some embodiments, suitable materials for the counter electrode complementary to $WO_3$ include nickel oxide (NiO), nickel tungsten oxide (NiWO), nickel vanadium oxide, nickel chromium oxide, nickel aluminum oxide, nickel manganese oxide, nickel magnesium oxide, nickel tantalum oxide, chromium oxide ($Cr_2O_3$), manganese oxide ($MnO_2$), Prussian blue. Optically passive counter electrodes comprise cerium titanium oxide ($CeO_2$—$TiO_2$), cerium zirconium oxide ($CeO_2$—$ZrO_2$), nickel oxide (NiO), nickel-tungsten oxide (NiWO), vanadium oxide ($V_2O_5$), and mixtures of oxides (e.g., a mixture of $Ni_2O_3$ and $WO_3$). Doped formulations of these oxides may also be used, with dopants including, e.g., tantalum and tungsten. Because counter electrode layer 110 contains the ions used to produce the electrochromic phenomenon in the electrochromic material when the electrochromic material is in the bleached state, the counter electrode preferably has high transmittance and a neutral color when it holds significant quantities of these ions.

In some embodiments, nickel-tungsten oxide (NiWO) is used in the counter electrode layer (second electrochromic layer). In certain embodiments, the amount of nickel present in the nickel-tungsten oxide can be up to about 90% by weight of the nickel-tungsten oxide. In a specific embodiment, the mass ratio of nickel to tungsten in the nickel-tungsten oxide is between about 4:6 and 6:4 (e.g., about 1:1). In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O.

The counter electrode morphology may be crystalline, nanocrystalline, or amorphous. In some embodiments, where the counter electrode layer is nickel-tungsten oxide, the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained through the use of certain processing conditions, described below.

In some embodiments, the thickness of the counter electrode is about 50 nm about 650 nm. In some embodiments, the thickness of the counter electrode is about 100 nm to about 400 nm, preferably in the range of about 200 nm to 300 nm. The thickness of the counter electrode layer 110 is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

In between electrochromic layer 106 and counter electrode layer 110, there is an ion conducting layer 108. Ion conducting layer 108 serves as a medium through which ions are transported, in the manner of an electrolyte. That is, when the electrochromic device transforms between the bleached state and the colored state, ions pass through the ion conducting layer. Typically, ion conducting layer 108 is highly conductive to the relevant ions for the electrochromic and the counter electrode layers, but has sufficiently low electron conductivity that negligible electron transfer takes place during normal operation. A thin ion conducting layer with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about $10^{-6}$ Siemens/cm or ohm$^{-1}$ cm$^{-1}$ and about $10^{-9}$ Siemens/cm or ohm$^{-1}$ cm$^{-1}$ and an electronic resistivity between $5 \times 10^{10}$ and $10^{14}$ ohms-cm.

Examples of suitable ion conducting layers include silicates, silicon oxides, tungsten oxides, tantalum oxides, niobium oxides, and borates. The silicon oxides include silicon-aluminum-oxide. The tungsten oxides include tungstates. These materials may be doped with different dopants, including lithium. Lithium doped silicon oxides include lithium silicon-aluminum-oxide. In some embodiments, the ion conducting layer comprises a silicate-based structure. In other embodiments, suitable ion conductors particularly adapted for lithium ion transport include, but are not limited to, lithium silicate, lithium aluminum silicate, lithium aluminum borate, lithium aluminum fluoride, lithium borate, lithium nitride, lithium zirconium silicate, lithium niobate, lithium tungstate, lithium borosilicate, lithium phosphosilicate, and other such lithium-based ceramic materials, silicas, or silicon oxides, including lithium silicon-oxide. Any material, however, may be used for the ion conducting layer 108 provided it can be fabricated with low defectivity and it allows for the passage of ions between the counter electrode layer 110 to the electrochromic layer 106 while substantially preventing the passage of electrons.

As mentioned, various embodiments do not include a distinct or deposited ion conducting layer 108 as shown. In some cases, a transition region or interfacial region forms between electrochromic and counter electrode layers deposited in direct contact with one another. Such region may be formed in situ—without depositing a separate ion conducting material layer—and possess certain characteristics of a conventional ion conducting layer as described above.

In certain embodiments, one or both of the conductive layers 104 and 112 is inorganic and/or solid. Conductive layers 104 and 112 may be made from a number of different materials, including conductive oxides, thin metallic coatings, conductive metal nitrides, and composite conductors. Typically, conductive layers 104 and 112 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. Since oxides are often used for these layers, they are sometimes referred to as "transparent conductive oxide" (TCO) layers. Thin metallic coatings that are substantially transparent may also be used. Examples of metals used for such thin metallic coatings include transition metals including gold, platinum, silver, aluminum, nickel alloy, and the like. Thin metallic coatings based on silver, well known in the glazing industry, are also used. Examples of nitrides that are conductive in some configurations include titanium nitrides, tantalum nitrides, titanium oxynitrides, and tantalum oxynitrides. The conductive layers 104 and 112 may also be composite conductors. Such composite conductors may be fabricated by placing highly conductive ceramic and metal wires or conductive layer patterns on one of the faces of the substrate and then over-coating with transparent conductive materials such as doped tin oxides or indium tin oxide. Ideally, such wires should be thin enough as to be invisible to the naked eye (e.g., about 100 μm or thinner).

The function of the conductive layers is to spread an electric potential provided by voltage source 116 over surfaces of the electrochromic stack to interior regions of the stack, with very little ohmic potential drop. The electric potential is transferred to the conductive layers though electrical connections to the conductive layers. In some embodiments, bus bars, one in contact with conductive layer 104 and one in contact with conductive layer 112, provide the electric connection between the voltage source 116 and the conductive layers 104 and 112. The conductive layers 104 and 112 may also be connected to the voltage source 116 with other conventional means.

In some embodiments, the thickness of conductive layers 104 and 112 is between about 5 nm and about 10,000 nm. In some embodiments, the thickness of conductive layers 104 and 112 are between about 10 nm and about 1,000 nm. In other embodiments, the thickness of conductive layers 104 and 112 are between about 10 nm and about 500 nm. In some embodiments where TEC Glass™ is used for substrate 102 and conductive layer 104, the conductive layer is about 400 nm thick. In some embodiments where indium tin oxide is used for conductive layer 112, the conductive layer is about 100 nm to 400 nm thick (280 nm in one embodiment). More generally, thicker layers of the conductive material may be employed so long as they provide the necessary electrical properties (e.g., conductivity) and optical properties (e.g., transmittance). Generally, the conductive layers 104 and 112 are as thin as possible to increase transparency and to reduce cost. In some embodiment, conductive layers are substantially crystalline. In some embodiment, conductive layers are crystalline with a high fraction of large equiaxed grains The thickness of the each conductive layer 104 and 112 is also substantially uniform. Smooth layers (i.e., low roughness, Ra) of the conductive layer 104 are desirable so that other layers of the electrochromic stack are more compliant.

In one embodiment, a substantially uniform conductive layer varies by no more than about ±10% in each of the aforementioned thickness ranges. In another embodiment, a substantially uniform conductive layer varies by no more than about ±5% in each of the aforementioned thickness ranges. In another embodiment, a substantially uniform conductive layer varies by no more than about ±2% in each of the aforementioned thickness ranges.

The sheet resistance ($R_s$) of the conductive layers may also be important because of the relatively large area spanned by the layers. In some embodiments, the sheet resistance of conductive layers 104 and 112 is about 5 to 30 Ohms per square. In some embodiments, the sheet resistance of conductive layers 104 and 112 is about 12 Ohms per square. In general, it is desirable that the sheet resistance of each of the two conductive layers be about the same. In one embodiment, the two layers each have a sheet resistance of about 10-15 Ohms per square.

Figure 4B:
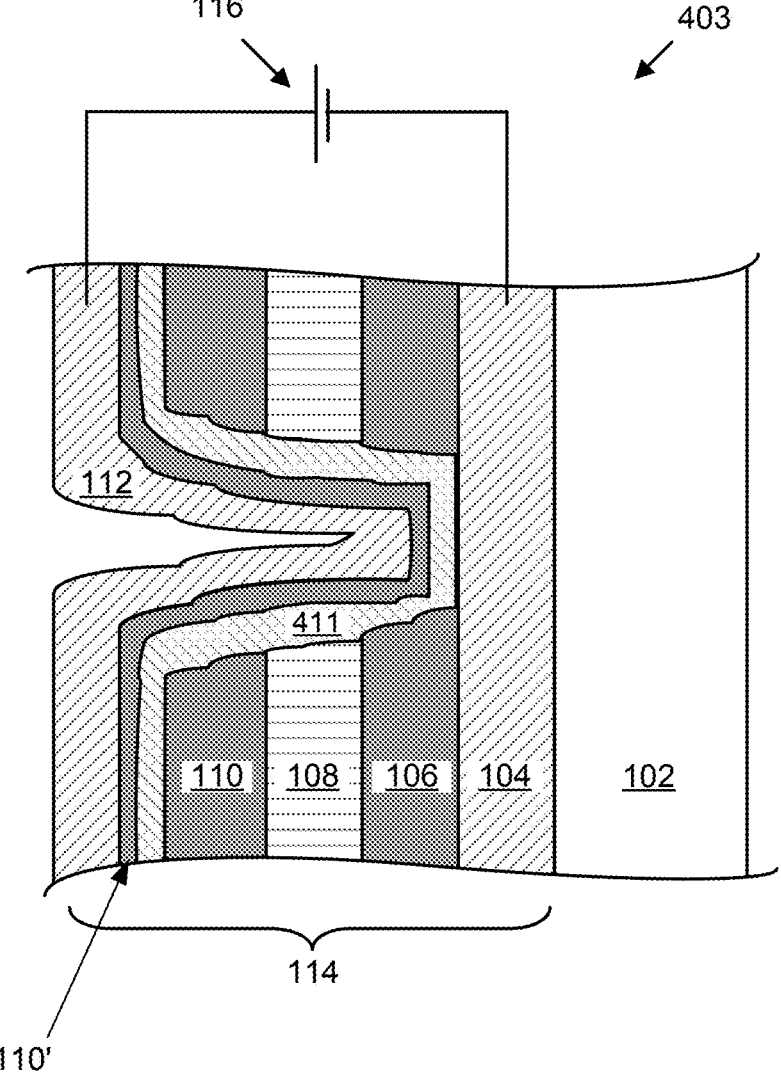
FIG. 4B depicts an electrochromic device in which an insulating layer is disposed between two portions of a counter electrode layer (or alternatively between two portions of an electrochromic layer, if the electrochromic layer is formed on top of the counter electrode layer).

In certain embodiments, the later formed of the counter electrode layer and the electrochromic layer is formed in two operations separated by a lithiation operation. After the first portion is deposited and then lithiated, the insulating layer 411 is deposited. Then the second portion of the counter electrode (or electrochromic layer) is deposited. FIG. 4B depicts such an embodiment employing an insulating layer to protect against short circuits resulting from particle ejections. In this example, an electrochromic device 403 includes a stack having a first transparent conductive layer 104, an electrochromic layer 106, an optional ion conducting layer 108, a counter electrode layer 110 and a second transparent conductive layer 112, all as described above. Additionally, the device stack includes a defect-mitigating insulating layer 411 disposed within the counter electrode layer. As a result, the counter electrode layer is divided into an inner portion 110 and an outer portion 110', separated from one another by layer 411. In an alternate embodiment, the positions of the electrochromic layer and the counter electrode layer are reversed, so that the electrochromic layer is split by insulating layer 411 and includes an outer portion 106' in contact with the second conductive layer 112. Typically, though not necessarily, the two portions of the counter electrode layer (or counter electrode layer) are compositionally and/or morphologically alike.

Figure 4C:
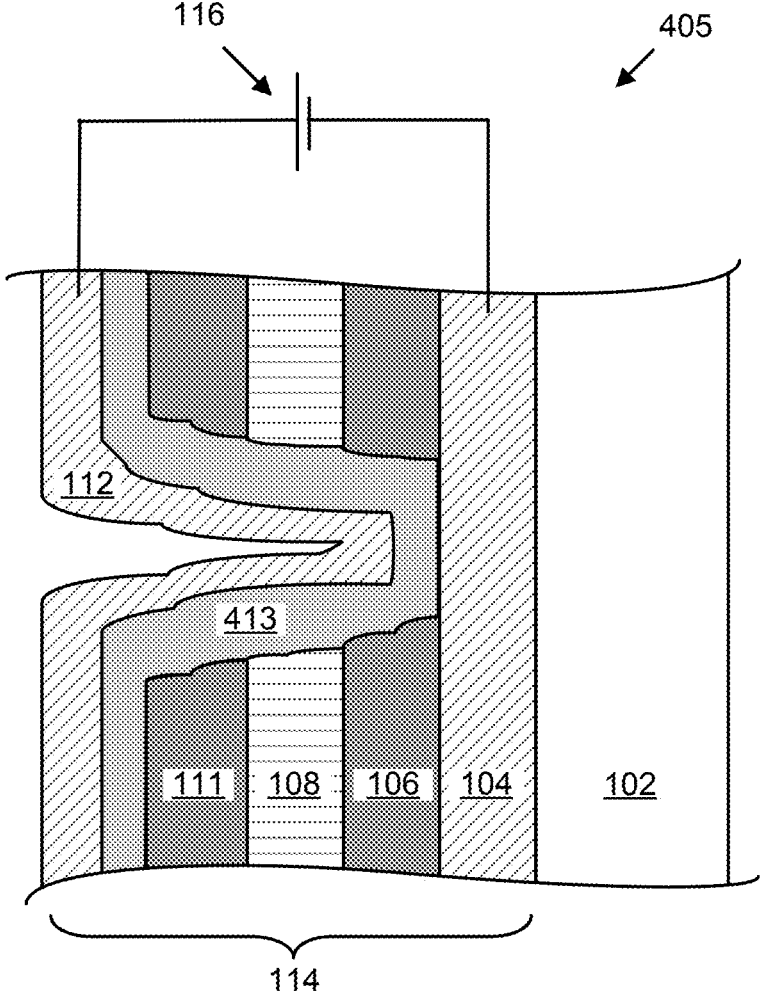
FIG. 4C depicts an electrochromic device in which a defect-mitigating insulating layer is disposed between a second (e.g., upper) transparent conductive layer and the later formed of the counter electrode layer and the electrochromic layer, and where the insulating layer is a modified form (more electronically resistive) of the counter electrode layer (or electrochromic layer).

FIG. 4C illustrates an embodiment in which a portion 413 of the counter electrode serves as an insulating layer. Portion 413 is similar in composition to the main counter electrode portion 111 but may be more insulating, so much so that is can prevent a short between transparent conductive layers 104 and 112 when it is the only layer between them, as shown in the FIG. 4C. Typically, it is at least as insulating as portion 111. In some implementations, portion is 413 does not have electrochromic properties, while portion 111 does.

As an example, portions 111 and 413 are both nickel tungsten oxide materials, but portion 413 has a relatively lower ratio of nickel to tungsten and/or is deposited under different conditions. In various embodiments, the main portion 111 of the counter electrode layer is deposited and then lithiated. Thereafter, the second portion 413 of the counter electrode layer is deposited. In some implementations, first portion 111 has a thickness of between about 200 and 500 nm or between 250 and 350 nm (e.g., about 280 nm). In some implementations, second portion 413 has a thickness of about 5-30 nm or about 5-20 nm (e.g., about 10 nm).

There are many possible implementations of a two portion electrochromic layer in which one portion serves as a defect-mitigating insulating layer. In many implementations, the electrochromic material serving as an insulating layer remains insulating with charge insertion (e.g., lithium ion or hydrogen ion insertion). In many embodiments, the defect mitigating insulating layer is ionically conductive and accepts and expels ions as the electrochromic device cycles between optical states. Tungsten oxide is an example of an electrochromic material that becomes ionically conductive in certain states of charge. Specifically, tungsten oxide becomes more ionically conductive with increasing concentrations of lithium ions, increasing in conductivity by orders of magnitude when significant concentrations of lithium ions are inserted. For this reason, tungsten oxide may not serve as an effective defect-mitigation insulating layer material. By contrast, nickel tungsten oxide remains ionically insulating when lithium ions are inserted and expelled. Therefore, nickel tungsten oxide can serve as both an electrochromic layer material and a defect-mitigating insulating layer as discussed in the context of FIG. 4C.

In some implementations, the electrochromic layer and the counter electrode layer may be switched in the deposition sequence. In some implementations, for example, the counter electrode is deposited first and then the electrochromic layer is deposited in portions, with a first portion being more electronically conductive than a second portion. A lithiation step may be performed between depositions of the two portions of the electrochromic layer. As in the embodiments presented above, the ion conducting layer may be dispensed with in some design stacks.

In some implementations, the first electrochromic layer 106 contains tungsten oxide in two sub-layers, each sub-stantially composed of $WO_x$. The sub-layer contacting transparent conducting layer 104 has a value of x that is approximately 2.7-2.8, and the other sub-layer has a value of x that is approximately 2.85 to 3.5. The counter electrode layer 110 contains electrochromic nickel tungsten oxide having a thickness of about 50 to 300 nm. The insulating layer 413 also contains nickel tungsten oxide but has different properties as discussed elsewhere herein. In the implementation described here, it has a thickness of about 5 to 100 nm. The second transparent conductive oxide may be indium tin oxide having a thickness of about 200 to 450 nm. The device does not have a separately deposited ion conducting layer between the electrochromic layer 106 and the counter electrode layer 111.

Figure 4D:
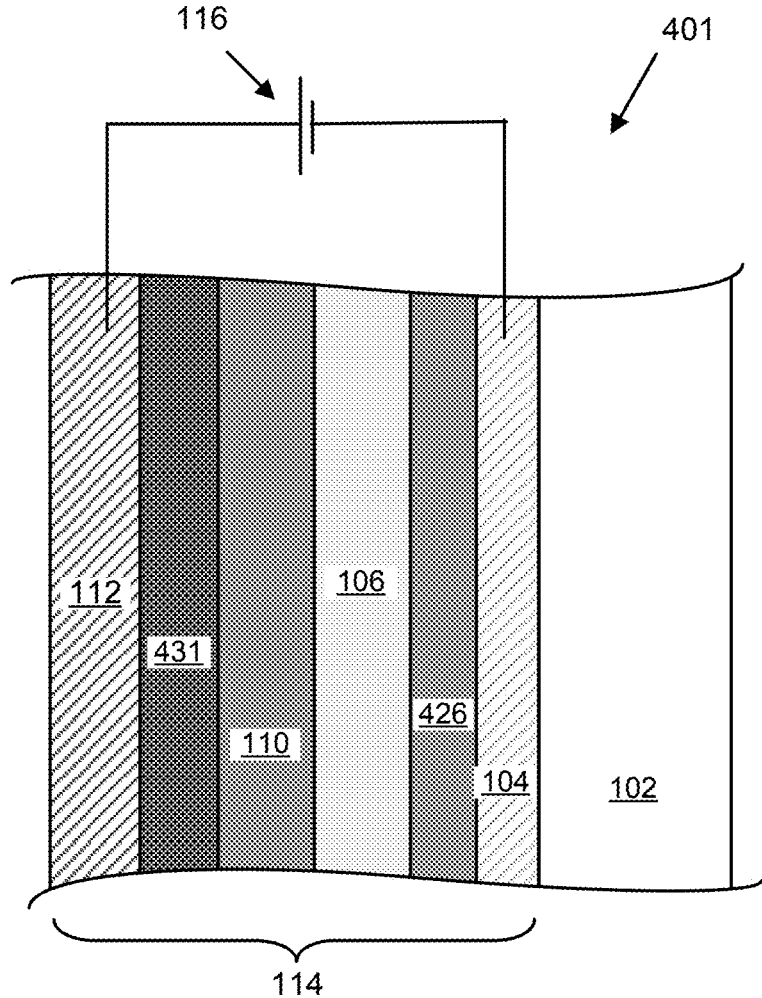
FIG. 4D depicts an electrochromic device having two defect-mitigating insulating layers and no ion conducting layer deposited between the electrochromic and counter electrode layers.

In some embodiments, two separate defect-mitigating insulating layers are provided in the electrochromic device. In one example, both the insulating layers are disposed between the transparent conductive layers. See first and second conductive layers 104 and 112 in FIG. 4D. In one embodiment, a first insulating layer is disposed in contact with first transparent conductive layer 104. In one embodiment, a second insulating layer is disposed in contact with second conductive layer 112. In the embodiment of FIG. 4D, a first insulating layer 426 is disposed in contact with first transparent conductive layer 104 and a second insulating layer 431 is disposed in contact with second transparent conductive layer 112. In the device of FIG. 4D, there is no IC layer (e.g., no IC layer 108) disposed between the electrochromic layer (layer 106) and the counter electrode layer (layer 110). In the depicted embodiment, the stack is fabricated on a substrate 102. It includes first conductive layer 104 in direct or indirect contact with substrate 102, first insulating layer 426 in contact with layer 104, electrochromic layer 106 in contact with layer 426, counter electrode layer 110 in contact with layer 106, second insulating layer 431 in contact with layer 110, and second transparent conductive layer 112 (e.g., indium tin oxide). In some embodiments, first transparent conductive layer 104 is a fluorinated tin oxide layer such at TEC.

In certain embodiments, first insulating layer 426 is or contains tin oxide, silicon oxide, nickel tungsten oxide, cerium oxide, aluminum oxide, tantalum oxide, silicon aluminum oxide, and/or titanium oxide. In certain embodiments, first insulating layer 426 is or contains a metal nitride such as titanium nitride, aluminum nitride, silicon nitride, tantalum nitride, or tungsten nitride. In some cases, first insulating layer is or contains titanium dioxide. Carbide, oxynitride, and oxycarbide analogs may also be used. In certain embodiments, first insulating layer 426 is or contains a tin oxide layer or titanium oxide, an alumina (aluminum oxide) layer, or layer containing both tin/titanium oxide and alumina. In some embodiments, first insulating layer 426 contains a layer of primary insulating material with voids or gaps therein. Occupying these voids or gaps is another insulating material such a alumina or other material found in a polishing compound. In certain embodiments, the second insulating layer 431 has a composition similar to that of counter electrode layer 110, but slightly different in order impart greater resistivity.

In one example, the structure of FIG. 4D includes a layer of titanium dioxide as a first insulating layer 426 and a layer of non-conductive nickel tungsten oxide as second insulating layer 431. Suitable examples of nickel tungsten oxide as a defect mitigating insulating layer are described elsewhere herein.

In some cases, glass is provided containing substrate 102, first transparent conductive layer 104 and first insulating layer 426. Such products may include TEC (fluorinated tin oxide) layer 104 and titanium dioxide or tin oxide as layer 426. Examples of such products include Eclipse Advantage™ products from Pilkington. In some cases, the thickness of the defect-mitigating insulating layer is about 10-100 nm thick, or about 15-50 nm thick, or about 20-40 nm thick. A product with high quality conductive layers (and optionally a defect-insulating layer) such as the TQ product from Pilkington may be used. In this context, high quality layers have relative few defects, relatively continuous layers, and/or relatively low roughness in comparison to other products. In one implementation, a substrate containing a transparent conductive layer and a defect-mitigating insulating layer is provided as is, without polishing, prior to depositing layer 106. In other implementations, the substrate, including layer 426, is polished prior to fabricating the remainder of the electrochromic device.

Figure 4E:
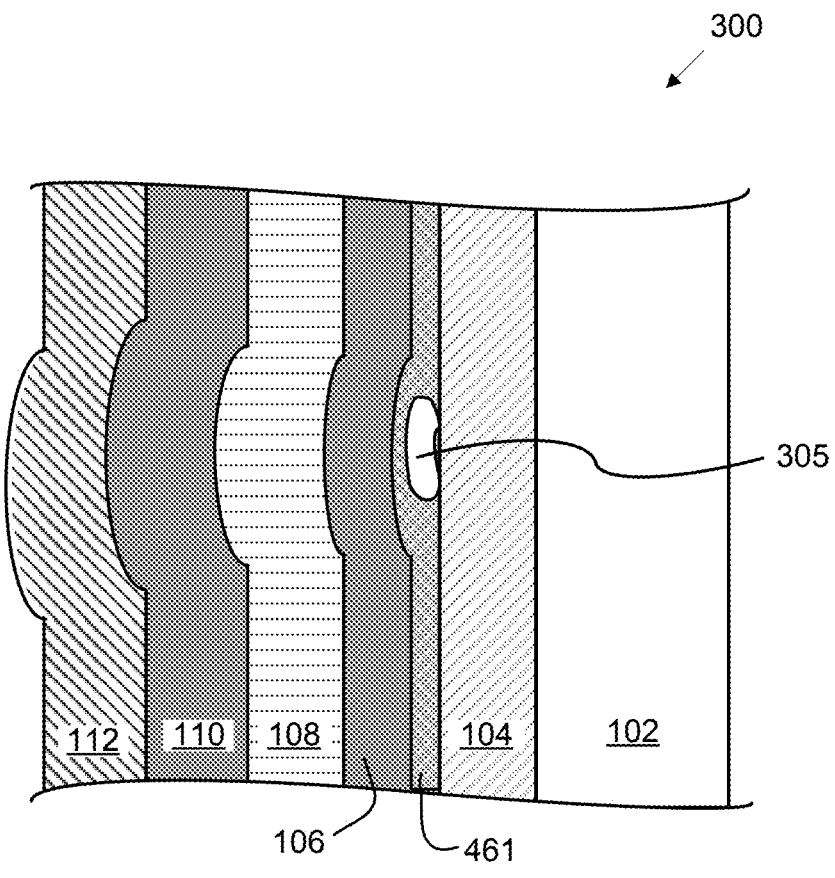
FIG. 4E depicts an electrochromic device in which a defect-mitigating insulating layer encapsulates a particle.

In certain embodiments, the defect-mitigating layer serves to encapsulate and promote adhesion of particles that could be ejected as some point. As shown in FIG. 4E, for example, a defect-mitigating layer 461 conformally encapsulates a particle 305. In certain embodiments, the thickness of the defect-mitigating layer is a substantial fraction of the size of the average defect-causing particle. For example, a defect mitigating layer that serves to encapsulate particles may be at least about 500 nm thick. In some embodiments, an encapsulating layer does not need to be insulating, and it may be preferable to have it matched to the properties of the layer it adjoins. Further, if the encapsulating layer is between or within counter electrode and/or electrochromic layers, then the encapsulating layer should permit lithium ion transport and be of a low enough electrical resistance to not prevent electrical transport to compensate for lithium transport. In certain embodiments, the encapsulating layer is a material identified herein as an electrochromic or counter electrode material.

Figure 4F:
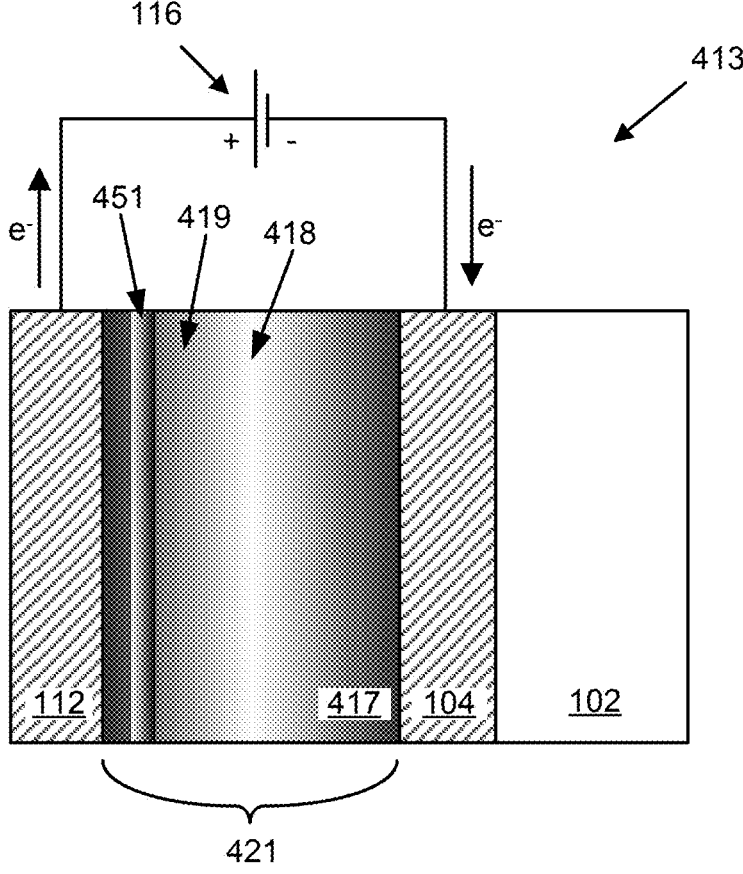
FIG. 4F depicts a graded electrochromic device having a defect-mitigating layer embedded therein.

The description of FIGS. 4A-4E pertains to electrochromic devices having at least two distinct layers existing in the device stack. In certain embodiments, the electrochromic device contains only a single layer of graded composition that serves the function of an electrochromic device stack. FIG. 4F depicts one such graded element 421 which is part of an electrochromic device 413. The electrochromic element 421 is a single layer graded composition, having a cathodically coloring electrochromic region 417, an ion conducting region 418, and an anodically coloring counter electrode or second electrochromic region, 419. The electrochromic element 421 is sandwiched between two transparent conducting layers electrodes 104 and 112. Device fabrication in this example may include depositing transparent conductive layer 104 on substrate 102, depositing electrochromic element 421 on transparent conductive layer 104, followed by depositing transparent conductive 112 on electrochromic element 421. Thus, electrochromic device 413 has only three layers, electrochromic element 421 sandwiched between transparent conductive layers 104 and 112. The depicted embodiment also includes a defect-mitigating insulating region 451 located in the second electrochromic region 421. Region 451 serves the same purpose as the insulating layers 411 and 413 in FIGS. 4A-4C. Compositionally, region 451 may be similar to or identical to layers 411 and/or 413. It may also have a graded composition similar to that of other regions of element 421.

A graded electrochromic element may be viewed as a single layer electrochromic device stack having successive functional regions as opposed to distinct layers where there is an abrupt material change between layers and limited material mixing between successive layers. Rather, an electrochromic element has successive functional regions where there is significant material mixing between each successive functional region. Further details of a compositionally graded multi-functional electrochromic element, including fabrication details, are presented in U.S. patent application Ser. No. 13/462,725, previously incorporated herein by reference.

While FIGS. 4A-4E show substrate 102 in direct contact with first transparent conductive layer 104, this need not be the case. In any of the implementations described herein, these layers may be in direct or indirect contact. In some cases, glass substrates are provided with coatings or layers interposed between glass substrate 102 and first conductive layer 104. Such coatings may be included for purposes of improving thermal properties, transmissivity, blocking diffusion, or other optical properties, providing resistive heating, etc. In one example, at least two layers are interposed between substrate 102 and layer 104. Examples of such materials include silicon oxides and tin oxides. In some cases, the substrate includes a tin oxide layer on top of the main glass substrate, a silicon oxide layer on top of the tin oxide layer, and a fluorinated tin oxide layer on top of the silicon oxide layer.

As illustrated in FIGS. 4A-4E, the defect-mitigating layer(s) may be included in the electrochromic device stack at various positions. A number of device stack examples are presented below. Each is a variation on the following base stack in which the EC layer is optionally tungsten oxide (or a variant thereof) and the CE layer is nickel tungsten oxide (or a variant thereof):

Base Device Stack
  First TC layer
  Electrochromic layer
  Ion conducting layer (optional)
  Counter electrode layer
  Second TC layer
Stacks in which an Ion Conducting Layer is not Present
Option A
  First TC layer
  Insulating layer
  EC layer
  CE layer
  Second TC layer Option B
  First TC layer
  EC layer
  Insulating layer
  CE layer
  Second TC layer
Option C
  First TC layer
  EC layer
  CE layer
  Insulating layer
  Second TC layer
Option D
  First TC layer
  EC layer
  Partial CE layer
  Insulating layer
  Remainder of CE layer
  Second TC layer
Option E
  First TC layer
  EC layer
  Partial CE layer (electrochromic)
  Remainder of CE layer (non-electrochromic)
  Second TC layer
Option F
  First TC layer
  First insulating layer
  EC layer
  Second insulating layer
  CE layer
  Second TC layer
Option G
  First TC layer
  First insulating layer
  EC layer
  CE layer
  Second insulating layer
  Second TC layer
Option H
  First TC layer
  First insulating layer
  EC layer
  Partial CE layer
  Second insulating layer
  Remainder of CE layer
  Second TC layer
Option I
  First TC layer
  Insulating Layer
  EC layer
  Partial CE layer (electrochromic)
  Remainder of CE layer (non-electrochromic)
  Second TC layer
Stacks in which an Ion Conducting is Present
Option A
  First TC layer
  Insulating layer
  EC layer
  IC layer
  CE layer
  Second TC layer
Option B
  First TC layer
  EC layer
  Insulating layer
  IC layer
  CE layer
  Second TC layer Option C
  First TC layer
  EC layer
  IC layer
  Insulating layer
  CE layer
  Second TC layer Option D
  First TC layer
  EC layer
  Partial IC layer
  Insulating layer
  Remainder of IC layer
  CE layer
  Second TC layer Option E
  First TC layer
  EC layer
  IC layer
  Partial CE layer
  Insulating layer
  Remainder of CE layer
  Second TC layer Option F
  First TC layer EC layer IC layer Partial CE layer (electrochromic) Remainder of CE layer (non-electrochromic) Second TC layer Option G
  First TC layer
  Insulating layer
  EC layer
  Insulating layer
  IC layer
  CE layer
  Second TC layer Option H
  First TC layer
  Insulating layer
  EC layer
  IC layer
  Insulating layer
  CE layer
  Second TC layer Option I
  First TC layer
  Insulating layer
  EC layer
  Partial IC layer
  Insulating layer
  Remainder of IC layer
  CE layer
  Second TC layer Option J
  First TC layer
  Insulating layer
  EC layer
  IC layer
  Partial CE layer
  Insulating layer
  Remainder of CE layer
  Second TC layer Option K
  First TC layer
  Insulating layer
  EC layer
  IC layer
  Partial CE layer (electrochromic)
  Remainder of CE layer (non-electrochromic)
  Second TC layer While each of the above options show the electrochromic layer disposed closer to the first transparent conductive layer and the counter electrode layer disposed closer to the second transparent conductive layer, the order could be reversed in any of the options.

Figure 4G:
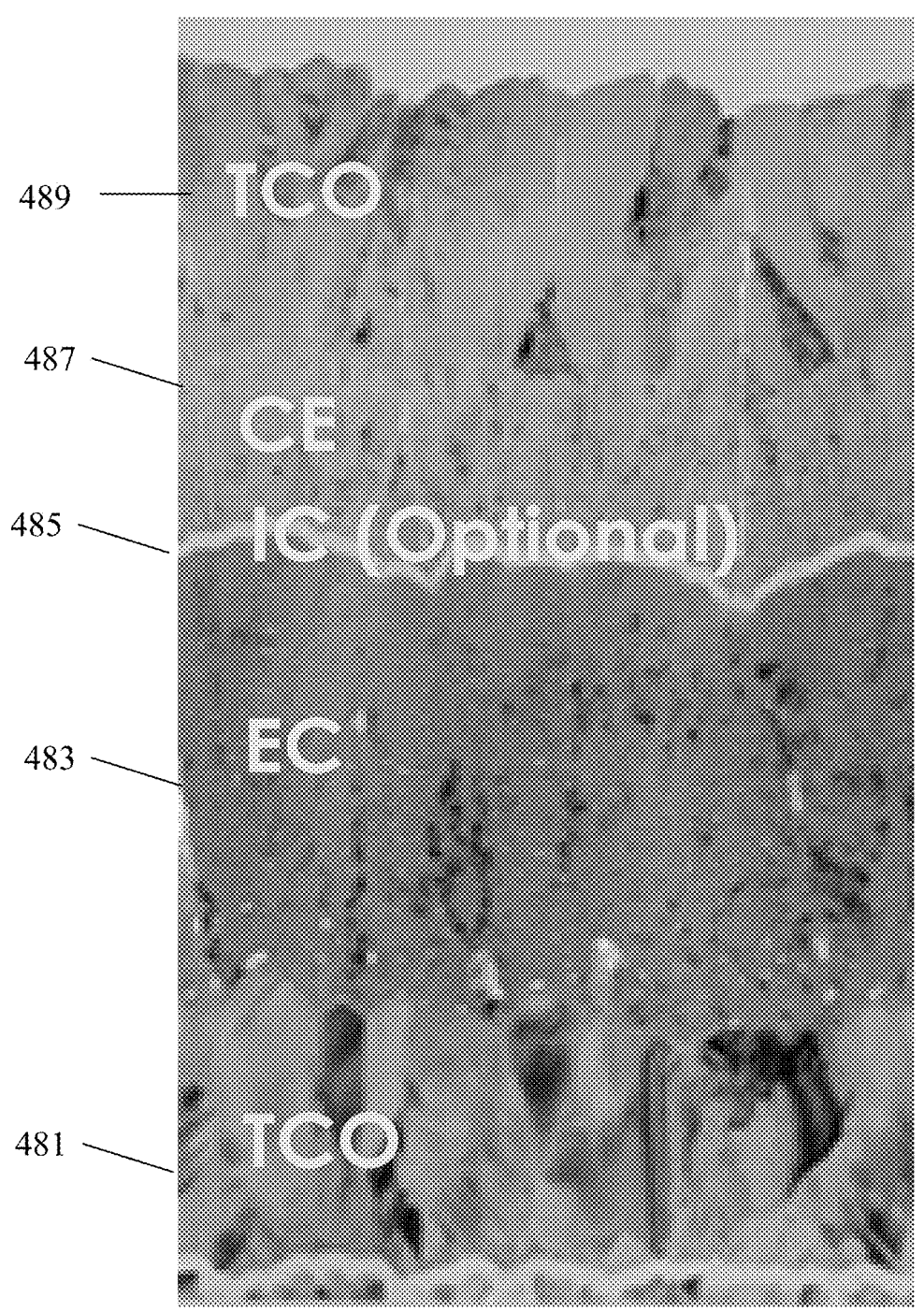
FIGS. 4G-4O are scanning electron micrographs of an electrochromic device illustrating different positions of a defect-mitigating insulating layer within a device stack.

FIG. 4G is a scanning electron micrograph of an electrochromic device having a first transparent conductor layer (TCO) 481 disposed on a substrate, an electrochromic layer 483 disposed on top of TCO 481, an optional ion conductor layer 485 disposed on the electrochromic layer, a counter electrode layer 487 disposed on the ion conductor layer, and a second transparent conductor layer (TCO) 489. FIG. 4G is presented as a baseline structure to show various positions of one or more defect-mitigating insulating layers as illustrated in FIGS. 4H-4O. FIGS. 4H through 4K show devices containing only a single defect-mitigating insulating layer and FIGS. 4L through 4O show devices containing two defect-mitigating insulating layers.

Figure 4H:
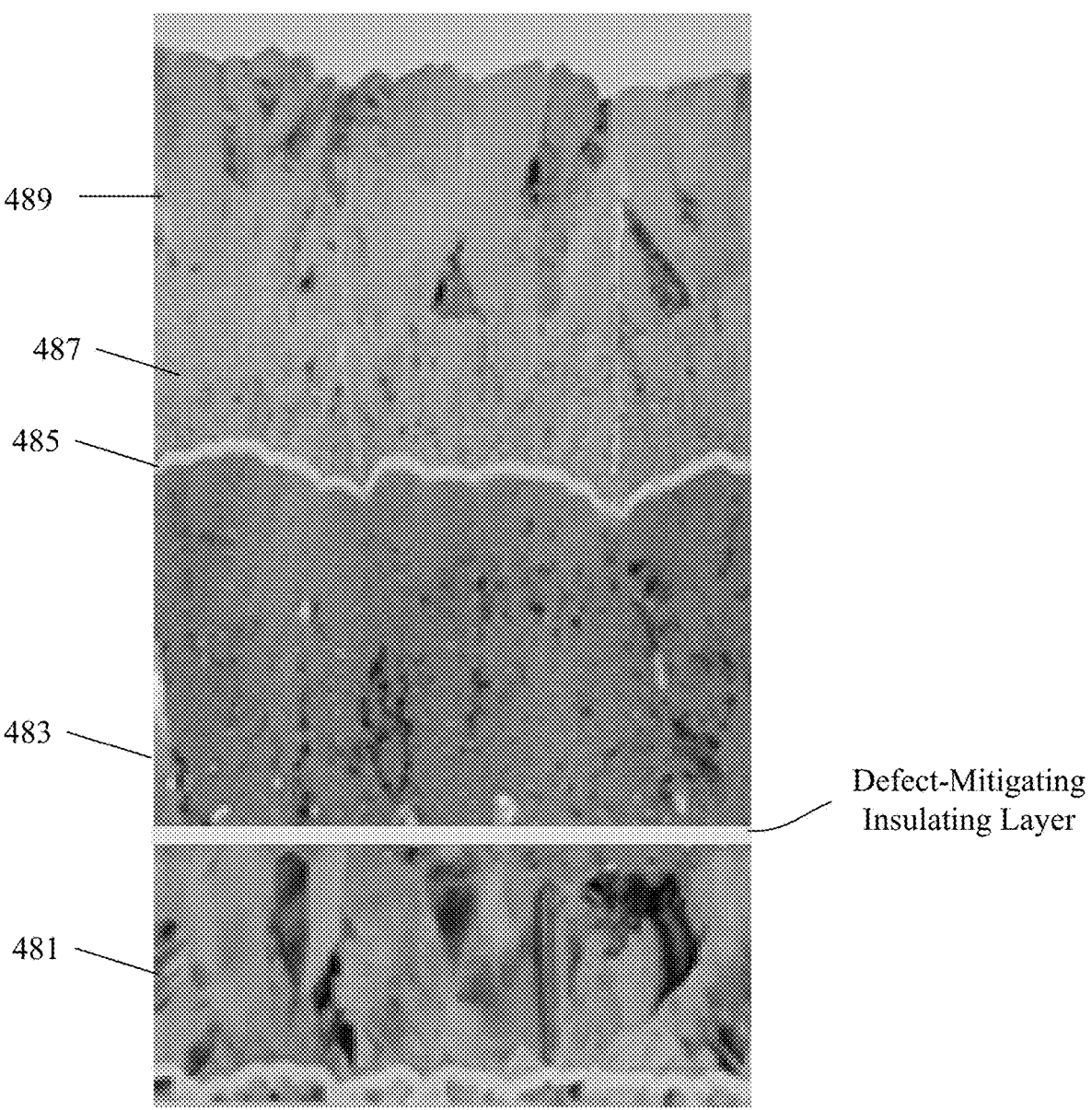
Figure 4I:
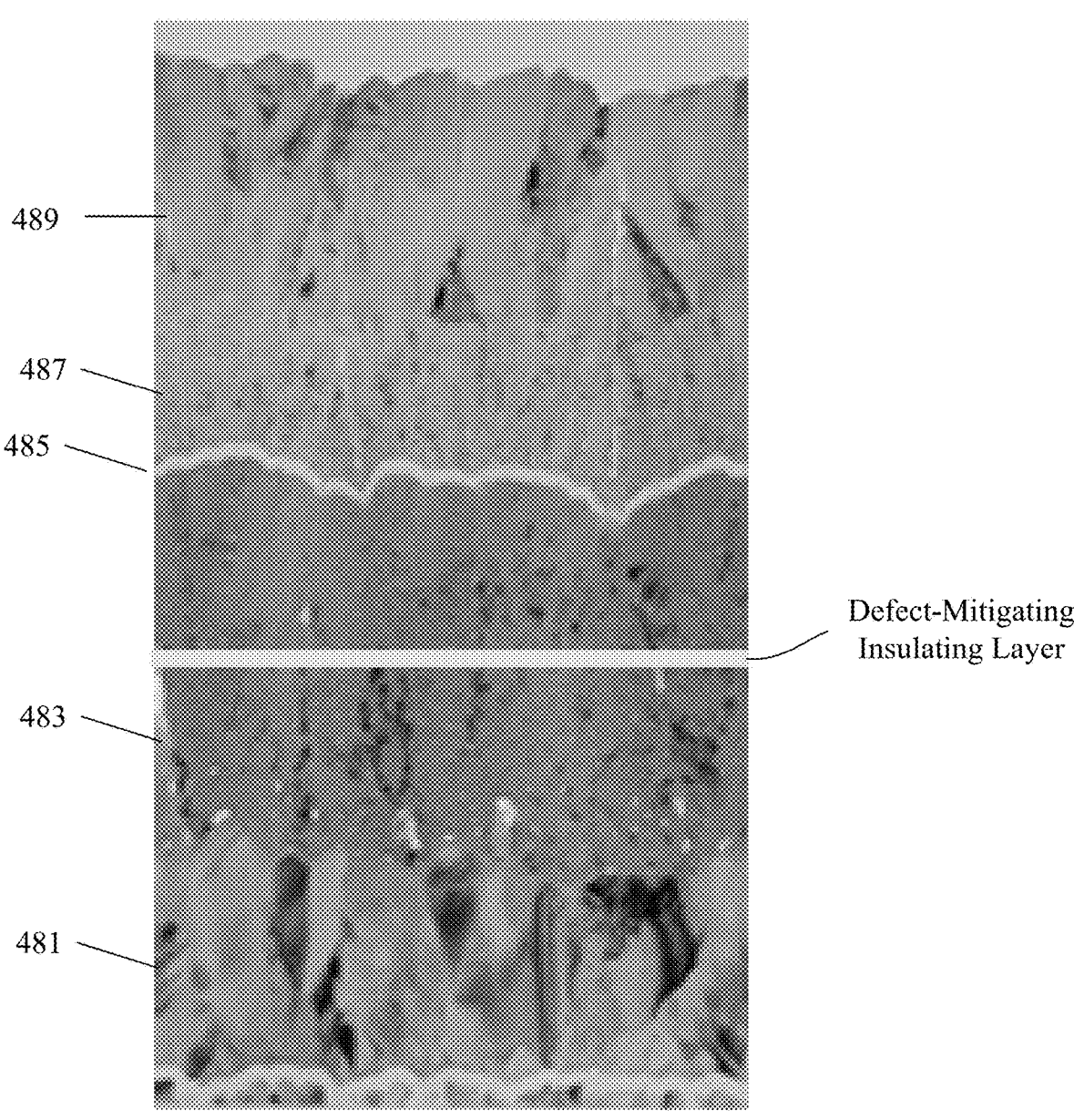
Figure 4J:
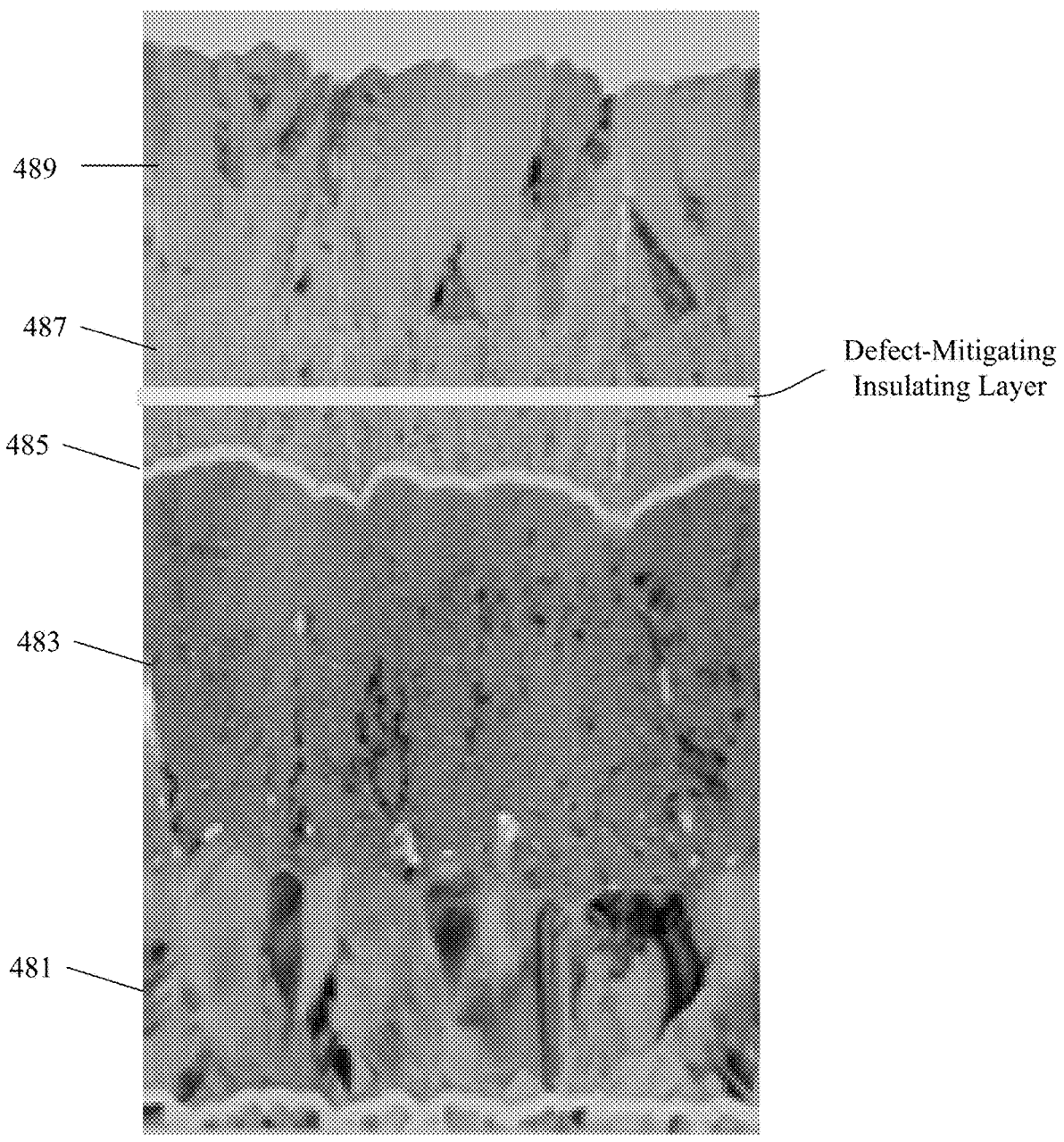
Figure 4K:
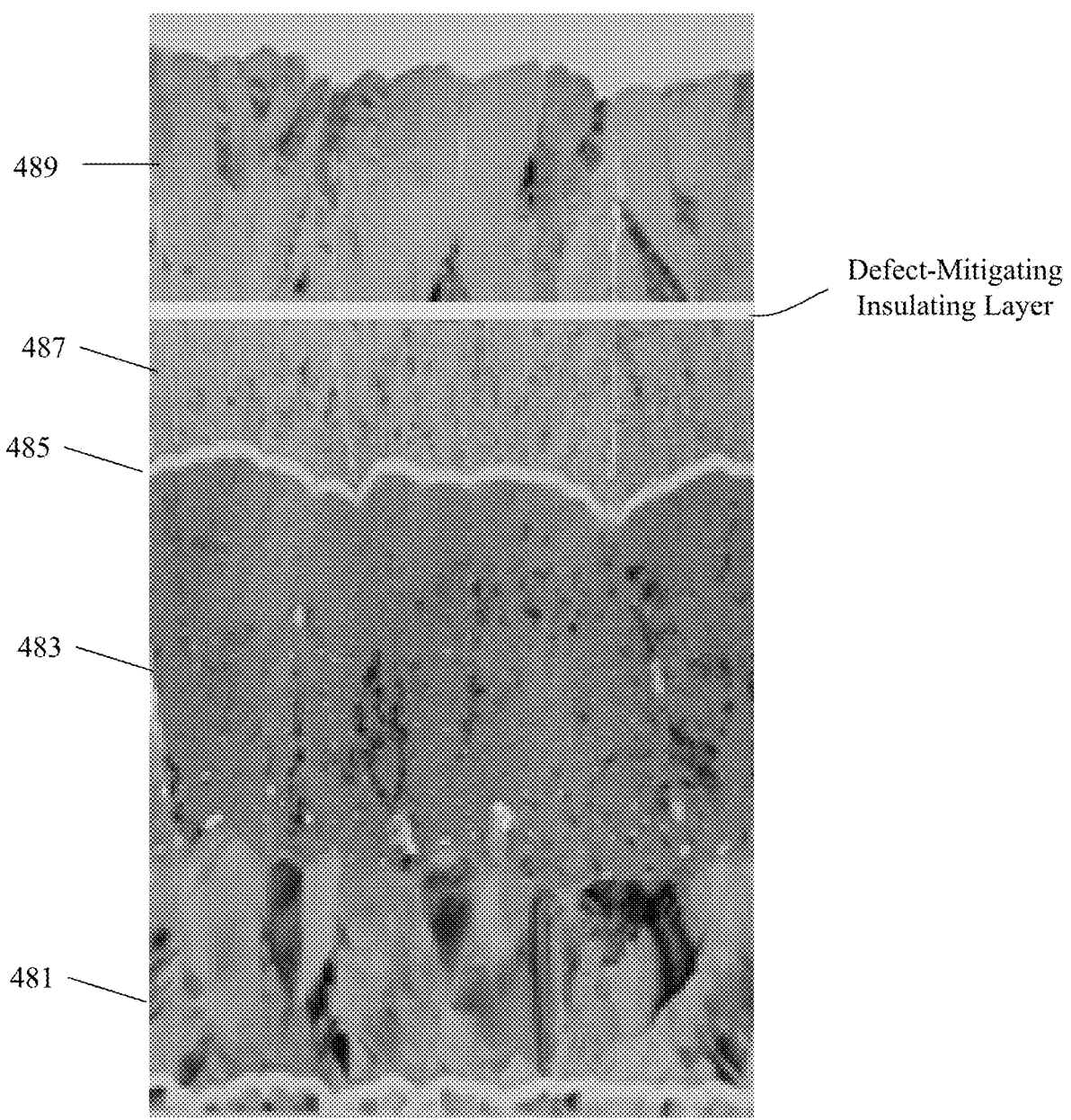

FIG. 4H shows a defect-mitigating insulating layer at a position between the first transparent conductive layer 481 and the electrochromic layer 483. FIG. 4I shows a defect-mitigating insulating layer at an intermediate position within electrochromic layer 483. FIG. 4J shows a defect-mitigating insulating layer at an intermediate position within counter electrode layer 487. FIG. 4K shows a defect-mitigating insulating layer at a position between the second transparent conductive layer 489 and the counter electrode layer 487.

Figure 4L:
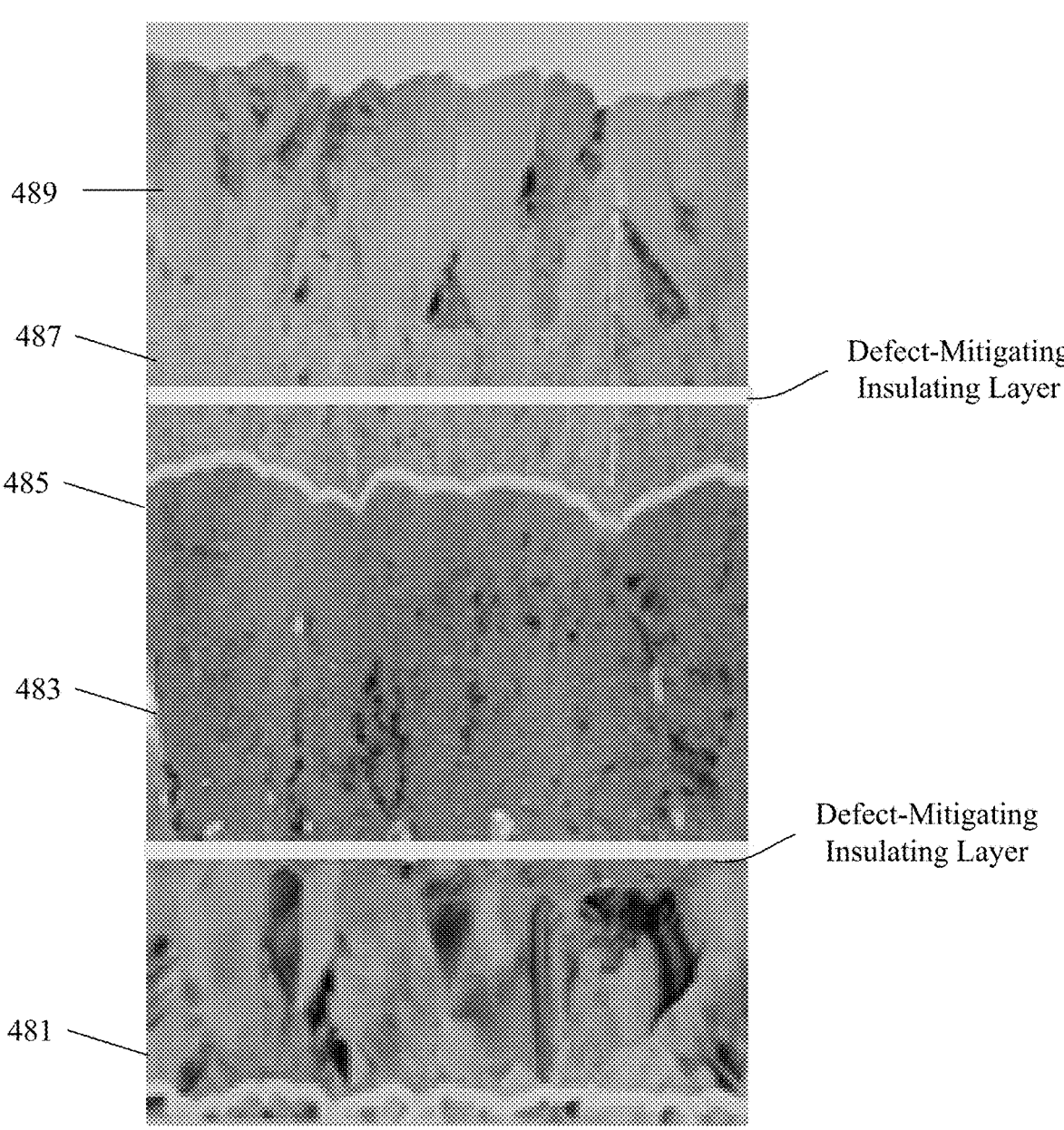
Figure 4M:
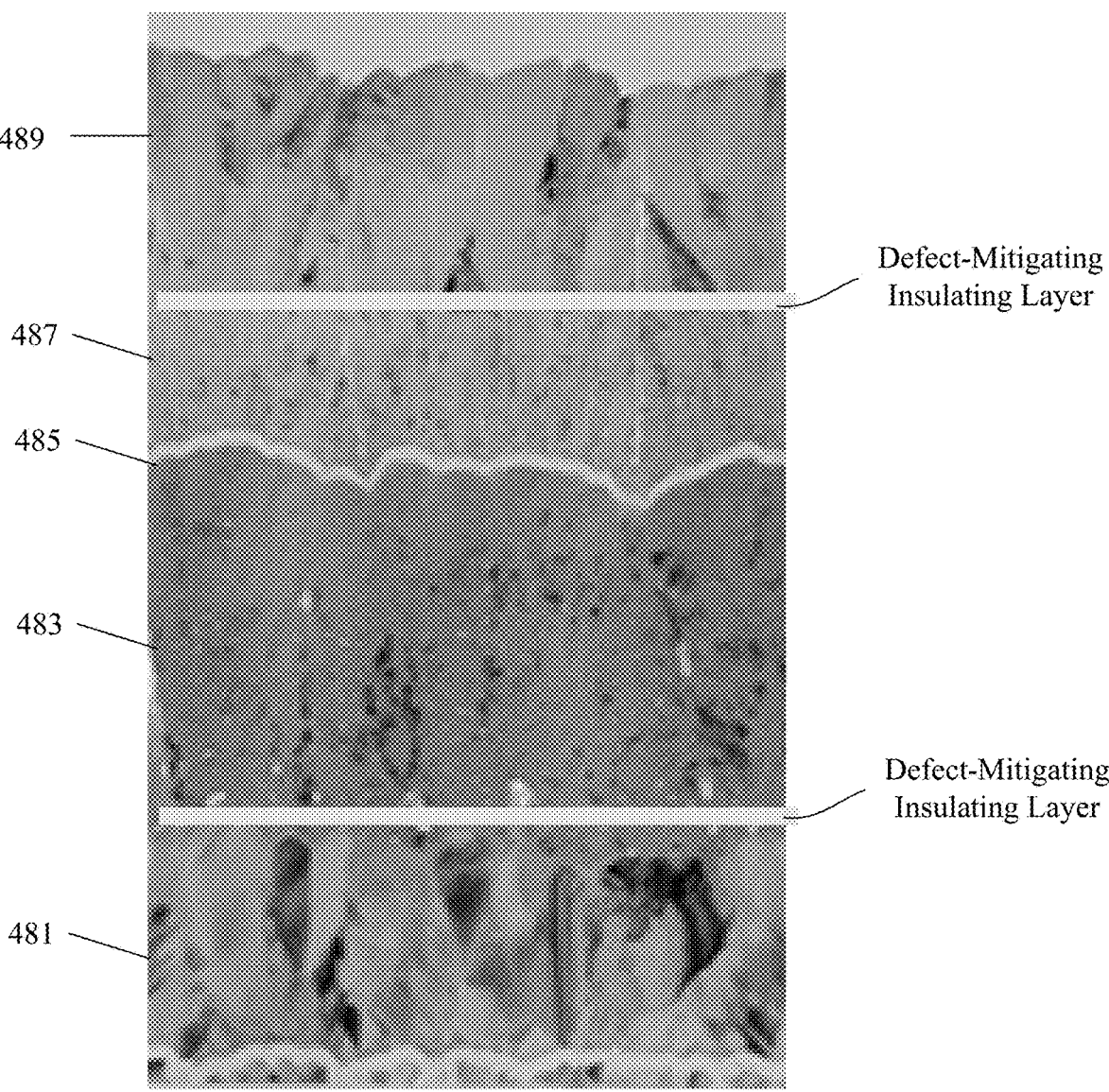
Figure 4N:
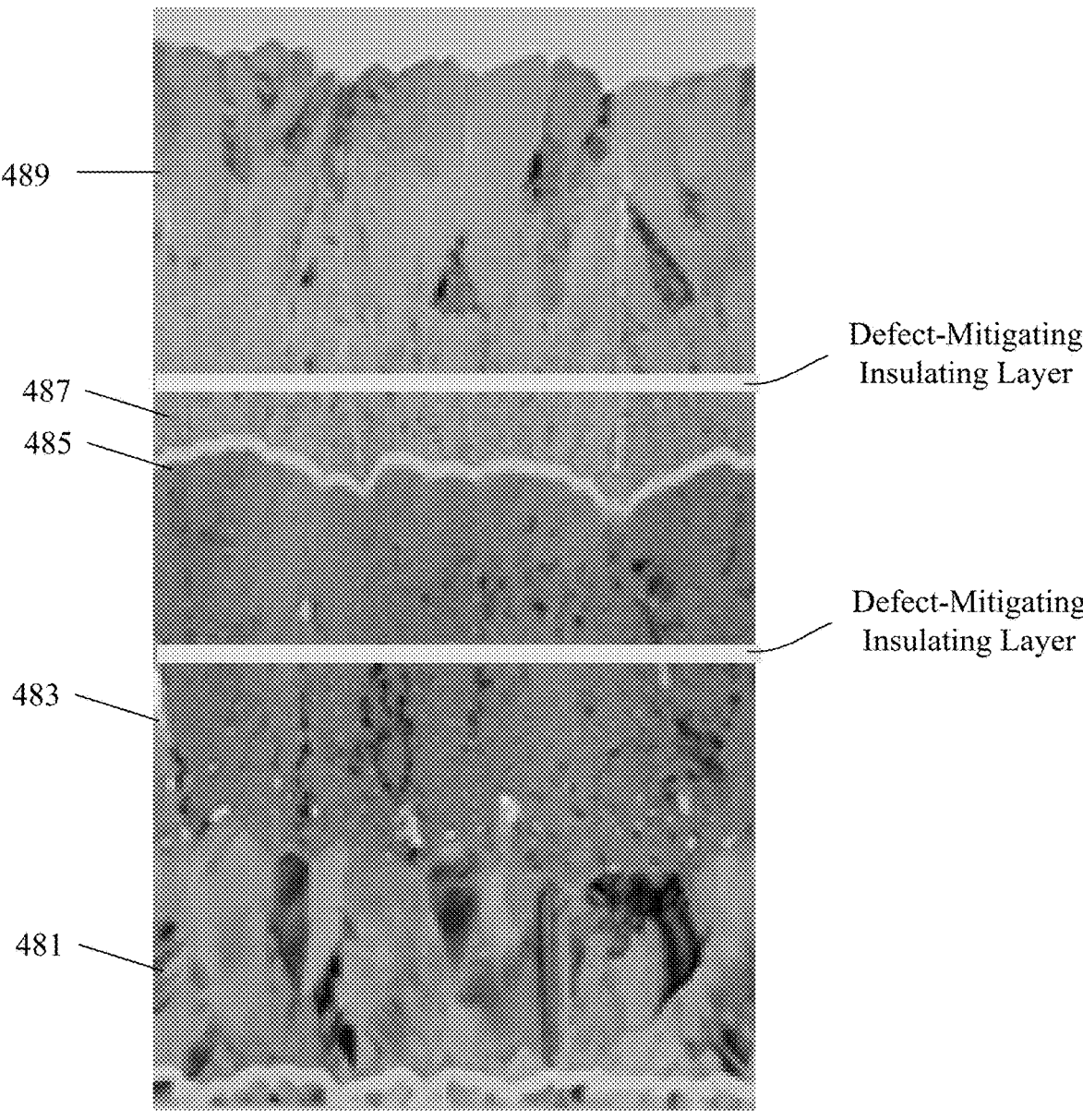
Figure 4O:
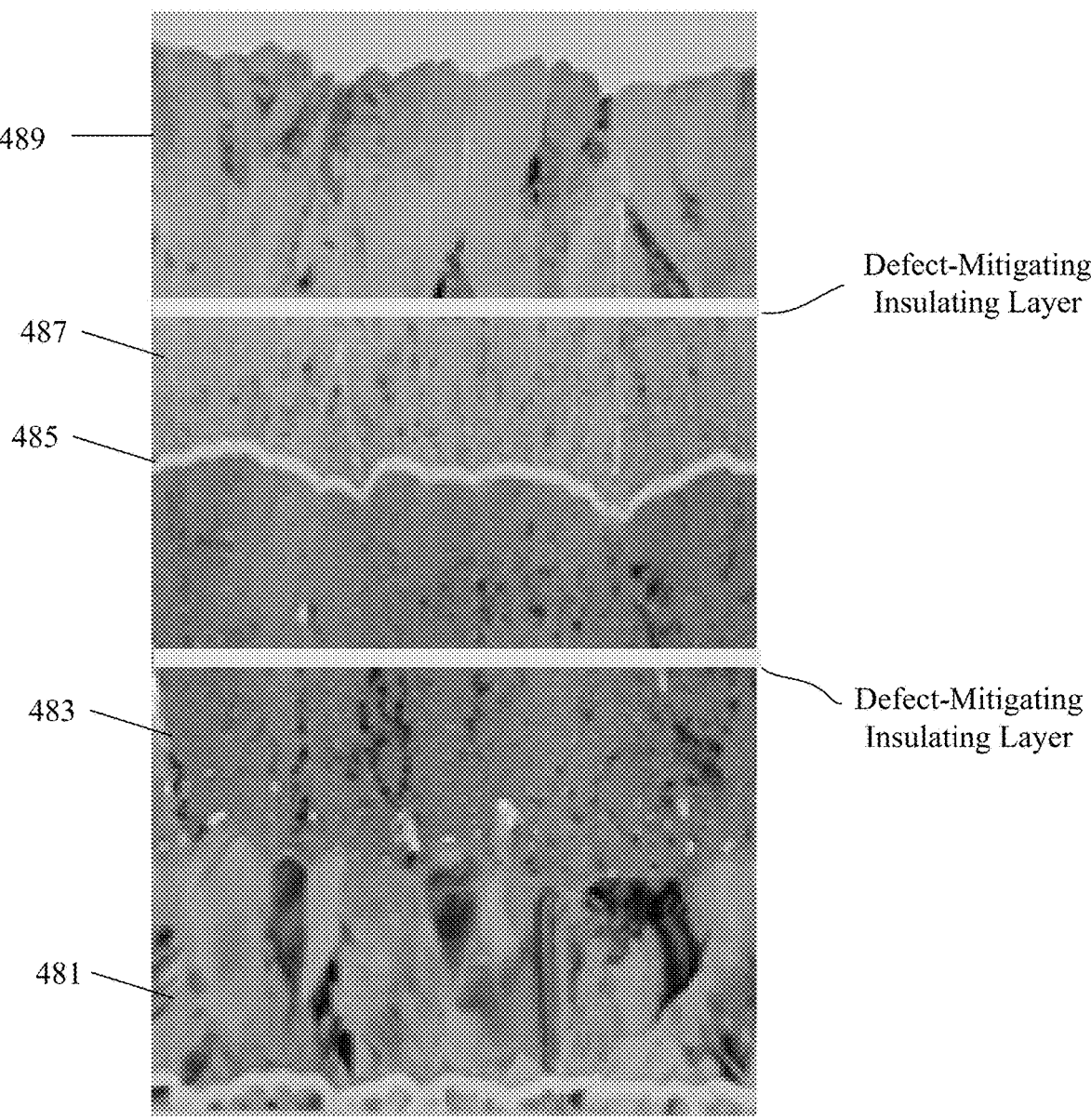

FIG. 4L shows a device with a first defect-mitigating insulating layer at a position between the first transparent conductive layer 481 and the electrochromic layer 483, and a second defect-mitigating insulating layer at an intermediate position within counter electrode layer 487. FIG. 4M shows a device with a first defect-mitigating insulating layer at a position between the first transparent conductive layer 481 and the electrochromic layer 483, and a second defect-mitigating insulating layer at a position between the second transparent conductive layer 489 and the counter electrode layer 487. FIG. 4N shows a device with a first defect-mitigating insulating layer at an intermediate position within electrochromic layer 483, and a second defect-mitigating insulating layer at an intermediate position within counter electrode layer 487. FIG. 4O shows a device with a first defect-mitigating insulating layer at an intermediate position within electrochromic layer 483, and a second defect-mitigating insulating layer at a position between the second transparent conductive layer 489 and the counter electrode layer 487.

Process Flow Examples

As explained, an insulating layer is deposited at some point in the device fabrication process between formation of the first and second transparent conductive layers. In certain embodiments, the insulating layer is deposited as the next layer after the execution of a process step that has a significant likelihood of producing a particle ejection. An example of a process step that is likely to eject a particle is the introduction of lithium metal into the device stack. As discussed below, other process steps can similarly precipitate ejection.

Figure 5A:
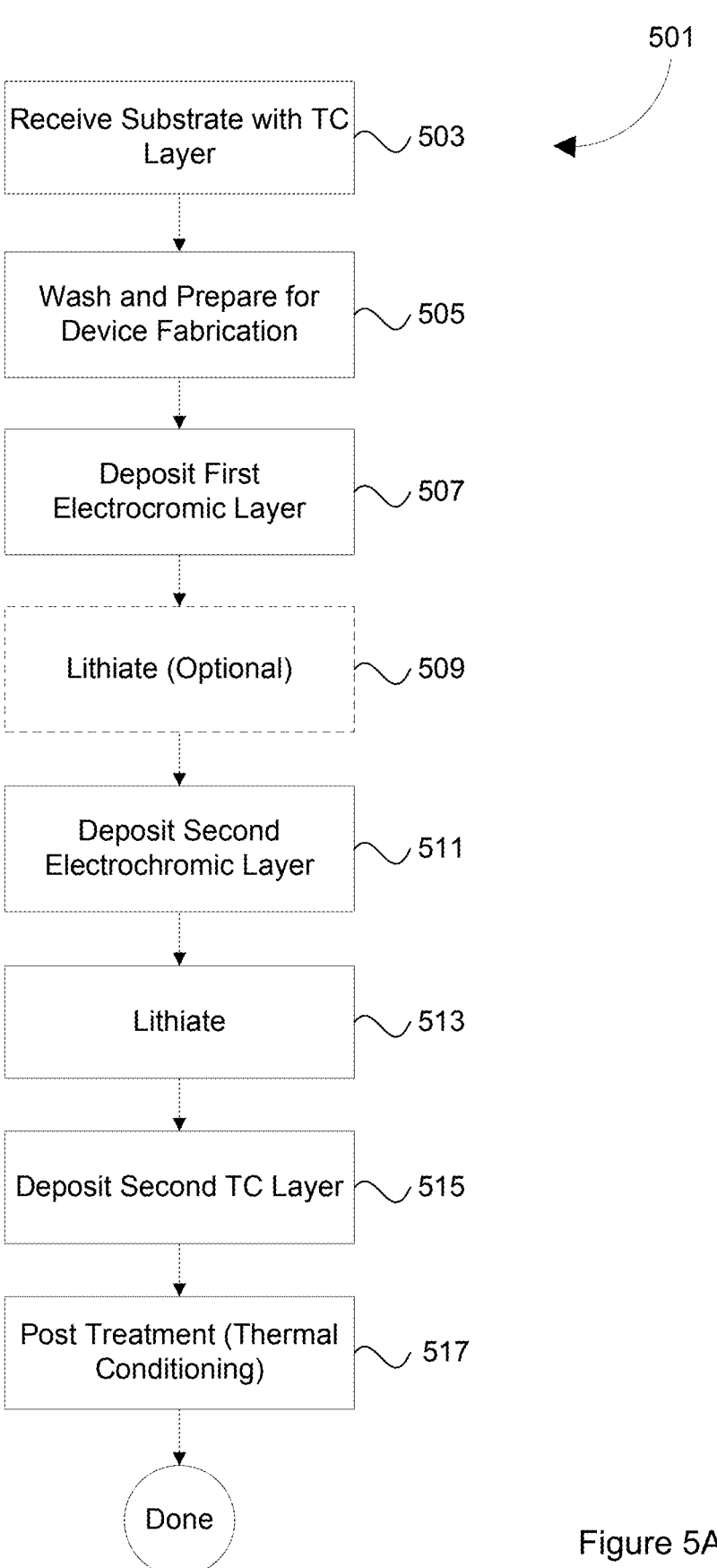
FIG. 5A is a flow chart of a baseline process for forming an electrochromic device that may be modified by introduction of one or more defect-mitigating insulating layers.

A device fabrication process 501 is depicted in FIG. 5A and represents a baseline process that may be modified to include one or more operations of depositing an insulating protective layer. Process 501 begins with an operation 503 where a processing facility or a pre-processing apparatus receives a substrate. As explained, the substrate may be a window, a mirror, or the like. In some implementations, the substrate provided by a substrate vendor contains a transparent conductive oxide layer pre-formed. In other implementations, the substrate is provided without the transparent conductive oxide layer, in which case, the device fabrication process includes a separate operation of forming the transparent conductive layer on the substrate.

Continuing with the process flow 501, an operation 505 involves the washing or otherwise preparing the substrate for device fabrication. This preparation may include such operations as cutting the glass to size, grinding the edges or other portions of the glass, washing it, tempering it, washing it again, etc. In some implementations, the preparation operations include first cutting the glass substrate to size for the final process, then grinding the edge of the glass, followed by tempering or other strengthening operation. In some cases, the substrate is washed before and/or after tempering. Cutting, grinding and similar operations are described in U.S. patent application Ser. No. 13/456,056, filed Apr. 25, 2012, which is incorporated herein by reference in its entirety. Fabrication of the electrochromic device itself begins after the pre-processing operation 505 is complete. In certain embodiments, some or all of the device fabrication operations are performed under vacuum or other controlled environmental conditions. For example, an in line fabrication process may involve passing the substrate through a series of interconnected chambers or stations, each associated with a particular process operation and each integrated with a vacuum system or other pressure control system. In some embodiments, the integrated deposition system includes a substrate holder and transport mechanism operable to hold the architectural glass or other substrate in a vertical orientation while in the plurality of deposition stations. In some cases, the integrated deposition system includes one or more load locks for passing the substrate between an external environment and the integrated deposition system. In another embodiment, the plurality of deposition stations include one or more stations for depositing any one or more of the electrochromic layer, the ion conducting layer, the defect-mitigating insulating layer, and the counter electrode layer. Sputtering or other physical vapor deposition systems may be used for depositing any one or more of the individual layers making up the electrochromic device. A sputtering system may also be used to deposit lithium on the device.

Many types of apparatus may be employed to deposit electrochromic materials and electrochromic devices in accordance with the embodiments disclosed herein. Frequently one or more controllers are employed in the apparatus to control the fabrication process. Those of ordinary skill in the art will appreciate that processes disclosed herein may employ various processes involving data stored in or transferred through one or more computer systems and/or controllers. Certain embodiments relate to the apparatus, including associated computers and microcontrollers, for performing these operations. A control apparatus may be specially constructed for the required purposes, or it may be a general-purpose computer selectively activated or reconfigured by a computer program and/or data structure stored in the computer. The processes presented herein are not inherently related to any particular computer or other apparatus. In various embodiments, a controller executes system control software including sets of instructions for controlling the timing and sequence of the processing steps, processing conditions as described herein, and the like.

In certain embodiments, the controller contains or executes instructions for directing a substrate through a series of deposition stations for depositing the layers of the electrochromic stack. The controller may specify, inter alia, the rate and direction of substrate transfer, the sputter conditions in any station (e.g., pressure, temperature, sputtering power, and gas flow rates), and the pre- and post-treatment of a substrate. The controller may include specific instructions for polishing and otherwise pretreating the substrate prior to deposition. The controller may include specific instructions for substrate post-treatments such as thermal or chemical conditioning. Other computer programs, scripts, or routines stored on memory devices associated with the controller may be employed in some embodiments.

Examples of apparatus for fabricating electrochromic devices are described in the following US Patent Applications, each incorporated herein by reference in its entirety: Ser. Nos. 12/645,111, 12/645,159, 13/462,725, and 12/814, 279.

If the substrate provided after pre-processing 505 does not include a thin layer of transparent conductive material thereon, device fabrication begins by forming such layer. If the substrate as provided includes such layer, it may not be necessary to perform the operation. Regardless of how the transparent conductive material is formed, a first electrochromic layer is deposited on it in an operation 507. In certain embodiments, the first electrochromic layer includes a cathodic electrochromic material. In other embodiments, it includes an anodic electrochromic material.

In some cases, the substrate is heated prior to deposition of the first electrochromic material. The first electrochromic material layer is typically deposited by a process involving physical or chemical vapor deposition under vacuum or other controlled pressure. In a typical embodiment, the process involves sputtering a target containing elements contained in the electrochromic layer. However, in alternative embodiments, the electrochromic layer is deposited under ambient pressure such by a solution phase reaction.

In one implementation, the first electrochromic layer contains a cathodically coloring electrochromic material deposited in two operations, one providing a sub-layer of the base material in a first stoichiometry and the second providing another sub-layer of the base material in a second stoichiometry. As an example, the cathodically coloring electrochromic material is tungsten oxide, which has a nominal composition of $WO_x$. The first deposited sub-layer may have a composition of tungsten oxide in which the value of x is about 2.7 to 2.8 and the second deposited sub-layer may have a composition of tungsten oxide in which x is about 2.85 to 3.5. In one example, the first sub-layer is thicker; for example, it has a thickness of about 400 nm and the second sub-layer has a thickness of about 100 nm.

After the first electrochromic layer is deposited, the partially fabricated device is optionally lithiated as indicated at process block 509. The lithiation operation involves delivery of lithium metal or lithium ions into the first electrochromic layer. The lithium may be provided by sputtering or other suitable process. Certain aspects of lithium deposition and the targets used in lithium deposition processes are described in International Application No. PCT/US2012/034556, filed Apr. 20, 2012 (designating the US) and in International Application No. PCT/US2012/

042514, filed Jun. 14, 2012 (designating the US), both of which are incorporated herein by reference in its entirety.

The next operation in device fabrication process 501 involves depositing a second electrochromic layer (an example of the counter electrode layer generally described above). See block 511. As with the deposition of the first electrochromic layer, this deposition process may be accomplishing using, e.g., physical or chemical vapor deposition. If the first electrochromic layer contains a cathodically coloring electrochromic material, then the second electrochromic layer may contain an anodically coloring electrochromic material. The opposite is also true. If the first electrochromic layer contains an anodically coloring electrochromic material, the second electrochromic layer may contain a cathodically coloring electrochromic material. In certain embodiments, the second electrochromic layer contains an anodically coloring electrochromic material such as nickel oxide or nickel doped tungsten oxide (sometimes referred to as NiWO). In some examples, where nickel tungsten oxide serves as the second electrochromic layer, it is formed to a thickness of between about 200 and 300 nm. In some cases, only one electrochromic layer is used. Ions are shuttled into and out of the single electrochromic layer, from and to a non-electrochromic counterelectrode.

In the example of FIG. 5A, no ion conducting layer is separately deposited between the first and second electrochromic layer. In alternative embodiments, an ion conducting layer is deposited between these layers. Examples of suitable ion conducting layers include those presented above in the description of FIG. 4A.

After the second electrochromic layer is deposited, the device, which includes the first and second electrochromic layers, is lithiated as indicated in operation 513. The lithiation may be accomplished as described in the context of operation 509. As mentioned, lithiation operations may promote ejection of particles previously embedded in the partially fabricated electrochromic device stack. While not depicted in the process flow of FIG. 5A, an insulating protective layer may be deposited after any of the steps that promote ejection of particles. Therefore, in certain embodiments, the deposition of the protective insulating layer may be performed after lithiation operation 509 or lithiation operation 513.

Returning to the process flow depicted in FIG. 5A, after the lithiation of the device in 513, the next process operation deposits a second transparent conductive oxide layer as depicted in an operation 515. At this point, all structures needed for the basic electrochromic device have been created. In some embodiments, there is a subsequent post treatment of the as deposited device in order to complete the process. See block 517. Examples of suitable post-treatment include thermal and/or chemical conditioning operations. Such operations are described in U.S. patent application Ser. No. 12/645,111, previously incorporated herein by reference.

FIGS. 5B-5E present variations on the baseline process depicted in FIG. 5A.

Figure 5B:
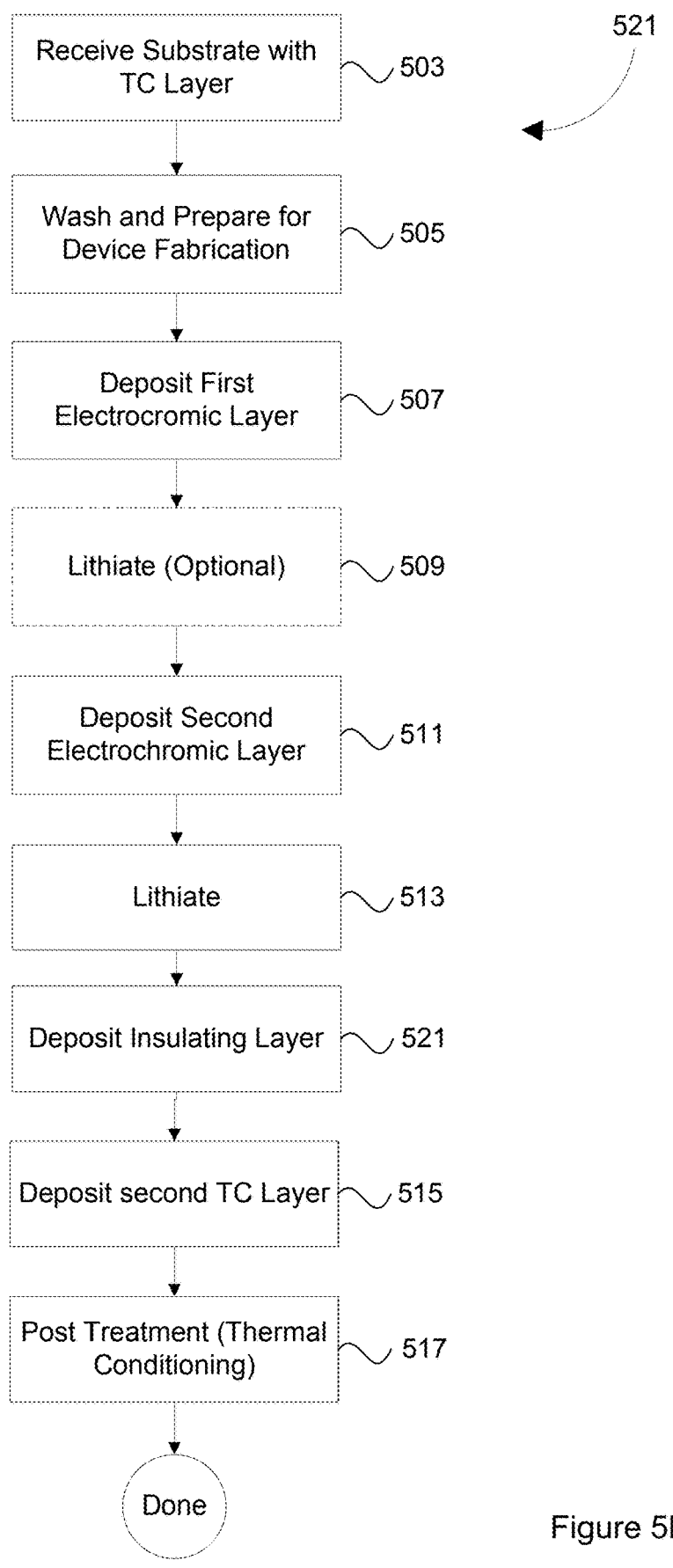
FIGS. 5B and 5C are flow charts of processes that incorporate formation of a defect-mitigating insulating layer at specified locations in the sequence of device fabrication operations.
Figure 5C:
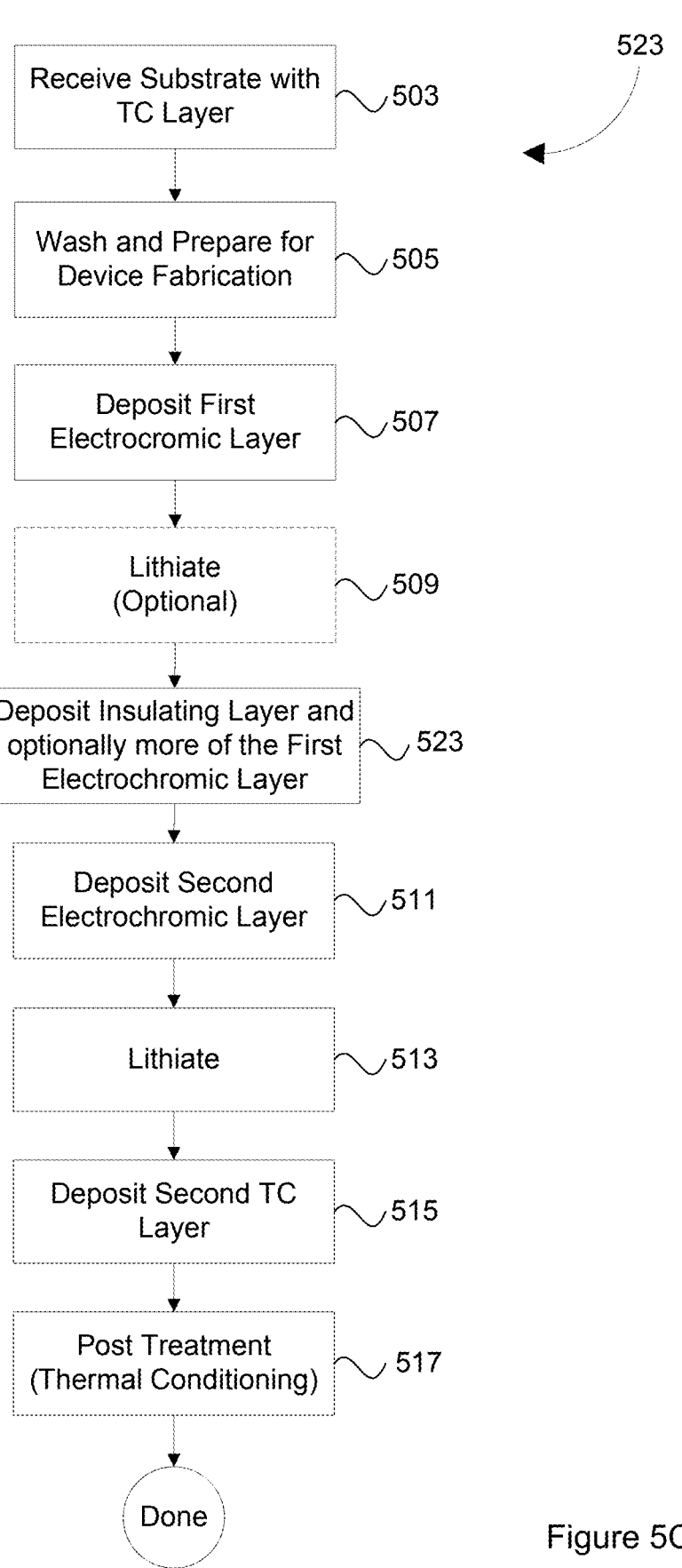

In each case, the basic process flow from FIG. 5A is depicted but with additional or different steps for depositing the insulating layer at particular locations in the process. See e.g., operation 521 in FIG. 5B and operation 523 in FIG. 5C. In FIG. 5B, the insulating layer is deposited after lithiation operation 513 and before deposition of the second transparent conductive layer (operation 515). In FIG. 5C, the insulating layer is deposited between lithiation operation 509 and deposition of the second electrochromic layer (operation 511). In various embodiments, the first lithiation and the deposition of the insulating layer are performed prior to the completion of the first electrochromic layer. Both of these deposition operations take place directly after a lithiation operation. As explained, the process is not limited to this sequence. Other operations that may promote particle ejection may also trigger deposition of the insulating layer. Also, the insulating layer may be deposited immediately (or soon) after a step that is likely to produce particles or otherwise have particles attach to the substrate surface. In such designs, the defect-mitigating layer may serve to encapsulate such particles.

In some cases, the insulating layer is deposited intermediate between two operations for depositing the second electrochromic layer. The resulting device may have a structure as depicted in FIG. 4B, for example. In some cases, a lithiation step is performed after the first portion of the second electrochromic layer is deposited and before the insulating layer and the second portion of the second electrochromic layer are deposited. In other embodiments, the first electrochromic layer is divided into two portions, with the insulating layer interposed between the two portions.

In other embodiments, the second (or first) electrochromic layer is deposited in two portions, with the second portion serving as the defect-mitigating insulating layer. An example of a structure resulting from such processes is depicted in FIG. 4C and the associated description. In some cases, a lithiation operation is performed after deposition of the first portion of the electrochromic layer but before deposition of the second portion of the layer.

In some implementations such as those of FIG. 4C, the insulating layer actually contains a material having a composition that varies only slightly from that of the material of the associated electrochromic layer. As an example, the second portion of an electrochromic layer contains an insulating material, or at least a material that is at least as insulating as the first portion of the electrochromic layer. In some cases, the first portion of the layer has electrochromic properties and the second portion of the layer does not have electrochromic properties. Such embodiments may have multiple benefits. For example, the insulating layer will be quite compatible with the material on which it is deposited. This is because the materials are chemically very similar.

In some embodiments, the second electrochromic layer is a nickel tungsten oxide and the insulating layer is also a nickel tungsten oxide. However, the main portion of the second electrochromic layer and the insulating layer are deposited under different process conditions. For example, while both layers may be deposited by a physical vapor deposition technique employing sputtering from nickel and tungsten targets, the PVD conditions are different. In some cases, the insulating layer is deposited at a lower pressure and/or with lower oxygen concentrations than the electrochromic nickel tungsten oxide layer. In some cases, the second portion of the insulating layer is deposited at a lower power than the second electrochromic layer. Further, the atomic ratio of nickel to tungsten may be lower in the insulating layer. In other cases, the atomic ratio of nickel and tungsten is the same in both portions of the layer.

In some examples, the ranges of deposition conditions for nickel tungsten oxide electrochromic layer (NiWO1) and insulating layer (NiWO2) are as follows:

NiWO1

1 mTorr<Pressure<50 mTorr

60%<O2%<100% (volume or molar)

0 C<Deposition Temperature<150 C

NiWO2

1 mTorr<Pressure<50 mTorr

40%<O2%<70%

25 C<Deposition Temperature<200 C

In other examples, process conditions used to form each of NiWO1 and NiWO2 are as follows:

NiWO1

5 mTorr<Pressure<15 mTorr (or 7-12 mTorr)

70%<O2%<90% (volume) (or 70-80%)

20 C<DepositionTemperature<60 C

NiWO2

1 mTorr<Pressure<10 mTorr (or 3-7 mTorr)

40%<O2%<60% (or 45-55%)

25 C<DepositionTemperature<60 C

FIG. 5D presents a flow chart for an embodiment employing deposition of two separate defect-mitigating insulating layers. The process begins at an operation 531, where a substrate is received having a first transparent conducting layer. In certain embodiments, the transparent conducting layer is a fluorinated tin oxide layer that is optionally covered by an insulating layer of TiO2. Glass substrates having such properties are provided by Pilkington of St. Helens, United Kingdom under the brand name Eclipse Advantage™ for example. The substrate received in operation 531 may be washed and prepared as described above. See operation 533. Next the process involves forming the first insulating layer as indicated at operation 535. This layer may be prepared by many different techniques. As indicated, the substrate may be provided with both a transparent conductive layer and an insulating layer (e.g., fluorinated SnO capped with TiO2). It has been found that in certain embodiments electrochromic devices perform better when fabricated on a substrate that has been polished. Such polishing may involve, for example, polishing an upper surface of a TiO2 with a polishing compound containing alumina or other electronically insulating material. See PCT Patent Application No. PCT/US2012/057606, titled "OPTICAL DEVICE FABRICATION", and filed Sep. 27, 2012, which is incorporated herein by reference in its entirety. While not wishing to be bound by theory, the alumina or other insulating material used in polishing may form an insulating layer on the surface of the first transparent (conducting?) layer or alumina particles may fill in voids in the tin oxide or other insulating material provided with the substrate. In the latter case, the insulating layer contains two different materials, one formed on the substrate as received and the other filling voids in the first material. In other embodiments, the first insulating layer formed in operation 535 is deposited by a conventional deposition process such as physical vapor deposition or chemical vapor deposition. The resulting layer may have the composition of an insulating layer as described elsewhere herein.

After the first insulating layer is formed, the process may continue essentially as described with reference to FIGS. 5B and/or 5C. A first electrochromic layer is deposited in an operation 537, followed by an optional lithiation operation 539. Thereafter, an ion conducting layer is optionally deposited or formed in situ, followed by deposition of a second electrochromic layer. See operation 541. The device fabricated to this point is then lithiated as indicated in operation 543. A second insulating layer is formed in an operation 545. The material used to form this second insulating layer may be the same or different from that used to form the first insulating layer in operation 535. If the first insulating layer is provided with the substrate received by the process or is provided during polishing, typically the second insulating layer will have a different composition—or at least a different morphology—than the first insulating layer.

After the second insulating layer has been formed, the process deposits a second transparent conductive layer. See operation 547. Thereafter an optional post treatment is performed as described above. See operation 549.

Figure 5E:
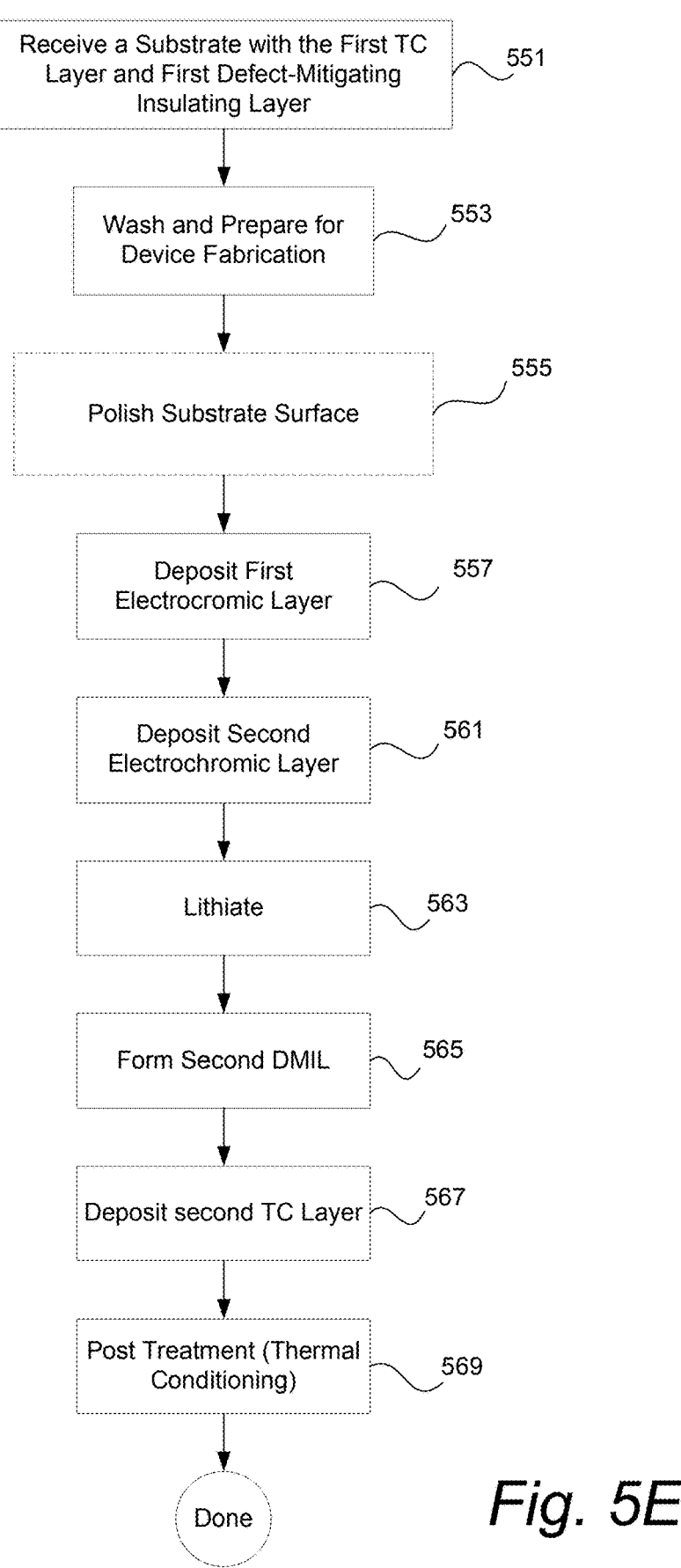
FIG. 5E is a flow chart of a process in accordance with certain embodiments in which a transparent conductive layer and a defect-mitigating insulating layer is provided on a substrate.

FIG. 5E presents another process of forming a low-defectivity electrochromic device. The process begins as shown at a block 551 with the receipt of a substrate having various layers pre-formed thereon. These layers may include one or more diffusion barrier layers such as a tin oxide and a silicon oxide layer, a first transparent conductive layer such as a fluorinated tin oxide layer, and a first defect-mitigating insulating layer. As indicated, the defect-mitigating insulating layer may include or be titanium oxide, tin oxide, silicon oxide, silicon aluminum oxide, tantalum oxide nickel tungsten oxide, various nitrides, carbides, oxycarbides, oxynitrides, and variants of any of these, etc.

Upon receiving the substrate, it may be washed and otherwise prepared for device fabrication as indicated in block 553. As mentioned above, the preparation may include cutting cleaning tempering, etc. Thereafter, as indicated at block 555, the substrate surface is optionally polished. Polishing may be performed with, for example, aluminum oxide, cerium oxide, or other appropriate polishing material in an appropriate carrier forming a polishing slurry or other appropriate polishing formulation. Polishing may serve various purposes, as explained above. Included among these purposes are, for example, reducing the roughness of the surface and incorporating insulating material into an insulating surface layer that might otherwise contain pits, defects, discontinuities, and other sources of potential electrical shorts. The polishing material (e.g., alumina or cerium oxide) in the polishing compound is itself an insulating material that fills gaps in an otherwise continuous insulating layer provided on the substrate.

After the optional polishing, the first and second electrochromic layers are deposited as described above and as indicated in blocks 557 and 561 of FIG. 5E. Thereafter, a particle removal steps such as lithiation is performed as indicated at block 563. Then, a second defect-mitigating insulating layer is formed over the second electrochromic layer. See block 565. In a particular implementation of the process depicted in FIG. 5E, the second defect-mitigating insulating layer is a less-electrochromic form of nickel tungsten oxide. In this implementation, the second electrochromic layer is an electrochromic form of nickel tungsten oxide. The first electrochromic layer may be tungsten oxide deposited in one or more layers. As indicated above, in some implementations, a second tungsten oxide layer formed on top of a first tungsten oxide layer may have a composition that is super-stoichiometric in oxygen.

After the second defect-mitigating insulating layer is formed at block 565, a second transparent conductive layer is deposited as indicated by block 567. Thereafter, a post-treatment such as a thermal conditioning or thermal chemical conditioning is performed as described above. See block 569. The process is thus complete for purposes of this illustration.

The defect mitigating insulating layer may be deposited by a variety of techniques. Physical and chemical vapor depositions are typical. In some cases, the deposition is conformal; that is, the process deposits an insulating layer that is able to follow the contours of the pits and other topology variations created by particle ejections. The conformality of the deposition process should allow the layer to follow contours on the order of micrometers or nanometers (e.g., tens or hundreds of nanometers). Examples of classes of deposition process that permit this are chemical vapor deposition techniques and atomic layer deposition (ALD) techniques. Deposition of device layers performed after the insulating layer is laid down may likewise be deposited by a particularly conformal process.

While lithiation has been presented in most embodiments as the operation that promotes particle removal, various other techniques may likewise serve to promote particle removal. One of these is "contact cleaning." a process that involves contacting a layer of a partially fabricated electrochromic device with a contact roller, strip, or brush, which sticks to or attracts particles and then removes them from the device. Typically, contact cleaning employs static attraction and/or adhesion to attract remove particles. Some contact cleaning products are commercially available, being marketed to the contact sheet cleaning and web cleaning industries. In various embodiments, a roller mechanism is used. In some cases, two rollers are used: the first one for contacting and removing particles from the device surface and a second roller for contacting the first roller to remove the particles that were picked up by the first roller in its most recent rotation. Examples of contact cleaning products sold for cleaning bare glass are manufactured by Teknek™ of Renfrewshire, Scotland, UK and Technica.

In some implementations, a contact cleaner is integrated with an electrochromic device fabrication system. Typically, though not always, the contact cleaner is deployed outside the vacuum environment of the system for depositing layers of the electrochromic device. In "cut and coat" fabrication process flows, a contact cleaner of a single size may be used. In other fabrication flows, contact cleaners of different size are employed for cleaning devices fabricated on glass of different sizes.

Another category of particle removal techniques rely on differences in the thermal expansion of particles and the substrate layers in which they are embedded. When the particle volume expands or contracts relative to the surrounding layers, the particles may eject, particularly when the relative volume change is rapid. In some embodiments, a mechanism driving the volume change is irradiation of the substrate at wavelength that is selectively absorbed by the particles but not the surrounding layer(s), or vice versa. In some embodiments, a mechanism driving a relative volume change is a different coefficient of thermal expansion of the particles and the surrounding layer(s).

Thermal energy may be delivered in various ways. For example, as mentioned, the particles and or the substrate layer(s) may be heated by irradiation. The irradiation may be provided at a wavelength or spectrum of wavelengths from the infrared through ultraviolet ranges. The irradiation may be provided by one or more lamp, lasers, etc. In one approach, a collimated laser beam is passed over a surface of the partially fabricated electrochromic device. For example, the beam grazes the surface of the device over the width of the device. The beam may propagate in a direction perpendicular or substantially perpendicular to the direction of travel of the substrate carrying the electrochromic device. In another approach, a laser beam is focused on the device and moved in a raster scan over the surface.

In some embodiments, thermal energy is provided by heating the substrate by a non-radiative mechanism such as passing heated gas over the surface of the substrate/device and/or passing the substrate/device over a heated element such as a roller. In one implementation, the heated element is heated by resistive heating.

In another approach to particle removal, electrostatic force is applied to the partially fabricated electrochromic device. This may be accomplished by, e.g., contacting the device with a plasma or applying a charge to the substrate containing the device. In one embodiment, a two stage process is employed. In the first stage, the particles are charged by exposure to a plasma. Then, in the second stage, the substrate with charged particles receives an electrical charge, which causes the charged particles to eject. For example, an electrical contact is made to a conductive or partially conductive layer of the substrate and charge is applied to the device through the contact. In some implementations, the substrate is contacted with a charge of the same sign as the charge applied to the particles by contact with the plasma.

In a further approach, the partially fabricated electrochromic device is exposed to a supercritical fluid such as supercritical carbon dioxide. Supercritical fluids are quite effective at dislodging and removing particles. The fluid may include a supercritical solvent such as supercritical carbon dioxide with one or more additives contained therein to improve the cleaning power or other property of the fluid. The supercritical fluid may be brought into contact with the partially fabricated electrochromic device using any of a number of processes. For example, the device may be immersed or passed through the supercritical fluid. The fluid itself may be provided in a quiescent or flowing state. In various embodiments, some convection will be employed. For example, the supercritical fluid may flow through a substrate contact chamber driven by a pump in a recirculation loop. In certain embodiments, the supercritical fluid is provided as a cryogenic aerosol. The fluid may be sprayed on the device as the device or a spray nozzle (or spray gun) moves with respect to the other.

In still another approach, particles are dislodged and/or removed by applying acoustic energy to the partially fabricated electrochromic device. The acoustic energy may be provided at any of a number of frequencies, including megasonic, supersonic, ultrasonic, etc. In certain embodiments, a vibration source is directly coupled to the substrate. In certain embodiments, a vibration source is directly coupled to a fluid in contact with the substrate/device.

Another removal technique involves ionized air blow off, optionally with an air knife. Yet another technique involves etch-back of a layer of the device containing particles. The etch-back may be accomplished with a plasma (e.g., a fluorine or oxygen containing plasma), by using ion milling, etc. The particles may be removed by the etch-back process or merely dislodged. In the latter case, a separate particle removal operation may be applied after etch-back. Such process may include one or more other process described above such as applying a charge to the substrate, contacting the substrate with a supercritical fluid, or selectively heating the particles.

When lithiation is employed as a particle removal technique, it may be implemented in various formats. For example, the lithium may be delivered in a single dose or in multiple doses, sometimes to different layers of the device, such as to the electrochromic and counter electrode layers. In some embodiments, all the lithium needed for the device is delivered in a single operation. For example, the lithium may be delivered to the counter electrode layer and allowed to diffuse or migrate into the remainder of the device. When all lithium is provided in one operation, the incorporation provides maximal volumetric stress on the device and likely provides the most effective way to remove particles via lithiation. However, the lithiation options are not limited to a single dose.

The particle removal operation may be performed at various stages in the electrochromic device fabrication sequence. While the above description has focused on removal from a partially fabricated electrochromic device, it should be understood that any of the removal techniques can also be performed on a fully fabricated electrochromic device. A number of process examples are presented below. Each is a variation on the following base process:

Base Device Fabrication Process
    Form first TC layer
    Form EC layer
    Form IC layer (optional)
    Form CE layer
    Form second TC layer Processes in which an Ion Conducting Layer is not Deposited in a Separate Step Option 1
    Form first TC layer
    Particle removal
    Form insulating layer
    Form EC layer
    Form CE layer
    Form second TC layer Option 2
    Form first TC layer
    Form EC layer
    Particle removal
    Form insulating layer
    Form CE layer
    Form second TC layer Option 3
    Form first TC layer
    Form EC layer
    Form CE layer
    Particle removal
    Form insulating layer
    Form second TC layer Option 4
    Form first TC layer
    Form EC layer
    Particle removal
    Form CE layer
    Particle removal
    Form insulating layer
    Form second TC layer Option 5
    Form first TC layer
    Particle removal
    Form EC layer
    Form CE layer
    Particle removal
    Form insulating layer
    Form second TC layer Option 6
    Form first TC layer
    Form EC layer
    Form partial CE layer
    Particle removal
    Form insulating layer
    Form remainder of CE layer
    Form second TC layer Option 7
    Form first TC layer
    Particle removal
    Form EC layer
    Form partial CE layer
    Form insulating layer
    Particle removal
    Form remainder of CE layer
    Form second TC layer Option 8
    Form first TC layer
    Form EC layer
    Particle removal
    Form partial CE layer
    Form insulating layer
    Particle removal
    Form remainder of CE layer
    Form second TC layer Processes in which an Ion Conducting Layer is Deposited in a Separate Step Option 1
    Form first TC layer
    Particle removal
    Form insulating layer
    Form EC layer
    Form IC layer
    Form CE layer
    Form second TC layer Option 2
    Form first TC layer
    Form EC layer
    Particle removal
    Form insulating layer
    Form IC layer
    Form CE layer
    Form second TC layer Option 3
    Form first TC layer
    Form EC layer
    Form IC layer
    Particle removal
    Form insulating layer
    Form CE layer
    Form second TC layer Option 4
    Form first TC layer
    Form EC layer
    Form IC layer
    Form CE layer
    Particle removal
    Form insulating layer
    Form second TC layer Option 5
    Form first TC layer
    Form EC layer
    Particle removal
    Form IC layer
    Form CE layer
    Particle removal
    Form insulating layer
    Form second TC layer Option 6
    Form first TC layer
    Particle removal
    Form EC layer
    Form IC layer
    Form CE layer
    Particle removal
    Form insulating layer
    Form second TC layer Option 7

Form first TC layer

Form EC layer

Form IC layer

Form partial CE layer

Particle removal

Form insulating layer

Form remainder of CE layer

Form second TC layer

Option 8

Form first TC layer

Form EC layer

Particle removal

Form IC layer

Form partial CE layer

Particle removal

Form insulating layer

Form remainder of CE layer

Form second TC layer

Option 9

Form first TC layer

Particle removal

Form EC layer

Form IC layer

Form partial CE layer

Particle removal

Form insulating layer

Form remainder of CE layer

Form second TC layer

While each of the above options show the electrochromic layer deposited before the counter electrode layer, the deposition order could be reversed in any of the options.

In various embodiments, the particle removal happens within a high resistivity layer of the electrochromic device. In a traditional five layer EC device (the base structure above—TC1/EC/IC/CE/TC2), the particle removal may occur (a) at or after 5% of IC has been deposited but (b) before or when 95% of the IC has been deposited, and/or (c) at or after 5% of the CE has been deposited, but (d) before or when 95% of the CE has been deposited. In certain embodiments, particles are removed and the defect mitigating layer is deposited after a portion of a resistive constituent material (and one that stays resistive even in the presence of lithium) but before the remainder of the resistive material is deposited. In a variant of this process, the remainder of the resistive material is the defect-mitigating insulating later. The particles that are removed will leave a hole, potentially down to the TC1 layer that will then be filled with the insulating material. Any particles that are added in the process of particle removal will already reside on top of the first portion of the resistive component of the device and therefore will not pose a threat for short circuits. Note that tungsten oxide may become conductive in the presence of lithium. Therefore, in certain embodiments employing tungsten oxide as the electrochromic material, particle removal and deposition of the insulating layer occur in a layer other than the tungsten oxide layer.

Attributes of the Defect-Mitigating Insulating Layer

In various embodiments, the defect-mitigating insulating layer prevents short circuits by preventing direct electrical contact between layers of opposite polarity. In various embodiments, the defect-mitigating insulating layer encapsulates particles and prevents them from ejecting. Attributes for the insulating layer may include transparency in the visible range, weak or no electrochromism, electronic resistance comparable to or higher than that of undoped electrode material (electrochromic and/or counter electrode), and physical and chemical durability.

One of the properties of the insulating layer is its electronic resistivity. Generally, it should have an electronic resistivity level that is substantially greater than that of the transparent conductive layer, often orders of magnitude greater. In some embodiments, the insulating layer has an electronic resistivity that is intermediate between that of a conventional ion conducting layer and that of a transparent conductive layer (e.g., indium doped tin oxide). Thus, the electronic resistivity should be greater than about $10^{-4}$ $\Omega$-cm (approximate resistivity of indium tin oxide) or greater than about $10^{-6}$ $\Omega$-cm. In some cases, it has an electronic resistivity between about $10^{-4}$ $\Omega$-cm and $10^{14}$ $\Omega$-cm (approximate resistivity of a typical ion conductor for electrochromic devices) or between about $10^{-5}$ $\Omega$-cm and $10^{12}$ $\Omega$-cm. In certain embodiments, the electronic resistivity of the material in the insulating layer is between about 1 and $5\times10^{13}$ $\Omega$-cm or between about $10^2$ and $10^{12}$ $\Omega$-cm or between about $10^6$ and $5\times10^{12}$ $\Omega$-cm, or between about $10^7$ and $5\times10^9$ $\Omega$-cm. In some embodiments, the defect mitigating insulating layer material will have a resistivity that is comparable (e.g., within an order of magnitude) of that of the electrochromic layer of counter electrode material.

The resistivity of the material is coupled to the thickness of the insulating layer. This resistivity and thickness level will together yield a sheet resistance value which may in fact be more important than simply the resistivity alone. (A thicker material will have a lower sheet resistance.) When using a material having a relatively high resistivity value, the electrochromic device may be designed with a relatively thin insulating layer, which may be desirable to maintain the optical quality of the device. In certain embodiments, the insulating layer has a thickness of about 100 nm or less or about 50 nm or less. In one example, the insulating layer has a thickness of about 5 nm, in another example, the layer has a thickness of about 20 nm, and in another example, the layer has a thickness of about 40 nm. In certain embodiments, the electronic sheet resistance of the insulating layer is between about 40 and 4000$\Omega$ per square or between about 100 and 1000$\Omega$ per square. In some cases, the insulating material is electrically semiconducting having a sheet resistance that cannot be easily measured.

In certain embodiments, particularly those in which a defect-mitigating insulating layer is disposed on a substrate, a thicker layer is sometimes employed. The thickness may be, for example, between about 5 and 500 nm, or between about 5 and 100 nm, or 10 and 100 nm, or between about 15 and 50 nm, or between about 20 and 50 nm, or between about 20 and 40 nm.

In certain embodiments, the material making up the insulating layer has a relatively low blind charge capacity. In the context of an electrochromic device, a material's charge capacity represents its ability to reversibly accommodate lithium ions during normal electrochromic cycling. Blind charge capacity is the capacity of the material to irreversibly accommodate lithium ions that it encounters during fabrication or during initial cycling. Those lithium ions that are accommodated as blind charge are not available for subsequent cycling in and out of the material in which they are sequestered. If the insulating material has a large charge capacity, then it may serve as a reservoir of nonfunctional lithium ions (typically the layer does not exhibit electrochromism so the lithium ions that pass into it do not drive a coloring or bleaching transition). Therefore, the presence of this additional layer requires additional lithium ions to be provided in the device simply to be taken up by this additional layer. This is of course a disadvantage, as lithium can be difficult to integrate into the device during fabrication.

In certain embodiments, the charge capacity of the defect-mitigating insulating layer is between about 10 and 100 milliCoulomb/cm$^2$*$\mu$m; e.g., between about 30 and 60 milliCoulomb/cm$^2$. For comparison, the charge capacity of a typical nickel tungsten oxide electrochromic layer is approximately 120 milliCoulomb/cm$^2$*$\mu$m. In certain embodiments, the blind charge capacity of the defect-mitigating insulating layer is between about 30 and 100 milliCoulomb/cm$^2$*$\mu$m; e.g., between about 100 and 110 milliCoulomb/cm$^2$*$\mu$m. For comparison, the charge capacity of a typical nickel tungsten oxide electrochromic layer is typically less than about 100 milliCoulomb/cm$^2$*$\mu$m.

In certain embodiments, the defect mitigating insulating layer is ionically conductive. This is particularly the case if the layer is deposited before the second of the two electrodes (electrochromic and counter electrode). In certain embodiments, the defect mitigating insulating layer has an ionic conductivity of between about $10^{-7}$ Siemens/cm and $10^{-12}$ Siemens/cm, or between about $10^{-8}$ Siemens/cm and $10^{-11}$ Siemens/cm or between $10^{-9}$ Siemens/cm and $10^{-10}$ Siemens/cm In certain embodiments, the defect mitigating insulating layer has a density of at most about 90% of the maximum theoretical density of the material from which it is fabricated.

In some implementations, the insulating layer exhibits little or no electrochromism during normal operation. Electrochromism may be measured by applying a defined voltage change or other driving force and measuring the change in optical density or transmissivity of the device.

The material of the insulating layer should also possess good optical properties. For example, it should have a relatively low optical density; for example, below about 0.1 or below about 0.05. Additionally, the material may have a refractive index that matches that of adjacent materials in the stack so that it does not introduce significant reflection. The material should also adhere well to other materials adjacent to it in the electrochromic device stack.

As mentioned, the defect-mitigating layer may serve to encapsulate particles that deposit on the device during fabrication. By encapsulating these particles, they are less likely to eject. If this is a goal, then the operation of depositing the defect-mitigating layer should be performed immediately or soon after the process operation or operations that likely introduces particles into the device stack. Further, if a goal is to encapsulate, then thicker layers are desirable.

Various materials may be used as defect-mitigating insulating layers. These include various transparent metal oxides such as aluminum oxide, zinc oxide, tin oxide, silicon aluminum oxide, silicon oxide, cerium oxide, stoichiometric tungsten oxide (e.g., WO$_3$, wherein the ratio of oxygen to tungsten is exactly 3), variations of nickel tungsten oxide, and highly oxidized indium tin oxide (ITO). In some cases, the insulating material is selected from aluminum oxide, zinc oxide, silicon aluminum oxide, tantalum oxide, and nickel tungsten oxide (typically a non-electrochromic type). In addition, some nitrides, carbides, oxynitrides, oxycarbides, and fluorides having medium to high resistance and optical transparency can be used. For example, nitrides such as titanium nitride, tantalum nitride, aluminum nitride, silicon nitride, and/or tungsten nitride may be used. Further, carbides such as titanium carbide, aluminum carbide, tantalum carbide, silicon carbide, and/or tungsten carbide may be used. Oxycarbides and/or oxynitrides may also be used in certain embodiments. Unless otherwise specified, each of these compositions may be present in various stoichiometries or ratios of elements. For insulating layers containing nickel and tungsten, the ratio of nickel to tungsten may be controlled such that relatively high ratios are employed. For example the Ni:W (atomic) ratio may be between about 90:10 and 50:50 or between about 80:20 and 60:40.

In some cases, the material chosen for the defect-mitigating layer is a material that integrates well with electrochromic stack. The integration may be promoted by (a) employing compositions similar to those of materials in layers adjacent to insulating layer in the stack (promotes case of fabrication), and (b) employing materials that are optically compatible with the other materials in the stack and reduce quality degradation in the overall stack.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of fabricating an electrochromic device, the method comprising:

forming an electrochromic stack over a first electrode layer disposed on a substrate and forming a second electrode layer over the electrochromic stack, wherein the electrochromic stack comprises an electrochromic layer of electrochromic material and a counter electrode layer of counter electrode material, and wherein the first electrode layer comprises a first transparent electronically conductive material and the second electrode layer comprises a second transparent electronically conductive material; and depositing a defect-mitigating insulating layer to seal a pop-off defect in the electrochromic device;

wherein the defect-mitigating insulating layer comprises a metal oxide, a metal nitride; a metal carbide; a metal oxynitride; a metal oxycarbide, or any combination thereof, and wherein the metal oxide is selected from the group consisting of aluminum oxide, titanium oxide, tantalum oxide, cerium oxide, zinc oxide, tin oxide, tungsten oxide, oxidized indium tin oxide, and nickel tungsten oxide, wherein the defect-mitigating insulating layer is deposited in a first process operation after execution of a second process operation that has a propensity to cause ejection of particles from the electrochromic stack, and wherein the second process operation comprises introducing lithium into the electrochromic stack.

2. The method of claim 1, wherein the metal nitride is selected from the group consisting of titanium nitride, aluminum nitride, silicon nitride, tungsten nitride.

3. The method of claim 1, wherein the metal carbide is selected from the group consisting of titanium carbide, aluminum carbide, silicon carbide, tantalum carbide, and tungsten carbide.

4. The method of claim 1, wherein the metal oxynitride comprises silicon oxynitride.

5. The method of claim 1, wherein the defect-mitigating insulating layer is between about 5 nm and 500 nm thick.

6. The method of claim 1, wherein the defect-mitigating insulating layer is between about 10 nm and 100 nm thick.

7. The method of claim 1, wherein the defect-mitigating insulating layer is deposited within, beneath, or on the electrochromic stack.

8. The method of claim 1, wherein the defect-mitigating insulating layer is ionically conductive, and further comprising a second defect-mitigating insulating layer, wherein the second defect-mitigating insulating layer is deposited beneath or in the electrochromic stack.

9. The method of claim 1, wherein depositing the defect-mitigating insulating layer prevents electronically conducting layers and/or electrochromically active layers of the electrochromic device from contacting layers of an opposite polarity and creating a short circuit in a region of the pop-off defect.

10. The method of claim 1, wherein the lithium comprises lithium metal.

\*　\*　\*　\*　\*